US008885845B2

(12) United States Patent
Honji et al.

(10) Patent No.: US 8,885,845 B2
(45) Date of Patent: Nov. 11, 2014

(54) ENGINE SOUND PROCESSING SYSTEM

(75) Inventors: Yoshikazu Honji, Hamamatsu (JP); Yasuo Yoshioka, Hamamatsu (JP); Tetsu Kobayashi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 329 days.

(21) Appl. No.: 13/398,719

(22) Filed: Feb. 16, 2012

(65) Prior Publication Data

US 2012/0148066 A1 Jun. 14, 2012

Related U.S. Application Data

(62) Division of application No. 11/886,044, filed as application No. PCT/JP2006/304806 on Mar. 10, 2006, now Pat. No. 8,155,343.

(30) Foreign Application Priority Data

| | | |
|---|---|---|
| Mar. 11, 2005 | (JP) | 2005-069726 |
| Mar. 25, 2005 | (JP) | 2005-089283 |
| May 2, 2005 | (JP) | 2005-134278 |
| Jun. 29, 2005 | (JP) | 2005-189201 |
| Jun. 30, 2005 | (JP) | 2005-190903 |
| Aug. 16, 2005 | (JP) | 2005-235790 |

(51) Int. Cl.
*H04B 1/00* (2006.01)
*H03G 5/00* (2006.01)
*H03G 9/00* (2006.01)
*G10K 15/04* (2006.01)

(52) U.S. Cl.
CPC .................................... *G10K 15/04* (2013.01)
USPC ............................... 381/86; 381/98; 381/102

(58) Field of Classification Search
CPC B60R 11/02; B60R 11/0217; H04R 2499/13; H04R 5/02; H04B 1/082; H03G 3/32
USPC ............................................ 381/86, 98, 102
See application file for complete search history.

(56) References Cited

U.S. PATENT DOCUMENTS 5,371,802 A 12/1994 McDonald et al.
6,504,935 B1 1/2003 Jackson (Continued)

FOREIGN PATENT DOCUMENTS

DE 199 45 259 C1 1/2001
DE 199 51 650 A1 5/2001

(Continued)

OTHER PUBLICATIONS

European Patent Office "Extended European Search Report" Patent Application No. 06728924.9-2213 of Yamaha Corporation, dated Dec. 3, 2010, 11 pages.

(Continued)

*Primary Examiner* — Xu Mei
*Assistant Examiner* — David Ton
(74) *Attorney, Agent, or Firm* — Pillsbury Winthrop Shaw Pittman LLP

(57) ABSTRACT

Microphones are provided at an air inlet of the engine and a vehicle-cabin-side wall surface of an engine room, and engine sounds are picked up. The engine sound is processed by a signal processing section, and the processed engine sound is output from a speaker provided in a vehicle cabin. The signal processing section is provided with a filter which simulates a sound insulation characteristic of the vehicle cabin and a transformation section for processing the engine sound according to driving condition. A spectrum transformation characteristic of the transformation section is determined according to values detected by a vehicle speed sensor, an engine speed sensor, and an accelerator depression sensor, and a spectrum of the engine sound is transformed by means of specification of the spectrum transformation characteristic, thereby enhancing an engine sound.

3 Claims, 37 Drawing Sheets

(56) References Cited

U.S. PATENT DOCUMENTS

| | | | | |
|---|---|---|---|---|
| 6,859,539 | B1 * | 2/2005 | Maeda | 381/86 |
| 6,959,094 | B1 | 10/2005 | Cascone et al. | |
| 7,203,321 | B1 | 4/2007 | Freymann et al. | |
| 7,876,913 | B2 * | 1/2011 | Kobayashi et al. | 381/86 |
| 7,961,894 | B2 | 6/2011 | Honji | |
| 2005/0094826 | A1 * | 5/2005 | Morishita | 381/86 |
| 2005/0201570 | A1 | 9/2005 | Honji | |
| 2007/0223728 | A1 * | 9/2007 | Sakamoto et al. | 381/86 |

FOREIGN PATENT DOCUMENTS

| | | | |
|---|---|---|---|
| DE | 101 40 407 | A1 | 3/2003 |
| GB | 2 254 979 | A | 10/1992 |
| JP | 04-152394 | | 5/1992 |
| JP | 04-178698 | | 6/1992 |
| JP | 04-107299 | | 9/1992 |
| JP | 05-080790 | | 4/1993 |
| JP | 07-182587 | | 7/1995 |
| JP | 07-302093 | | 11/1995 |
| JP | 10-277263 | | 10/1998 |
| JP | 11-288291 | | 10/1999 |
| JP | 2001-290489 | | 10/2001 |
| JP | 2004-074994 | | 3/2004 |
| JP | 2004-085235 | | 3/2004 |
| JP | 2004-093438 | | 3/2004 |
| JP | 2005-134749 | | 5/2005 |
| JP | 2005-289354 | | 10/2005 |

OTHER PUBLICATIONS

Patent Cooperation Treaty "International Search Report" re: International Application No. PCT/JP2006/304806 dated Jun. 20, 2006 of Yamaha Corporation, 12 pages.

* cited by examiner

ENGINE SOUND PROCESSING SYSTEM

RELATED APPLICATIONS

This application is a divisional of U.S. application Ser. No. 11/886,044, filed Sep. 10, 2007, now U.S. Pat. No. 8,155,343, which is a National Phase of International Application PCT/JP2006/304806, filed Mar. 10, 2006, which international application designates the U.S., but was not published in English under PCT Article 21(2). The disclosures of the above-mentioned applications are incorporated herein by reference.

TECHNICAL FIELD

The present invention relates to an engine sound processing system for reproducing an engine sound of an automobile in a compartment by means of processing the engine sound.

BACKGROUND ART

From the viewpoint of controls on noise of an automobile, a demand recently exists for tranquility particularly in relation to an engine sound. Tranquility is enhanced by means of attaching an acoustic insulator to an engine room and an exhaust line. Moreover, in view of an emphasis on fuel-economy performance, a design is made so as to reduce an engine speed and an engine sound.

However, such enhanced tranquility cannot necessarily be said to be a comfortable drive environment for passengers of the automobile. Put another way, there are cases the circumstance where a moderate engine sound is heard in a vehicle cabin is a more comfortable drive environment for a driver, such as a motoring enthusiast.

In order to meet the taste of such a motoring enthusiast, a device for artificially generating an engine sound in the vehicle cabin has already been proposed.

Devices proposed as such a device include; for instance, a device capable of generating a sinusoidal waveform or a pulse sound in tune with an engine speed (synchronized with an engine sound), emitting the thus-generated sinusoidal waveform or pulse sound in a vehicle cabin, to thus add the waveform or pulse sound to an engine sound actually leaked into the vehicle cabin, thereby enabling passengers to hear in an enhanced manner a portion of the frequency band of the engine sound (see; e.g., Patent Document 1); a device which has previously recorded a desired engine sound and plays the thus-recorded sound back in tune with the engine speed, thereby producing a desired engine sound in a vehicle cabin (see; e.g., Patent Document 2); and a device which picks up an engine sound in a vehicle cabin by means of a microphone embedded in a headrest and enables a passenger to hear in an enhanced manner a portion of the frequency band (see; e.g., Patent Document 3).

Patent Document 1: JP-A-5-80790

Patent Document 2: JP-A-7-302093

Patent Document 3: JP-A-2004-74994

DISCLOSURE OF THE INVENTION

Problem that the Invention is to Solve

However, all of the devices described in Patent Documents 1, 2, and 3 generate a sound differing from an actual engine sound of an automobile of interest. No matter how many types of sensors are used for detecting driving conditions, a sound accurately reflecting an actual engine sound responsive to driving conditions cannot always be generated.

The present invention aims at providing an engine sound processing system capable of producing a more real engine sound in a vehicle cabin by means of picking up an actual engine sound outside the vehicle cabin, processing the picked-up sound, and outputting the thus-processed sound.

Means for Solving the Problem

In order to solve the problem, the present invention adopts the following means.

(1) An engine sound processing system comprising:
- a microphone which is disposed outside a vehicle cabin of an automobile and which picks up an engine sound of the automobile;
- a sensor for detecting driving condition of the automobile;
- a signal processing section which processes the engine sound picked up by the microphone in accordance with the detected result by the sensor and outputs the engine sound; and
- a speaker for outputting the engine sound subjected to signal processing performed by the signal processing section.

(2) The engine sound processing system according to (1), wherein the signal processing section includes a filter which exhibits a sound-insulation characteristic for simulating a sound insulation characteristic of a wall surface of the vehicle cabin and an active filter whose characteristic varies according to the driving condition.

(3) The engine sound processing system according to (1), wherein the microphone is provided in numbers and disposed in one of or some of an air inlet and an air outlet of the engine, an engine head, and a wall surface of an engine room.

(4) The engine sound processing system according to (1), wherein the sensor corresponds to one of a sensor for detecting an engine speed, a sensor for detecting a degree of depression of an accelerator, and a sensor for detecting speed of the automobile, or all of them.

(5) The engine sound processing system according to (1) further comprising a control section which determines a signal processing characteristic according to the detected result by the sensor and which controls the signal processing section.

(6) The engine sound processing system according to (5), wherein the control section includes a parameter table storing a relationship between the detected result by the sensor and the signal processing characteristic.

(7) The engine sound processing system according to (5) further comprising an operation section which is connected to the control section and which enables a user to operate the signal processing characteristic of the control section.

(8) The engine sound processing system according to (5) further comprising frequency analysis means for analyzing a frequency of engine sound picked up by the microphones, to determine a spectrum, wherein the signal processing section processes the spectrum determined by the frequency analysis means and sends an output to the speaker.

(9) The engine sound processing system according to (8), wherein the control section enhances a peak of the spectrum determined by the frequency analysis means.

(10) The engine sound processing system according to (8), wherein the control section increases a level of a valley between peaks of the spectrum determined by the frequency analysis means.

(11) The engine sound processing system according to (5) further comprising:

frequency analysis means for analyzing a frequency of the engine sound picked up by the microphone and detecting a peak of the spectrum, wherein the signal processing section pitch-shifts the peak of the spectrum determined by the frequency analysis means, to enhance and output a specific frequency component; and wherein the control section sets a frequency to be pitch-shifted by the signal processing section.

(12) The engine sound processing system according to (5), further comprising:

a waveform generation section for generating a modulated signal waveform, wherein the signal processing section outputs the modulated signal waveform generated by the waveform generation section to the speaker.

(13) The engine sound processing system according to (12), wherein the control section sets a modulation period according to the detected result by the sensor.

(14) The engine sound processing system according to (12), wherein the control section sets a depth of modulation according to the detected result by the sensor.

(15) The engine sound processing system according to (12), wherein the waveform generation section generates modulated signal waveforms corresponding to respective engine sounds picked up by the microphones; and the control section sets modulation periods of the modulated signal waveforms at periods synchronized with the respective engine sounds picked up by the microphones.

(16) The engine sound processing system according to (15), wherein the control section outputs peaks of the modulated signal waveform at the same timing as that of respective peaks of the picked-up engine sound.

(17) The engine sound processing system according to (5) further comprising chord construction means for, when chord construction information is given, generating an audio consonant signal having a pitch in consonance with a pitch of the engine sounds picked up by the microphones, in accordance with the chord construction information and adding the audio signal of consonance to the engine sound and outputs the added engine sound.

(18) The engine sound processing system according to (17), wherein the control means generates chord construction information according to the detected result by the sensor and provides the chord construction information to the chord construction means.

(19) The engine sound processing system according to (17), wherein the control section specifies the driving condition according to a current value of the detected result by the sensor or a manner of change in a signal output from the sensor within a given period of time in the past, and generates chord construction information according to the driving conditions.

(20) The engine sound processing system according to (17), wherein the chord construction means includes a pitch transformation section which subjects the picked-up engine sounds to pitch transformation, to generate the audio signal of consonance.

(21) The engine sound processing system according to (17), wherein the chord construction means includes a synthesis section which synthesizes an audio consonant signal having a target pitch by taking an ignition pulse for the engine of the vehicle as a trigger.

(22) The engine sound processing system according to (1), wherein the signal processing section includes phase correction means which has a plurality of types of correction modes and which makes, according to the correction mode selected by the user, a correction conforming to a frequency to a phase characteristic of an engine sound supplied to the speaker.

(23) The engine sound generation system according to (22) further comprising an engine speed sensor for measuring an engine speed of the vehicle, wherein the phase correction means determines, according to an engine speed measured by the engine speed sensor, a frequency whose phase characteristic is to be corrected.

(24) The engine sound generation system according to (22) further comprising an accelerator depression sensor for measuring the degree of depression of an accelerator of the vehicle, wherein the phase correction means increases or decreases an amount of correction to the phase characteristic according to the degree of depression of an accelerator measured by the accelerator depression sensor.

(25) The engine sound generation system according to (1), wherein the signal processing section adds distortion to the engine sound picked up by the microphone.

(26) The engine sound processing system according to (25), wherein a degree of the distortion is dynamically changed according to at least either an engine speed or the degree of depression of an accelerator.

(27) The engine sound processing system according to (25), wherein a type of the distortion to be added is dynamically changed according to at least either an engine speed or the degree of depression of an accelerator.

(28) The engine sound processing system according to (25), wherein an equalizer section whose frequency characteristic is dynamically changed according to at least either an engine speed or the degree of depression of an accelerator is interposed between the microphones and the distortion section.

(29) The engine sound processing system according to (25) further comprising an amplifier for outputting to the speaker the engine sound imparted with distortion at a sound volume which is dynamically controlled according to at least an engine speed or the degree of depression of an accelerator.

(30) The engine sound processing system according to (25), wherein the distortion imparted by the signal processing section, the frequency characteristic of the filter, or the manner in which the sound volume of the amplifier is dynamically changed is changed according to a rate of change in engine speed or a rate of change in degree of depression of an accelerator.

(31) A vehicle cabin acoustic controller comprising:

a speaker disposed in a vehicle cabin;

signal generation means for generating an audio signal representing a pseudo engine sound;

engine sound signal generation means for generating an engine sound signal from the audio signal and supplying the engine sound signal to the speaker, wherein the engine sound signal generation means generates an audio consonant signal having a pitch in consonance with a pitch of the audio signal according to the chord construction information when being provided with chord construction information and adds the audio consonant signal to the audio signal, to generate the engine sound signal; and control means which monitors driving condition, generates chord construction information according to driving condition, and imparts the chord construction information to the chord construction means.

(32) An engine sound generation system comprising:

a speaker disposed in a vehicle cabin; and signal generation means for generating an engine sound signal representing a pseudo engine sound and supplying the engine sound signal to the speaker, wherein the signal generation means includes phase correction means which has a plurality of types of correction modes and makes a correction conforming to a frequency to a phase characteristic of an engine sound supplied to the speaker according to the correction mode selected by a user.

According to the above configurations, there can be provided an engine sound processing system capable of generating a more real engine sound in a vehicle cabin by means of picking up an actual engine sound outside the vehicle cabin and outputting the engine sound after having processed the engine sound.

BEST MODES FOR IMPLEMENTING THE INVENTION

Figure 1:
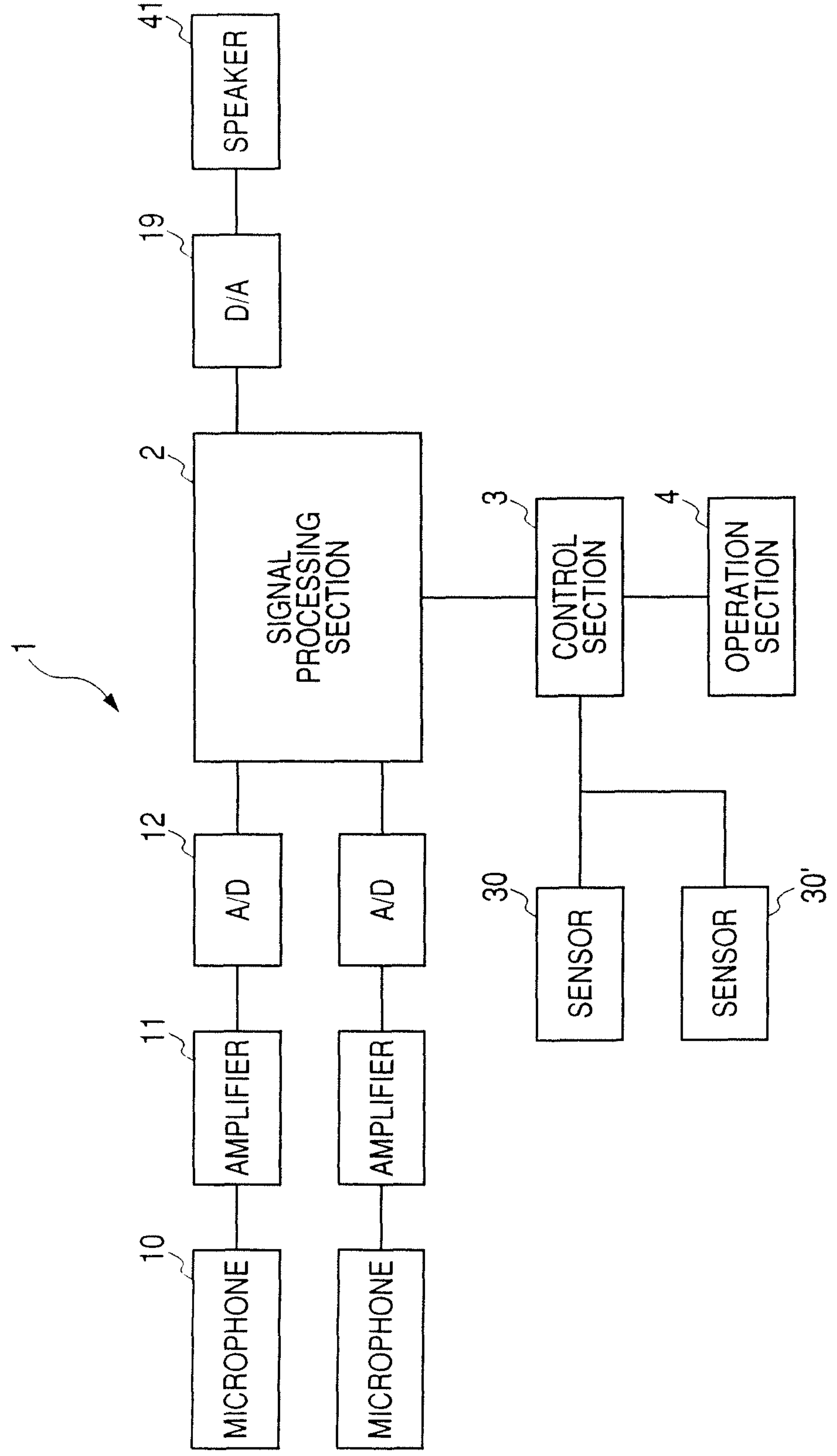
FIG. 1 is a block diagram of an engine sound processing system of the present invention.

Engine sound processing systems which are embodiments of the present invention will be described by reference to the drawings. FIG. 1 is a block diagram of an engine sound processing system.

An engine sound processing system 1 includes a microphone 10 which is disposed outside a vehicle cabin of an automobile and which picks up an engine sound; an amplifier 11 for amplifying an audio signal input by the microphone 10; an analogue-to-digital (A/D) converter 12 for converting an amplified signal from the amplifier 11 into a digital signal; a signal processing section 2 for subjecting the digital signal to signal processing; a digital-to-analogue (D/A) converter 19 for converting an output from the signal processing section 2 into an analogue signal; and a speaker 41 which outputs an analogue signal.

Moreover, the engine sound processing system 1 has a sensor 30 for detecting driving conditions. A value detected by the sensor is input to the control section 3.

The control section 3 determines a signal processing characteristic of the signal processing section 2 in according with the output from the sensor. The control section 3 outputs the thus-determined signal processing characteristic to the signal processing section 2, thereby controlling signal processing.

The control section 3 is connected to an operation section 4. A user (driver) operates this operation section 4, to thus determine the signal processing characteristic of the signal processing section 2 in accordance with driving conditions (an output from a sensor 30).

By means of the above configuration, an actual engine sound is picked-up by means of the microphone, and the picked-up sound is subjected to signal processing according to signal processing according to driving condition, thereby enabling production of a real engine sound.

The signal processing section 2 may also be provided with a filter for simulating a sound insulation characteristic of a wall surface in the vehicle cabin. Specifically, since the microphone 10 picks up a sound directly in an engine room, the picked-up audio signal includes high-level mechanical noise of high tone, and the picked-up sound differs materially from the engine sound heard by passengers, such as a driver and others, in the vehicle cabin. Therefore, in order to achieve sound quality (frequency distribution) analogous to the engine sound heard in the vehicle cabin, a filter simulates a sound insulation characteristic of the wall surface of the vehicle cabin, to thus process the audio signal into a sound whose low frequencies are held intactly but high frequencies are cut off. In relation to this sound insulation characteristic, the sound insulation characteristic of an automobile equipped with this device does not always need to be simulated. A sound insulation characteristic of a sports car or a sound insulation characteristic of a luxury car may also be simulated.

In the above configuration, only one microphone is provided. However, a plurality of microphones can also be provided. In this case, a microphone can be positioned at a plurality of locations among an inlet port of the engine, an outlet port of the same, an engine head, and a wall surface of the engine room, and a more real engine sound can be produced.

In the above configuration, a plurality of sensors for detecting driving conditions may also be disposed. In this case, a plurality of driving conditions, such as an engine speed, the degree of depression of an accelerator, the speed of an automobile, and the like, can be detected.

More specific embodiments of the present invention will be described hereunder.

Figure 2:
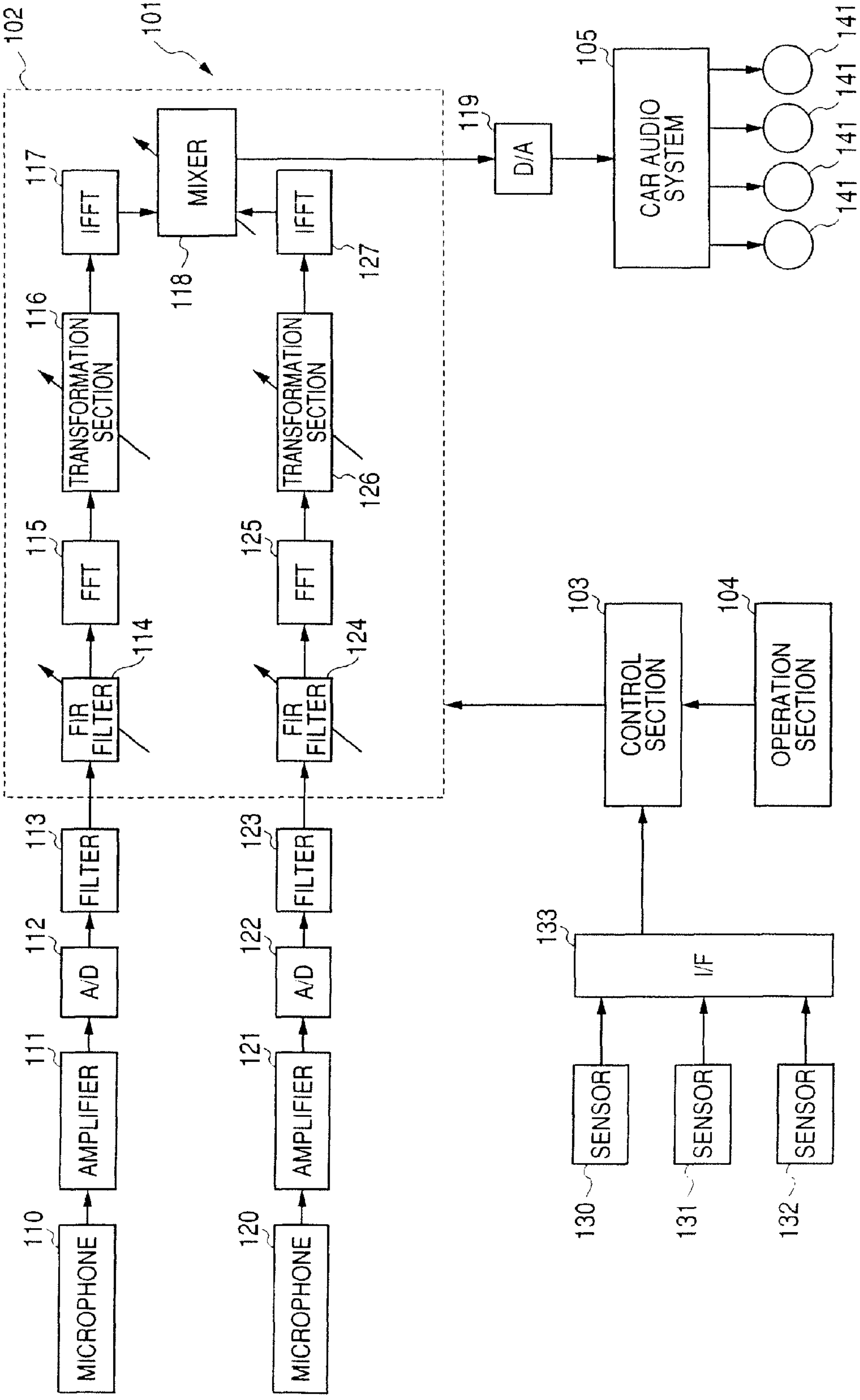
FIG. 2 is a block diagram of an engine sound processing system which is a first embodiment of the present invention.
Figure 3:
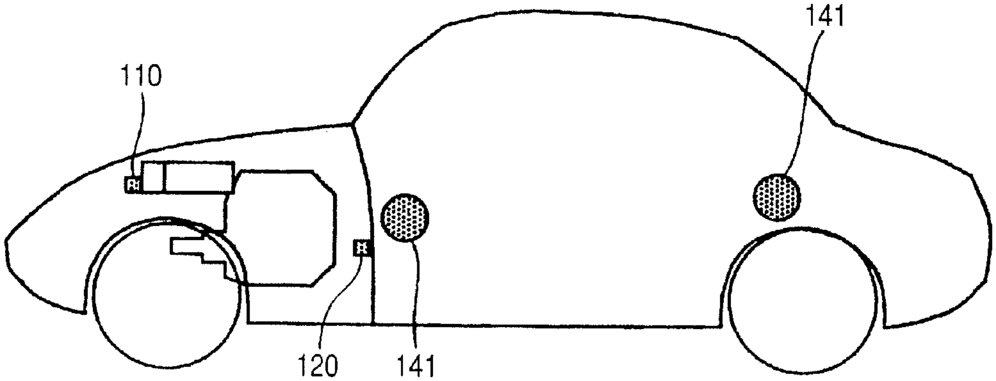
FIG. 3 is a view for describing a location where microphones and speakers of the engine sound processing system that is the first embodiment are to be mounted.

An engine sound processing system of the present invention is described by reference to the drawings. FIG. 2 is a block diagram of the engine sound processing system. FIG. 3 is a view for describing locations where microphones and speakers of the engine sound processing system are to be mounted.

As shown in FIG. 3, an engine sound processing system 101 comprises two microphones 110 and 120, and these microphones are attached to the inlet port of the engine and the vehicle-cabin-side wall surface of the engine room, respectively. The microphone 110 attached to the inlet port of the engine primarily picks up an engine intake sound. Further, the microphone 120 mounted on a vehicle-cabin-side wall surface of the engine room picks up an operating sound (hereinafter called an "engine explosion sound") such as engine explosion, engine rotation, and the like. Mount locations of the microphones and the number of microphones are not limited to those described in connection with this embodiment. For instance, a microphone may also be attached to a neighborhood of a muffler, to thus pick up an exhaust sound. Alternatively, the microphone may also be attached to a neighborhood of the engine head, to thus pick up a mechanical sound such as the sound of a chain, or the like.

The microphones attached to the respective locations can pick up different sounds according to locations where the microphones are attached. Accordingly, a plurality of microphones may additionally be provided in the respective mount locations, and sounds picked up by these microphones may also be mixed. For instance, a microphone attached to the vehicle-cabin-side wall surface of the engine room can pick up an operation sound of a different portion of the engine according to the mount position of the microphone. Consequently, a plurality of microphones may also be attached to the vehicle-cabin-side wall surface of the engine room, and sounds picked up by the microphones may also be mixed. The essential requirement is to adjust a mixing ratio in accordance with required sound quality and pickup the sound of engine operation.

The microphone is not limited to an acoustic microphone. For instance, the microphone may also be a vibration microphone, or the like, for picking up; e.g., vibrations in an audible frequency range. Engine vibrations in the audible frequency range can be picked up directly (before transforming into a sound), so long as this vibration sensor is attached to the engine. Specifically, the vibration sensor does not detect a vibration pulse of the engine but picks up a signal acting as the sound source of the engine. Attaching the vibration sensor to the inlet port of the engine enables picking up of only a pure intake sound without picking up wind noise, or the like, irrelevant to the rotation of the engine. Meanwhile, an acoustic microphone is attached to the neighborhood of the muffler, to thus pick up an exhaust sound having a frequency peak responsive to the order of engine rotation. Further, when an exhaust sound is picked-up by means of the vibration sensor, the vibration sensor is attached to the neighborhood of the position where the muffler is mounted. As above, the essential requirement is to attach the acoustic microphone and the vibration sensor respectively according to locations where they are to be mounted.

Four speakers 141; namely, a front right speaker, a front left speaker, a rear right speaker, and a rear left speaker, are disposed in the cabin. These speakers 141 are for use with car audio equipment and are not unique to the engine sound processing system. Specifically, this engine sound processing system is arranged so as to pick up an engine sound and processes the picked-up sound; subsequently input a resultant audio signal to car audio equipment 105; and output the engine sound to the inside of the cabin by way of the car audio equipment 105.

In FIG. 2, the microphone 110 is connected to an amplifier 111, and the microphone 120 is connected to an amplifier 121. The amplifiers 111 and 121 amplify audio signals (pertaining to an intake sound and an engine explosion sound) input by the respective microphones 110 and 120. The thus-amplified audio signals are converted into digital signals by means of the ND converters 112 and 122. Unwanted frequency bands of the audio signals converted into digital signals, which include few intake sound or engine explosion sound, are cut off by the filters 113 and 123. Further, when the levels of the signals are too high, the signals are attenuated by the filters. Therefore, the essential requirement is to create the respective filters 113 and 123 by combination of a low-pass filter, a high-pass filter, an attenuator, and other elements.

The signals whose frequency bands and signal levels have been limited by the filters 113 and 123 are input to the signal processing section 102. The signal processing section 102 subjects the intake sound picked up by the microphone 110 and the engine explosion sound from the wall surface of the engine room picked up by the microphone 120 to signal processing through respectively-separate channels. Signal processing may also be performed through a single channel after the signals have been mixed.

In the signal processing section 102, the filter 114 and the filter 124 are filters which simulate a sound insulation characteristic of the wall surface of the vehicle cabin. Specifically, since the microphones 110 and 120 pick up a sound directly in the engine room, the picked-up audio signal includes high-level mechanical noise of high tone, and a sound signal originating from such a sound differs materially from the engine sound heard by passengers, such as a driver and others, in the vehicle cabin. Therefore, in order to achieve sound quality (frequency distribution) analogous to that of the engine sound heard in the vehicle cabin, the filters 114 and 124 simulate a sound insulation characteristic of the wall surface of the vehicle cabin, to thus process the audio signals into a sound whose low frequencies are held intactly but high frequencies are cut off. This sound insulation characteristic does not necessarily simulate the sound insulation characteristic of an automobile equipped with this device. A sound insulation characteristic of a sports car or a sound insulation characteristic of a luxury car may also be simulated.

Filtering characteristics (sound insulation characteristics) of the filters 114 and 124 may also be fixed. However, it may also be possible to make settings changeable, to thus alter the frequency characteristic of the engine sound.

The signals filtered by the filters 114 and 124 are input to an FFT section 115 and an FFT section 125. The FFT sections subject the input signals to fast Fourier transform, to thus extract frequency components. A frequency spectrum is acquired from the thus-extracted frequency components.

Conversion sections 116 and 126, which are next connected to the FFT sections 115 and 125, are active filters for transforming geometries of frequency spectra output from the FFT sections 115 and 125 according to driving conditions. Transformation characteristics pertaining to the geometries of the frequency spectra will be described later.

The transformed frequency spectra output from the conversion sections 116 and 126 are converted into time-axis waveforms by means of IFFT sections 117 and 127. Subsequently, the waveforms are mixed into an audio signal of one channel by means of a mixer 118. The audio signal is then converted into an analogue audio signal by a D/A converter 119, and the audio signal is output to the car audio equipment 105. This audio signal of one channel includes a stereo output signal (L/R).

Here, a connection may also be made such that the transformed frequency spectra is first mixed by means of the mixer, to thus generate a signal of one channel, and such that the signal is converted into a time-axis waveform by means of the IFFT sections. In this case, the mixer 118 is connected to an output side of the conversion section 116 and an output side of the conversion section 126, and a single IFFT section (the IFFT section 117 or the IFFT section 127) is connected to an output side of the mixer 118. Further, a connection is made such that a signal output from the IFFT section is input to the D/A converter 119.

An engine speed sensor 130 for detecting an engine speed, an accelerator depression sensor 131 for detecting the degree of depression of an accelerator, and a vehicle speed sensor 132 for detecting the speed of a vehicle are provided in the engine sound processing system as sensors for detecting driving conditions. Detection values from the respective sensors are input to the control section 103 by way of an interface 133. The interface 133 is assumed to incorporate an A/D converter, as required. When the engine speed sensor 130 and the vehicle speed sensor 132 correspond to an encoder which outputs a pulse in accordance with the rotation of the engine or the rotation of an axle shaft, the control section 103 may also compute an engine speed and a vehicle speed from an integrated value of pulses or a pulse interval.

In response to outputs from the sensors, the control section 103 determines parameters used for determining frequency spectrum transformation characteristics of the conversion sections 116 and 126 and a mixing ratio of the mixer 118. The control section 103 outputs the thus-determined parameters and the mixing ratio to the signal processing section 102, thereby controlling the conversion sections 116 and 126 and the mixer 118.

The control section 103 is connected to an operation section 104. The operation section 104 may be shared with the car audio equipment 105 or may also be arranged so as to receive an input of a signal from the operation section of the audio equipment. The user (driver) operates this operation section 104, thereby setting control characteristics of the conversion sections 116 and 126 and a control characteristic of the mixer 118 responsive to the driving conditions (outputs from the sensors 130, 131, and 132). Further, this operation section 104 is operated, to thus set filtering characteristics (sound insulation characteristics) of the filters 114 and 124.

Figure 4:
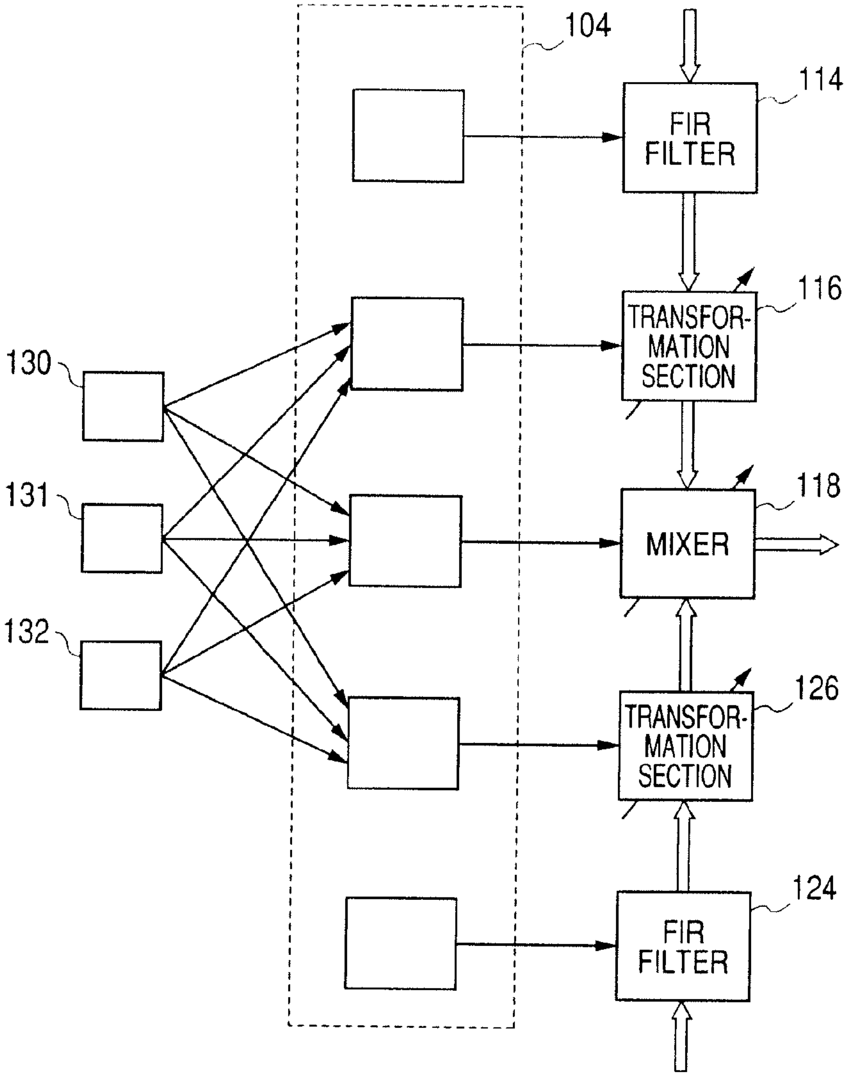
FIG. 4 is a view for describing a control system of the engine sound processing system that is the first embodiment.

Specifically, a control system of this engine sound processing system is illustrated as shown in FIG. 4. By means of setting operation of the operation section 104, the control characteristics of the filters 114 and 124, the control characteristics of the conversion sections 116 and 126, and the control characteristic of the mixer 118 are set. Of these control characteristics, the characteristics of the conversion sections 116 and 126 and the characteristic of the mixer 118 are controlled in real time in accordance with outputs from the sensors 130, 131, and 132.

In relation to setting of the spectrum transformation characteristics and the mixing ratio performed by means of the operation section 104, one or a plurality of parameters may also be set in advance in the respective conversion sections through manual operation. One or a plurality of parameter sets may also be stored in advance in the control section 103, and any of the parameter sets may also be selected and set. When the plurality of parameter sets are prepared, it is better to previously set; for example, a parameter set for producing a powerful engine sound effect as is yielded by a V-engine, a parameter set for producing a clear engine sound effect as is yielded by a straight engine, and other parameter sets; and to enable switching of a mode between an V-engine mode and a straight engine mode. Naturally, it is also possible to deactivate the function of this engine sound processing system so as not to produce an engine sound effect.

Flash memory or a connector of a ROM pack may also be provided in advance, and a parameter set may also be supplied from the flash memory or the ROM. Moreover, the parameter set may also be supplied from a hard disk drive of a car navigation system. Alternatively, it may also be possible to download the parameter set from the Internet. Furthermore, the engine sound processing system may also be provided with a LAN connector, or a like connector, in advance, to thus enable supply of a parameter set or manual setting of parameters from a connected computer (a notebook computer) by way of this connector.

Figure 5:
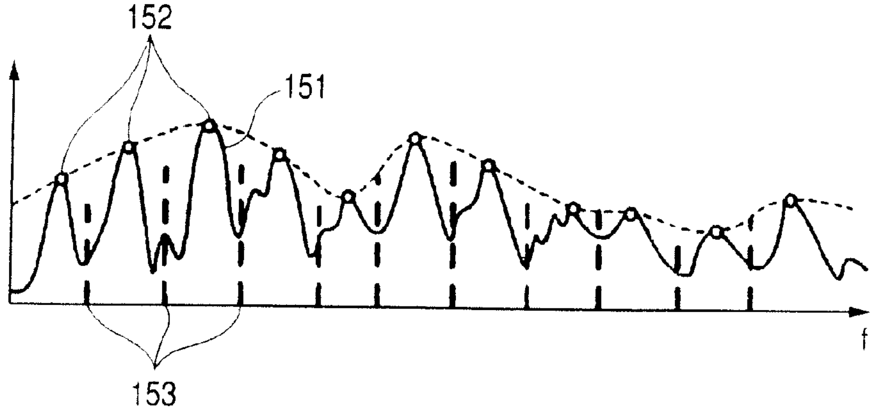
FIG. 5 is a view for describing a spectrum transformation characteristic of the engine sound processing system that is the first embodiment.

Example control of spectrum transformation characteristics of the conversion sections 116 and 126 will now be described by reference to FIG. 5. A horizontal axis of the graph shown in FIG. 5 shows a frequency, and a vertical axis of the same shows a gain of the conversion section. A graph plotted in the drawing shows an example frequency spectrum of a picked-up engine sound. Thus, the picked-up engine sound shows peaks (designated by circles 152 in the drawing) at predetermined intervals along the frequency axis. A peak frequency of the peaks matches an essentially-harmonic frequency of the frequency responsive to the engine speed, and high-level peaks other than these peaks are not present.

In general, a spectrum 151 which thus shows peaks at uniform intervals along the frequency axis and high-level peaks other than the peaks are not present leads to clear sound quality free from distortion. However, such sound quality cannot be said to be pleasant for the motoring enthusiast. In short, there is a case where a powerful, noisy engine sound as is produced by the V-engine is preferred. Such a motoring enthusiast prefers sound quality including distortion.

The conversion sections 116 and 126 detect peaks from an input frequency spectrum and change a spectrum geometry defined between peaks. Specifically, levels of the center frequencies (designated by a broken line section 153 shown in FIG. 5) of respective peak harmonic frequencies are increased, to thus change sound quality to distorted sound quality. A frequency whose level is to be increased is not limited to the center frequencies (frequencies 1.5fo, 2.5fo, . . . provided that a fundamental tone is taken as fo) of the respective peak harmonic frequencies. Any frequencies (e.g. frequencies 1.4fo, 2.6fo, . . . ) located between peak harmonic frequencies are acceptable.

Figure 6:
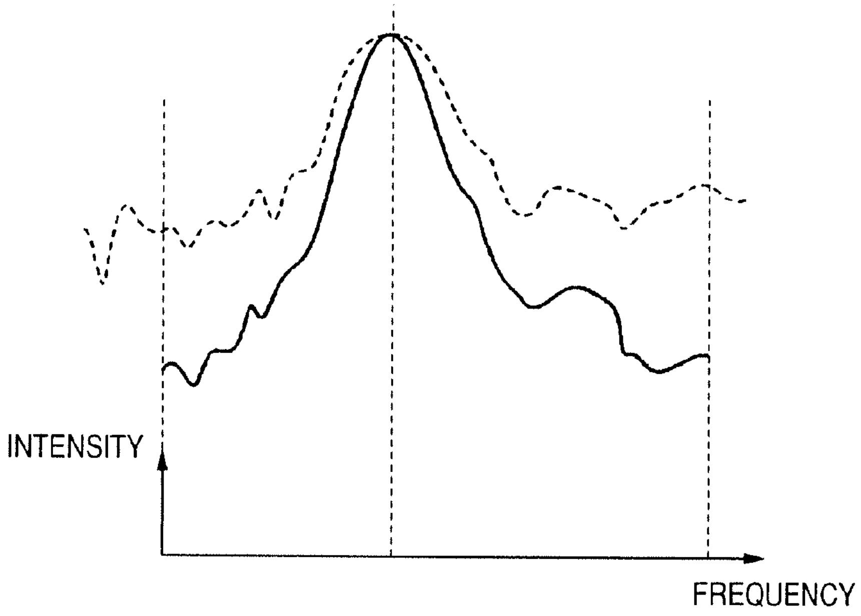
FIG. 6 is a view for describing another spectrum transformation characteristic of the engine sound processing system that is the first embodiment.

Levels around the respective peak frequencies may also be changed as follows. FIG. 6 is a view showing a gain appearing around one peak frequency in a frequency spectrum. As illustrated, the level of the peak frequency in the frequency spectrum designated by a solid line remain unchanged, and the level is increased with increasing distance from the peak frequency, as indicated by a broken line. In this case, spectrum components other than the peak frequency component have become greater, and distorted sound quality is achieved, whereby the powerfulness of the engine sound is enhanced.

Meanwhile, in the present embodiment, the conversion sections 116 and 126 can also reverse the previously-described processing; namely, the conversion sections can enhance peaks of a frequency spectrum, to thus convert the sound into sound of more clear, distortion-free quality. In this case, levels of the peak frequency are increased. As a result of conversion of sound into clear, distortion-free sound, needs of drivers who prefer a tranquil engine sound, such as a motor sound, can be addressed.

As mentioned above, parameter sets relating to control of these characteristics can be changed in accordance with the user's operation. It is better to set a parameter set for a V-engine mode in which powerfulness is enhanced by means of increasing levels among peaks, a parameter set for a straight engine mode in which clarity is enhanced by means of increasing levels of peaks, and other parameter sets, to thus enable a driver, or other persons, to make a change.

The example where foregoing processing is performed at all frequency bands has been described. However, processing may also be performed in limited frequency bands. For instance, powerfulness of only low frequencies is enhanced, whereby powerful sound quality as is produced by an engine of a smaller number of cylinders with large displacement can be achieved.

Figure 7A:
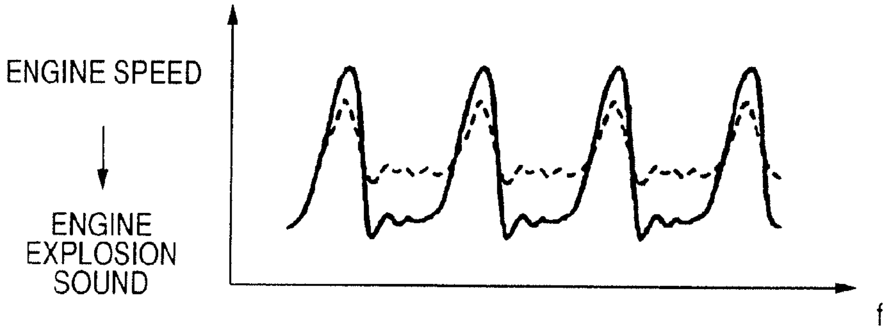
FIG. 7A is a first view for describing a spectrum transformation characteristic responsive to a sensor output in the engine sound processing system that is the first embodiment.
Figure 7B:
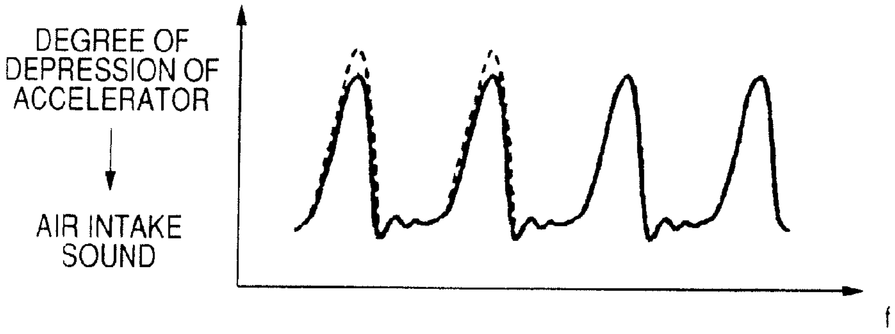
FIG. 7B is a second view for describing a spectrum transformation characteristic responsive to a sensor output in the engine sound processing system that is the first embodiment.
Figure 7C:
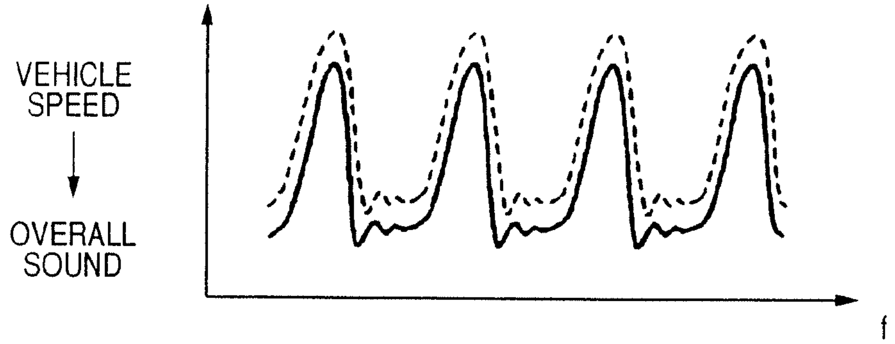
FIG. 7C is a third view for describing a spectrum transformation characteristic responsive to a sensor output in the engine sound processing system that is the first embodiment.

By reference to FIGS. 7A to 7C, next will be described a case where spectrum characteristics are controlled according to detection values from the sensors 130, 131, and 132. Each of horizontal axes of graphs shown in FIGS. 7A to 7C represents a frequency, and each of vertical axes of the graphs represents a gain of the transformation section. A frequency gain of a filter shown in the drawings has the following features.

FIG. 7A shows a spectrum transformation control characteristic of the engine explosion sound determined from an engine speed, and the characteristics are based on the following rules.

(a) When an engine speed is low, peaks in all frequency bands are enhanced.

(b) When the engine speed is high, levels other than the peaks in all of the frequency bands are increased.

FIG. 7B shows a spectrum geometry control characteristic of an intake sound determined from the degree of depression of an accelerator, and the characteristic is based on the following rules.

(c) When the degree of depression of an accelerator is small, a spectrum geometry remains untransformed.

(d) When the degree of depression of an accelerator is great, low-tone peaks of the intake sound are enhanced.

FIG. 7C shows a control characteristic of the entire sound volume level determined from a vehicle speed, and the characteristic is based on the following rules.

(e) When a vehicle speed is low, the geometry of a spectrum remains untransformed.

(f) When the vehicle speed is high, the entire sound volume level is increased while the geometry of the spectrum remains intact over all of frequency bands.

The above rules are based on an objective of "When the engine speed is low, peaks are enhanced in order to enhance tranquility, to thus achieve clear sound quality. However, when the engine speed is high, levels of all frequency bans other than peak levels are increased in order to enhance the powerfulness of the engine. When the degree of depression of an accelerator is large, load is imposed on the engine. Hence, low-frequency peaks of the intake sound are enhanced, to thus enhance clarity of a low tone. When the vehicle velocity is high, noise other than the engine sound, such as wind noise, tire noise, or the like, becomes greater. Therefore, the overall sound volume is increased." The rules are equivalent to rules for the V-engine mode. The rules for the V-engine mode are for further enhancing the powerfulness of an actual engine sound according to driving conditions achieved at that time.

Although the essential requirement is to determine frequency bands of low tone from the frequency distribution of the engine sound, the frequency bands of low tone are usually set to 300 to 500 Hz.

The rules for controlling the spectrum transformation characteristics are not limited to those mentioned above.

Figure 8A:
FIG. 8A is a first view for describing a relationship between an engine speed and the gain of one peak in a frequency spectrum of an engine sound.
Figure 8B:
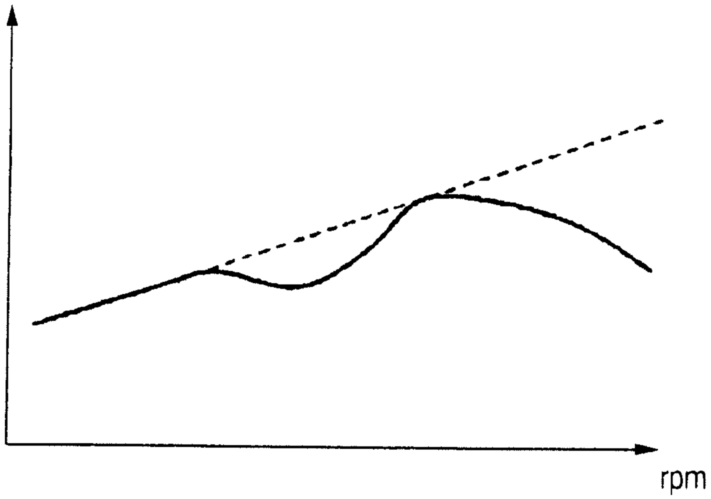
FIG. 8B is a second view for describing a relationship between an engine speed and the gain of one peak in a frequency spectrum of an engine sound.
Figure 8C:
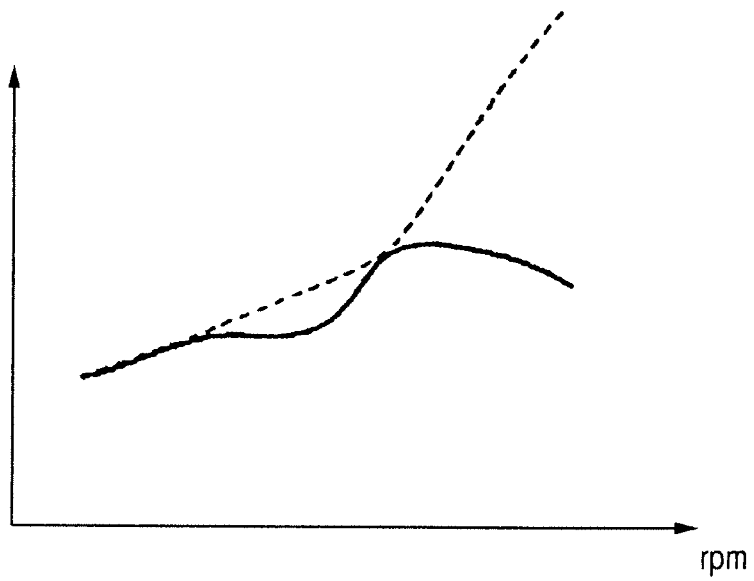
FIG. 8C is a third view for describing a relationship between an engine speed and the gain of one peak in a frequency spectrum of an engine sound.

Control of spectrum transformation characteristics of the conversion sections 116 and 126 in another embodiment will be described below. FIGS. 8A to 8C are views showing a relationship between the level of one peak of the frequency spectrum of the engine sound and an engine speed. The horizontal axis of the graph shown in FIG. 8A represents a time, and the vertical axis of the same represents a gain of the conversion section. Horizontal axes of graphs shown in FIGS. 8B and 8C represent an engine speed, and vertical axes of the same represent a gain of the transformation section.

FIG. 8A is a graph showing hourly variations in the gain of the conversion section with reference to a constant engine speed, and the level of the engine sound is not constant and increases or decreases irregularly as illustrated. In general, as shown in FIG. 8A, even when the engine speed is constant, the level of the engine sound is not constant and varies irregularly. Such a sound cannot be said to be pleasant for the motoring enthusiast. The motoring enthusiast prefers an engine sound whose volume linearly responds to the engine speed. Such a linear engine sound is determined to be an engine sound of high quality.

The conversion sections 116 and 126 detect peaks from an input frequency spectrum and measure hourly variations in the peak level. Provided that the peak level linearly responds to the engine speed, hourly variations in peak level can be predicted from the engine speed. Consequently, when a measured peak level has become lower than a predicted peak level, the conversion sections 116 and 126 increase the level of a frequency component of interest so as to reach the predicted peak level.

FIG. 8B is a graph showing a relationship between an engine speed and a gain of the conversion sections. As indicated by a solid line in FIG. 8B, the engine sound usually does not linearly respond to the engine speed and varies irregularly. In the case of an engine of low performance, even when an output has abruptly decreased from a certain engine speed, a sound volume also decreases. When the measured peak level has become lower than the predicted peak level, the conversion sections 116 and 126 increase the peak level such that the engine sound linearly responds to the engine speed, as indicated by a broken line in FIG. 8B.

FIG. 8C is a graph representing an engine speed and a gain of the conversion section. In FIG. 8C, the peak level is increased such that the engine sound abruptly increases from a certain engine speed, as indicated by a broken line.

As a result, the feeling of linearity embodied by an increase in sound pressure in response to an engine speed, can be reproduced. The feeling of nonlinearity embodied by an abrupt increase in sound pressure from a certain engine speed as achieved in a turbo engine can also be reproduced.

All of these processing operations may also be performed in connection with all detected peaks at all frequency bands or in limited frequency bands.

In order to accurately reflect the above rules on the spectrum transformation characteristic, it may also be possible to prepare in advance; for example, a function adopting sensor outputs as variables, and to input a sensor output to this function, to thus determine a characteristic. Alternatively, the characteristic may be determined by means of Fuzzy inference. Moreover, it may also be possible to previously determine a table for use in determining a spectrum transformation characteristic in predetermined steps of respective sensor outputs and to search this table by use of the sensor outputs, thereby reading a corresponding spectrum transformation characteristic. In any event, a parameter set which is to be set by the user is assumed to include information for use in determining a spectrum transformation characteristic from the sensor output.

[Second Embodiment]

Figure 9:
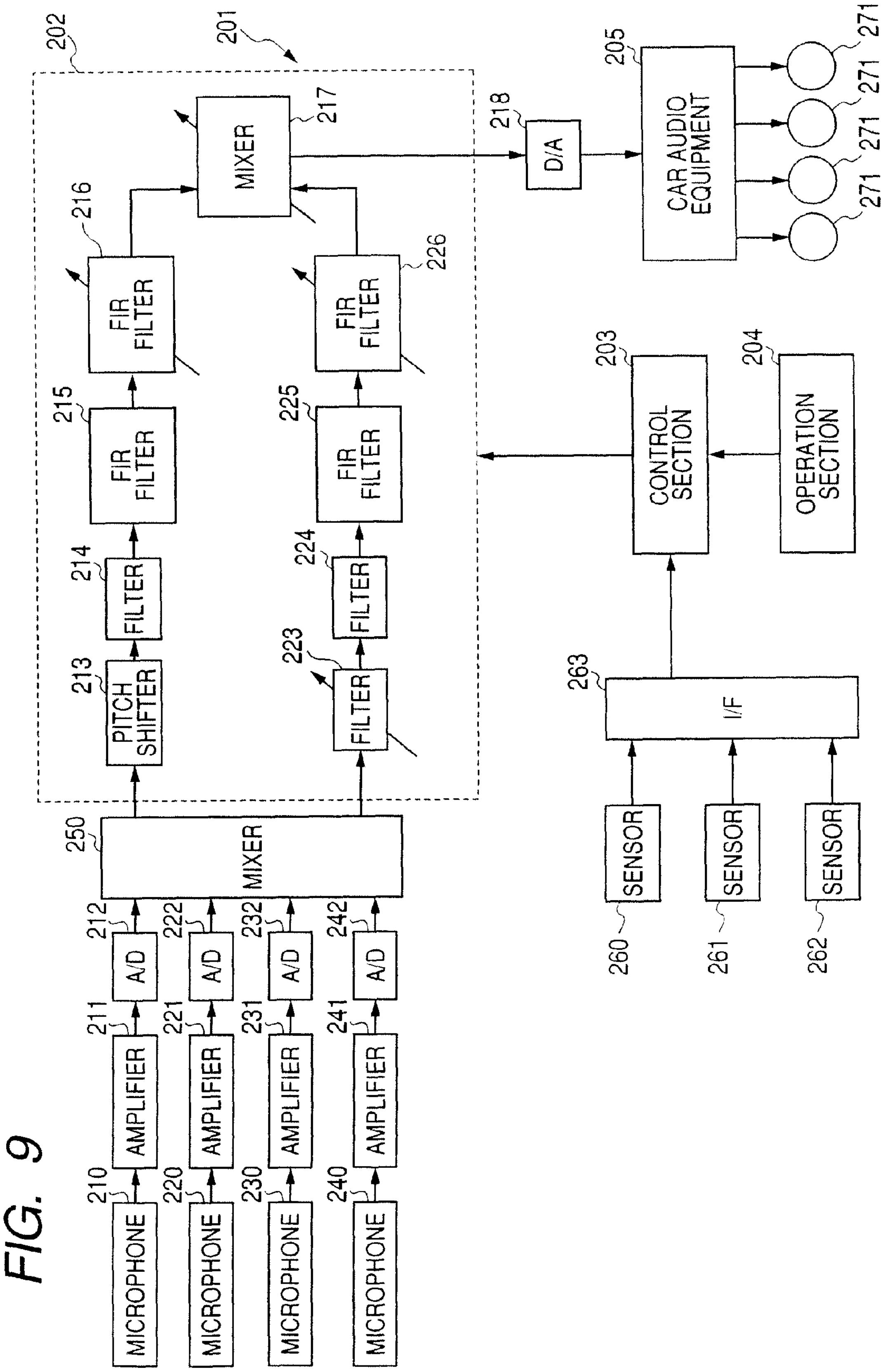
FIG. 9 is a block diagram of the engine sound processing system which is a second embodiment of the present invention.
Figure 10:
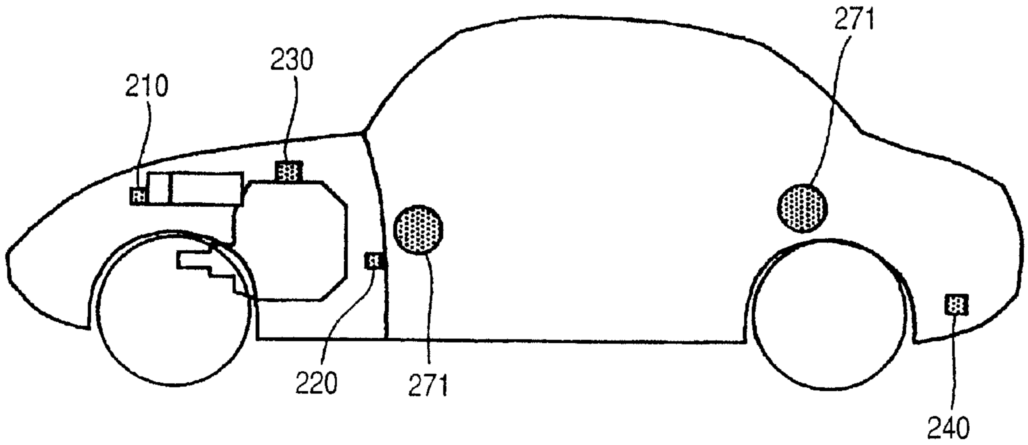
FIG. 10 is a view for describing a location where microphones and speakers of the engine sound processing system are to be mounted.

An engine sound processing system of a second embodiment of the present invention is described by reference to the drawings. FIG. 9 is a block diagram of the engine sound processing system. FIG. 10 is a view for describing locations where microphones and speakers of the engine sound processing system are to be mounted.

Figure 11:
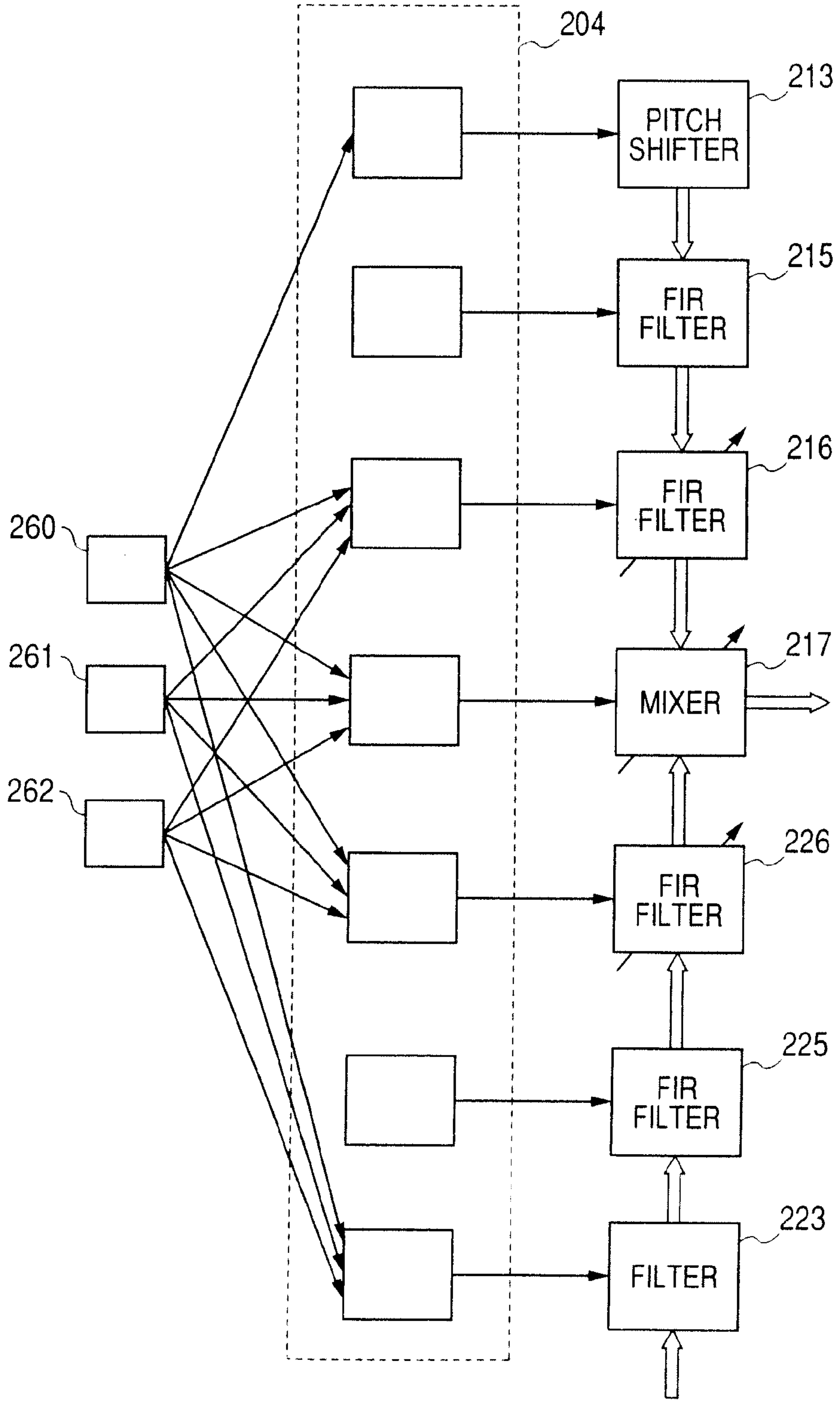
FIG. 11 is a view for describing a control system of the engine sound processing system.

As shown in FIG. 11, an engine sound processing system 1 comprises four microphones 210, 220, 230, and 240, and these microphones are attached to the inlet port of the engine, a vehicle-cabin-side wall surface of the engine room, an engine head, and the neighborhood of an exhaust vent (a muffler), respectively. The microphone 210 attached to the inlet port of the engine primarily picks up an engine intake sound. Further, the microphone 220 attached to the vehicle-cabin-side wall surface of the engine room primarily picks up an operating sound (hereinafter called an "engine explosion sound") such as engine explosion, engine rotation, and the like. The microphone 230 attached to the engine head primarily picks up a mechanical sound, such as the sound of a chain, or the like. Further, the microphone 240 attached to the neighborhood of the muffler picks up an exhaust sound. Now, mount locations of the microphones and the number of microphones are not limited to those described in connection with this embodiment.

The microphones attached to the respective locations can pick up different sounds according to locations where the microphones are attached. Accordingly, a plurality of microphones may additionally be provided in the respective mount locations, and sounds picked up by these microphones may also be mixed. For instance, a microphone attached to the vehicle-cabin-side wall surface of the engine room can pick up an operation sound of a different portion of the engine according to the mount position of the microphone. Consequently, a plurality of microphones may also be attached to the vehicle-cabin-side wall surface of the engine room, and sounds picked up by the microphones may also be mixed. All you have to do is to adjust a mixing ratio in accordance with required sound quality and pickup the sound of engine operation.

The microphone is not limited to an acoustic microphone. For instance, the microphone may also be a vibration microphone, or the like, for picking up; e.g., vibrations in an audible frequency range. Engine vibrations in the audible frequency range can be picked up directly (before transforming into a sound), so long as this vibration sensor is attached to the engine. Specifically, the vibration sensor does not detect a vibration pulse of the engine but picks up a signal acting as the sound source of the engine. Attaching the vibration sensor to the inlet port of the engine enables picking up of only a pure intake sound without picking up wind noise, or the like, irrelevant to the rotation of the engine. Meanwhile, an acoustic microphone is attached to the neighborhood of the muffler, to thus pick up an exhaust sound having a frequency peak responsive to the order of engine rotation. Further, when an exhaust sound is picked-up by means of the vibration sensor, the vibration sensor is attached to the neighborhood of the position where the muffler is mounted. As above, the essential requirement is to attach the acoustic microphone and the vibration sensor respectively according to locations where they are to be mounted.

Four speakers 271; namely, a front right speaker, a front left speaker, a rear right speaker, and a rear left speaker, are disposed in the cabin. These speakers 271 are for use with car audio equipment and are not unique to the engine sound processing system. Specifically, this engine sound processing system is arranged so as to pick up an engine sound and processes the picked-up sound; subsequently input a resultant audio signal to car audio equipment 205; and output the engine sound to the inside of the cabin by way of the car audio equipment 205.

In FIG. 9, the microphone 210 is connected to an amplifier 211; the microphone 220 is connected to an amplifier 221; the microphone 230 is connected to an amplifier 231; and the microphone 240 is connected to an amplifier 241. The amplifiers 211, 221, 231, and 241 amplify audio signals (pertaining to an intake sound, the engine explosion sound, a mechanical sound, and an exhaust sound) input by the respective microphones 210, 220, 230, and 240. The thus-amplified audio signals are converted into digital signals by means of A/D converters 212, 222, 232, and 242. The audio signals converted into the digital signals are input to a mixer 250.

The mixer 250 mixes four signals and subsequently outputs mixed signals respectively to a pitch shifter 213 and a filter 223 of a signal processing section 202 through two channels. The signal processing sections 202 subject the mixed two signals to signal processing through separate channels. The engine explosion sound and the exhaust sound picked up primarily by the microphones 220 and 240 are mixed so as to be input to the pitch shifter 231, and the intake sound and the mechanical sound picked up by the microphones 210 and 230 are mixed so as to be input to the filter 223. The mixing ratio may also be fixed previously or controlled by the control section 203.

The pitch shifter 213 pitch-shifts the input signal. A frequency to be pitch-shifted is controlled by the control section 203, and a characteristic of the frequency changes in real time according to driving conditions. The pitch shifter 213 of the present invention pitch-shifts the picked-up engine sound (primarily comprising the engine explosion sound and the exhaust sound), to thus change the characteristic of the engine sound to a characteristic of an engine sound of another format. For instance, provided that the engine is a four-cylinder engine, a frequency characteristic of the picked-up engine sound is pitch-shifted and processed into an engine sound having a frequency characteristic of an eight-cylinder engine. Processing is performed in such a way that a component of specific order responsive to the engine speed of the eight-cylinder engine is enhanced.

The filter 223 is an active filter for filtering an input signal. A filtering characteristic of the active filter is controlled by the control section 203 and changed in real time according to driving conditions. The filter 223 filters the picked-up engine sound (primarily comprising the intake sound and the mechanical sound), to thus change the characteristic of the engine sound to a characteristic of an engine of another format. For instance, provided that the engine is a four-cylinder engine, the engine sound is processed into an engine sound, such as that produced by an eight-cylinder engine. The essential requirement is to change a filtering characteristic such that a component of specific order responsive to the engine speed is enhanced and such that other frequency components are suppressed.

A frequency conversion ratio of the pitch shifter 213 and a filtering characteristic of the filter 223 are determined by means of the control section 203 reading a previously-specified processing table. Although the processing table is stored in built-in memory, or the like, of the control section 203, the table may also be stored in flash memory, or the like. The processing table will be described in detail later.

Unwanted frequency bands of the signals output from the pitch shifter 213 and the filter 223, which include hardly any intake sound or an engine explosion sound, are cut off by means of the filters 214 and 224. Further, when the levels of the signals are too high, the signals are attenuated by the filters. Therefore, the essential requirement is to create the respective filters 214 and 224 by combination of a low-pass filter, a high-pass filter, an attenuator, and other elements.

The signals whose frequency band and signal level have been limited by the filters 214 and 225 are input to filters 215 and 225.

The filters 215 and 225 are filters which simulate a sound insulation characteristic of the wall surface of the vehicle cabin. Specifically, since the microphones 210, 220, and 230 pick up a sound directly in the engine room, and the microphone 240 picks up a sound outside the vehicle and in the vicinity of the muffler. Therefore, the picked-up audio signal includes high-level noise of high tone, and a sound signal originating from such a sound differs materially from the engine sound heard by passengers, such as a driver and others, in the vehicle cabin. Therefore, in order to achieve sound quality (frequency distribution) analogous to that of the engine sound heard in the vehicle cabin, the filters 215 and 225 simulate a sound insulation characteristic of the wall surface of the vehicle cabin, to thus process the audio signals into a sound whose low frequencies are held intactly but high frequencies are cut off. This sound insulation characteristic does not necessarily simulate the sound insulation characteristic of an automobile equipped with this device. A sound insulation characteristic of a sports car or a sound insulation characteristic of a luxury car may also be simulated.

Filtering characteristics (sound insulation characteristics) of the filters 215 and 225 may also be fixed. However, it may also be possible to make settings changeable, to thus alter the frequency characteristic of the engine sound.

Filters 216 and 226 on a subsequent stage are active filters whose characteristics change in real time according to driving conditions; and process an engine sound (i.e., an intake sound, the engine explosion sound, a mechanical sound, and an exhaust sound) according to driving conditions. Changes in filtering characteristics of these filters will be described later.

A signal output from the filters 215 and 216 in two stages and a signal output from the filters 225 and 226 in two stages are mixed by a mixer 217 into an audio signal of one channel. The audio signal is then converted into an analogue audio signal by a D/A converter 218, and the audio signal is output to the car audio equipment 205. This audio signal of one channel includes a stereo output signal (L/R).

An engine speed sensor 260 for detecting an engine speed, an accelerator depression sensor 261 for detecting the degree of depression of an accelerator, and a vehicle speed sensor 262 for detecting the speed of a vehicle are provided in the engine sound processing system as sensors for detecting driving conditions. Detection values from the respective sensors are input to the control section 203 by way of an interface 263. The interface 263 is assumed to incorporate an A/D converter, as required. When the engine speed sensor 260 and the vehicle speed sensor 262 correspond to an encoder which outputs a pulse in accordance with the rotation of the engine or the rotation of an axle shaft, the control section 203 may also compute an engine speed and a vehicle speed from an integrated value of pulses or a pulse interval.

In response to outputs from the sensors, the control section 203 determines parameters used for determining a mixing ratio of the mixer 217, a pitch shift characteristic of the pitch shifter 213, and filtering characteristics of the filters 223, 216, and 226. The control section 203 outputs the thus-determined parameters and the mixing ratio to the signal processing section 202, thereby controlling the pitch shifter 213, the filter 223, the filters 216 and 226, and the mixer 217.

The control section 203 is connected to an operation section 204. The operation section 204 may be shared with the car audio equipment 205 or may also be arranged so as to receive an input of a signal from the operation section of the audio equipment. The user (driver) operates this operation section 204, thereby setting a control characteristic of the pitch shifter 213 and control characteristics of the filters 223, 216, and 226 according to the driving condition (outputs from the sensors 260, 261, and 262). Filtering characteristics (sound insulation characteristics) of the filters 215 and 225 are set by means of operation of this operation section 204.

Specifically, a control system of this engine sound processing system is illustrated as shown in FIG. 11. By means of setting operation of the operation section 204, there are set the control characteristic of the pitch shifter 213, the control characteristics of the filters 223, 215, 225, 216, and 226, and the control characteristic of the mixer 217. Of these control characteristics, the characteristic of the pitch shifter 213, the control characteristics of the filters 223, 216, and 226, and the characteristic of the mixer 217 are controlled in real time in accordance with outputs from the sensors 260, 261, and 262.

In relation to setting of the pitch shift characteristic, the filtering characteristics, and the mixing ratio performed by means of the operation section 204, one or a plurality of parameters may also be set in advance respectively in the pitch shifter 213, the filters, and the mixer 217 through manual operation. One or a plurality of parameter sets may also be stored in advance in the control section 203, and any of the parameter sets may also be selected and set. When the plurality of parameter sets are prepared, it is better to previously set; for example, a parameter set for producing an engine sound effect as is yielded by an eight-cylinder engine, a parameter set for producing an engine sound effect as is yielded by a 12-cylinder engine, and other parameter sets; and to enable switching of a mode between a eight-cylinder engine mode and a 12-cylinder engine mode. Moreover, it may also be possible to enable switching, in the eight-cylinder engine mode, of a parameter set among a parameter set for a sports car mode, a parameter set for a cruising mode, and other parameter sets. Naturally, it is also possible to deactivate the function of this engine sound processing system so as not to produce an engine sound effect.

Flash memory or a connector of a ROM pack may also be provided in advance, and a parameter set may also be supplied from the flash memory or the ROM. Moreover, the parameter set may also be supplied from a hard disk drive of a car navigation system. Alternatively, it may also be possible to download the parameter set from the Internet. Furthermore, the engine sound processing system may also be provided with a LAN connector, or a like connector, in advance, to thus enable supply of a parameter set or manual setting of parameters from a connected computer (a notebook computer) by way of this connector.

The configuration of the signal processing section 2 is not limited to that described in connection with the above embodiment. For instance, the signal processing section may also be formed so as to include only one channel consisting of the pitch shifter 213 and the FIR filters 215 and 216. An engine sound heard by the driver, or other persons, can be processed into an engine sound of another type, so long as the engine sound is pitch-shifted through the single channel consisting of the pitch shifter 213 and the FIR filters 215 and 216. The filter 214 (or the filter 224) and the FIR filter 216 (or the FIR filter 226) are not constituent elements indispensable for the present invention. The signal processing section may also be made up of the pitch shifter 213 and the FIR filter 215. Alternatively, the sequence of connection of the filters may also be changed.

An example pitch characteristic will now be described by reference to FIGS. 12 and 13.

Figure 12:
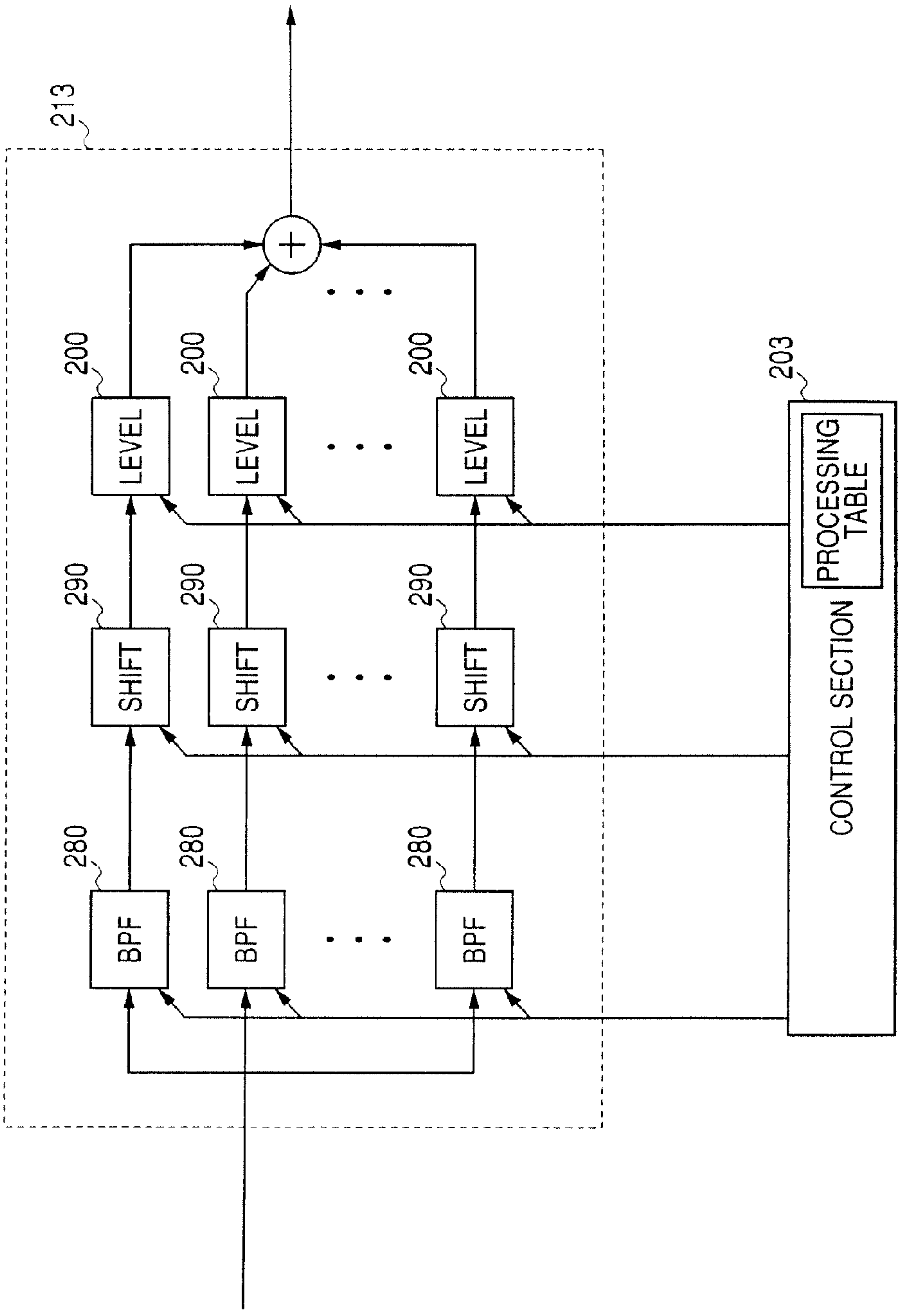
FIG. 12 is a view for describing in detail a pitch shifter of the engine sound processing system.

FIG. 12 is a view for describing in detail the pitch shifter 213 of the engine sound processing system. As illustrated, the engine sound input to the pitch shifter 213 is input to a plurality of band-pass filters (hereinafter abbreviated as "BPF") 280, where a frequency band having peaks of a predetermined level or more is extracted. The control section 203 controls a passband of each of the BPFs 280. The control section 203 sets passbands of the BPFs 280 in real time in accordance with an engine speed, which is a value detected by the engine speed sensor 260, in such a way that signals pass through frequency bands corresponding to first-order rotation, second-order rotation, . . . .

Not all peaks of high-order rotation do not need to be extracted. The engine sound heard by the driver, or other passengers, can be processed essentially to an engine sound of another format, so long as principal peaks of low order are extracted and pitch-shifted. It is essential only that one or plural peaks be extracted. Alternatively, a plurality of peaks may also be extracted collectively. For instance, when the engine sound has a peak at 100 Hz and another peak at 200 Hz, settings may also be made such that frequency bands including these peaks are collectively extracted by the single BPF 280.

The engine sounds split by the BPFs 280 into frequency bands corresponding to first-order rotation, second-order rotation, . . . , of the engine speed are input to shift processing sections 290 connected to the respective BPFs 280. The shift processing sections 290 pitch-shift the input engine sounds to predetermined frequencies. Levels of the thus-pitch-shifted engine sounds are changed by level adjustment sections 200, and the thus-changed engine sounds are synthesized and output as a signal of one channel.

The shift processing sections 290 and the level adjustment sections 200 are controlled by the control section 203. The control section 203 sets a pitch shift ratio (a frequency transformation ratio) of the shift processing sections 290 and a level change ratio of the level adjustment sections 200, by reference to the engine speed, which is a value detected by the engine speed sensor 260, and the processing table. The processing table defines engine speeds and corresponding components of orders arising at the engine speeds.

In FIG. 12, the pitch shifter 213 has the plurality of channels, each of which consists of the BPF 280, the shift processing section 290, and the level adjustment section 200. The embodiment where a plurality of peaks are extracted is provided. However, when a peak to be extracted is single or when a plurality of peaks are extracted collectively as a single frequency band, the pitch shift 213 may also include only one channel consisting of one BPF 280, one shift processing section 290, and one level adjustment section 200.

The processing table will now be described by reference to FIGS. 13A to 13D.

Figure 13A:
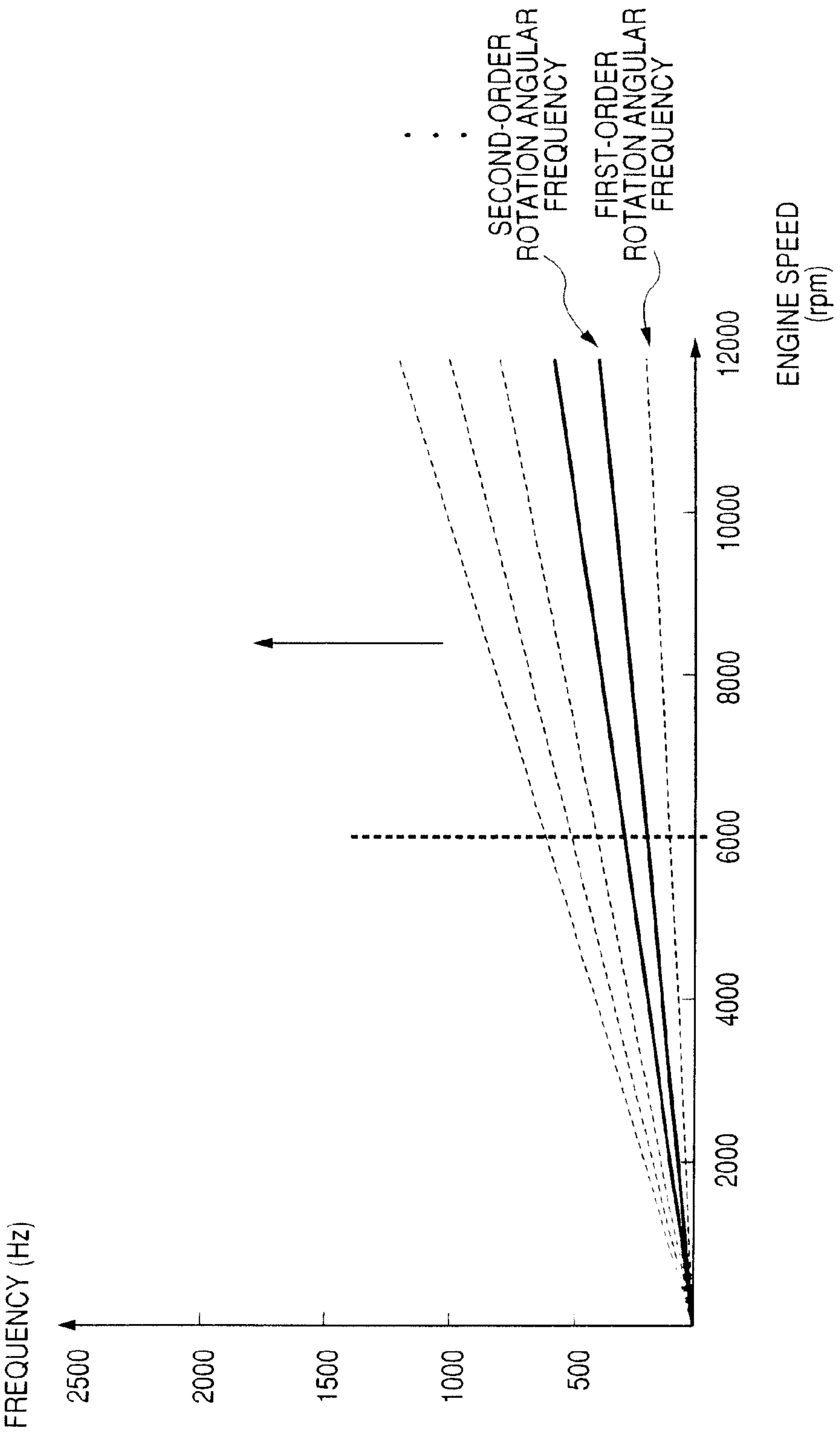
FIG. 13A is a first view for describing a pitch shift characteristic of the engine sound processing system.
Figure 13B:
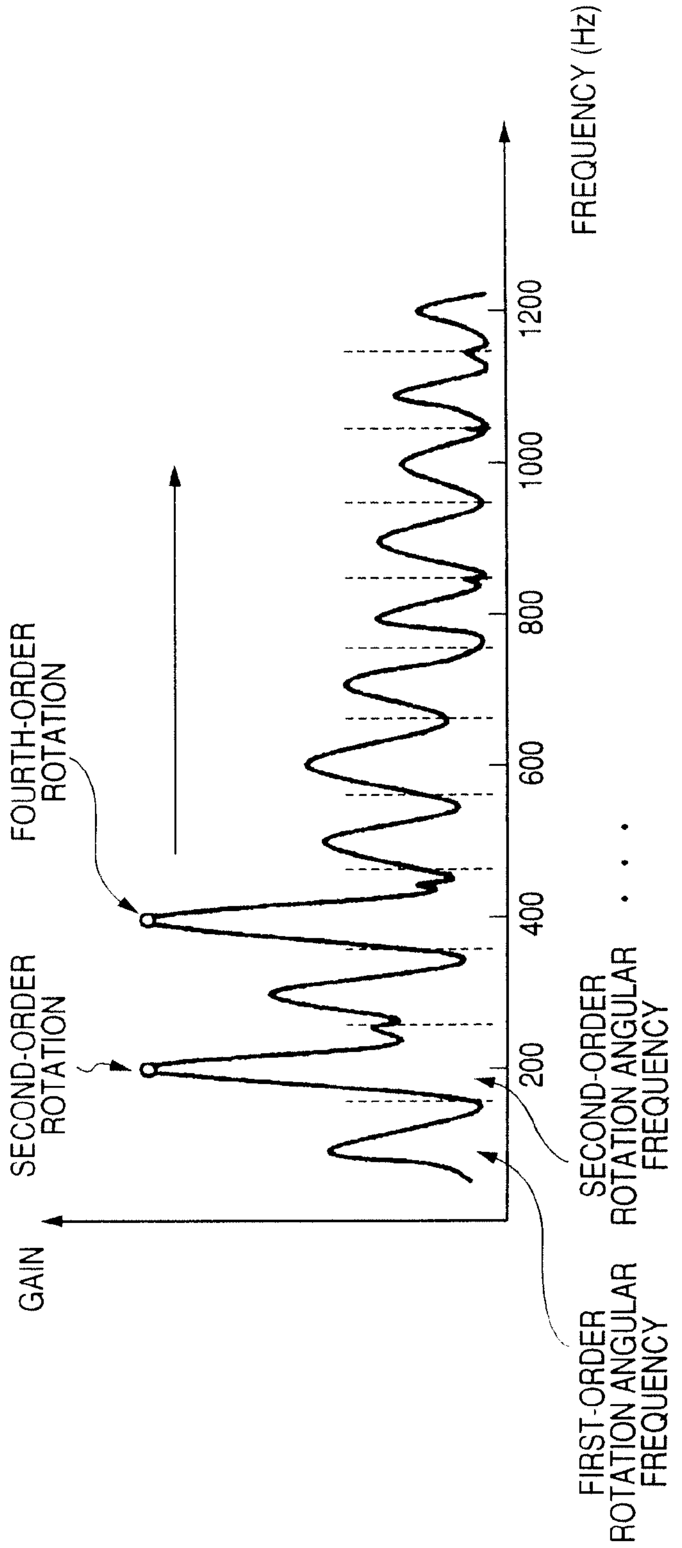
FIG. 13B is a second view for describing a pitch shift characteristic of the engine sound processing system.
Figure 13C:
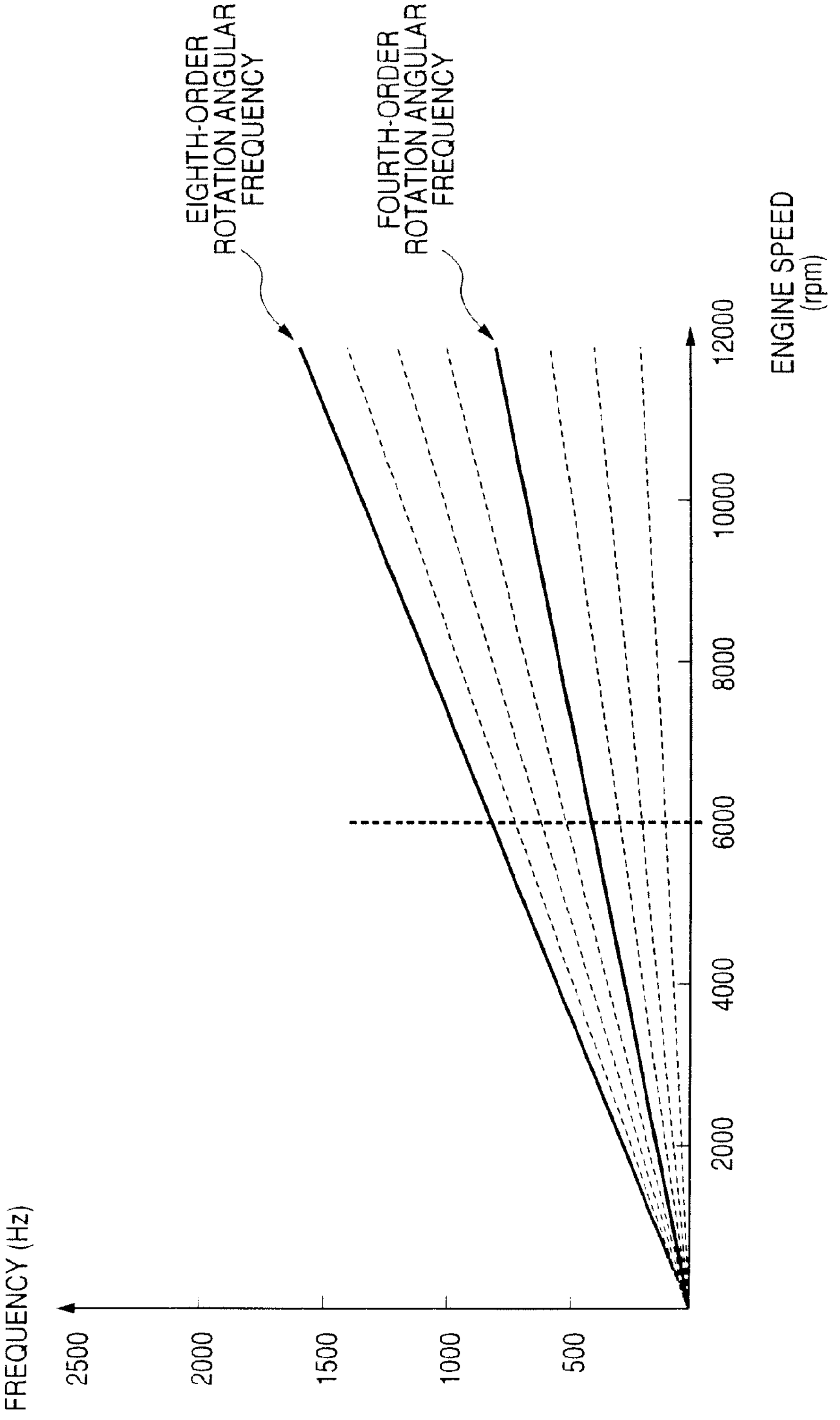
FIG. 13C is a third view for describing a pitch shift characteristic of the engine sound processing system.
Figure 13D:
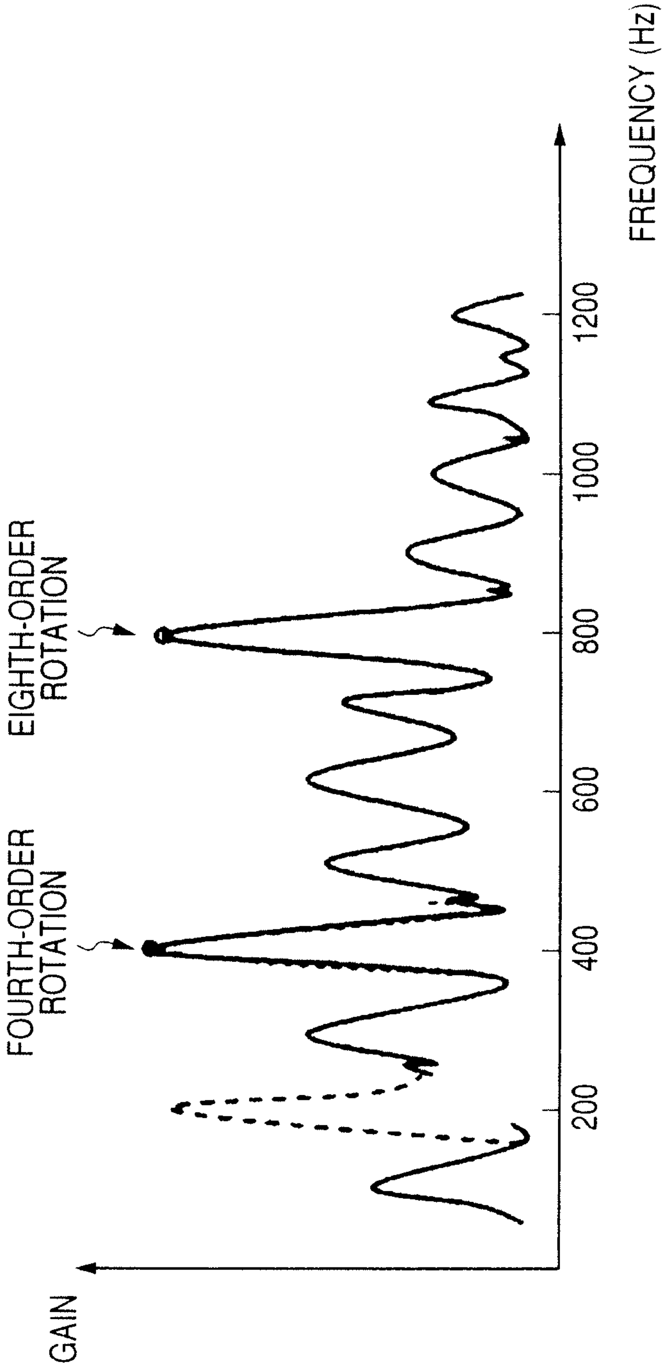
FIG. 13D is a fourth view for describing a pitch shift characteristic of the engine sound processing system.

The horizontal axis of each of the graphs shown in FIGS. 13A and 13C represents an engine speed read from the engine speed sensor 260, and the vertical axis of the same represents a frequency. The horizontal axis of each of the graphs shown in FIGS. 13B and 13D represents a frequency, and the vertical axis of the same represents a gain. The graphs shown in these drawings show an example frequency characteristic of a picked-up engine sound. In this embodiment, an engine sound of a four-cylinder engine is assumed to be picked up.

FIG. 13A is a graph showing a relationship between an engine speed and a frequency in relation to a peak of the picked-up engine sound. As shown in FIG. 13A, the engine sound of the four-cylinder engine has peaks of predetermined level or more in any of components of integral multiples (first-order rotation, second-order rotation, third-order rotation, . . . ) of orders of engine rotation. In this embodiment, a peak of predetermined level or more appears in second-order rotation and fourth-order rotation. The peaks will be described in detail in FIG. 13B. FIG. 13B is a graph showing a frequency characteristic of the engine sound picked up when the engine speed is 6000 rpm. Thus, when the engine speed is 6000 rpm, a high-level peak appears in a frequency of 200 Hz corresponding to second-order rotation and a frequency of 400 Hz corresponding to fourth-order rotation. Although, in this embodiment a component of second-order rotation and a component of fourth-order rotation have arisen as high-level peaks, a component of order which arises varies from one engine to another.

As shown in FIG. 13A, the processing table defines a peak of an order of rotation (a frequency) in each engine (e.g., a four-cylinder engine, an eight-cylinder engine, or the like) in accordance with an engine speed. Namely, the processing table is formed from tables relating to a plurality of components of orders of engine rotation, such as a four-cylinder engine table, an eight-cylinder engine table, and other engine tables. Components of orders are assigned to respective engine tables in advance. The control section 3 reads an engine speed read by the engine speed sensor 260 and a component of order (a frequency) corresponding to the engine speed from the respective engine tables, thereby setting a frequency transformation ratio of the shift processing sections 290. Further, the amount of change in the level of the level adjustment sections 200 is also set. The engine tables may also be assigned in ascending sequence of orders of rotation from a lower order of rotation to a higher order of rotation. Alternatively, an assignment-only table may be provided separately, and the control section 203 may read the table.

FIG. 13C is a graph showing peaks which appear when the picked-up engine sound is pitch-shifted. FIG. 13D is a graph showing a frequency characteristic achieved when the engine sound picked up at an engine speed of 6000 rpm is pitch-shifted. As mentioned above, the pitch shifter 213 pitch-shifts, among the picked-up engine sounds, a second-order component of rotation of a four-cylinder engine and a component of second-order rotation of the four-cylinder engine to a component of fourth-order rotation of an eight-cylinder engine and a component of eighth-order rotation of the eight-cylinder engine. As a result of pitch shift processing, the engine sound exhibits a frequency characteristic such as that shown in FIG. 13D, and the component of fourth-order rotation of the eight-cylinder engine (around a frequency of 400 Hz) and the component of eighth-order rotation of the eight-cylinder engine (around a frequency of 800 Hz) appear as high-level peaks.

Although this embodiment shows the pitch shift of the component of second-order rotation and the pitch shift of the component fourth-order rotation, the present invention is, no doubt, not limited to this embodiment. Various processing tables may be defined in advance in accordance with the model of the engine of an automobile equipped with this engine sound processing system and the model of the engine whose engine sound is a target.

Although the above descriptions have mentioned the example where the components of orders defined in the processing table are pitch-shifted. However, any one of the components may also be pitch-shifted. It may also be possible to pitch shift only the component of the highest level or the highest-frequency component.

When the engine speed is a low speed, the picked-up engine sound may also be output intactly without being pitch-shifted. When the engine speed has reached a predetermined speed (e.g., 5000 rpm, or the like), the picked-up engine sound is pitch-shifted, to thus yield an engine sound effect of a multi-cylinder engine.

Pitch shift processing is not limited to this embodiment. A frequency spectrum may be determined by means of subjecting an engine sound to FFT (Fast Fourier Transform), and a frequency having a peak of predetermined level or more may also be subjected to frequency shift while the geometry of the peak is maintained intactly.

As mentioned above, parameter sets relating to control of these characteristics can be changed in accordance with the user's operation. It is better to set a parameter set for yielding an engine sound effect as is yielded by an eight-cylinder engine, a parameter set for yielding an engine sound effect as is yielded by a 12-cylinder engine, and other parameter sets, to thus enable a driver, or other persons, to make a change. In this case, an eight-cylinder engine table, a 12-cylinder engine table, and the like, are defined in advance as the table.

Next will be described a filtering characteristic of the filter 223. Primarily the signal of the intake sound and the signal of the mechanical sound, which have been picked up by the microphones 210 and 230, are input from the mixer 250 to the filter 223. The filter 223 also processes the signals into an engine sound of another format in conformance with the processing table. Specifically, as in the case of the previously-described pitch shifter 213, when the picked-up engine sound is processed to an engine sound of the eight-cylinder engine, a filtering characteristic is changed in real time such that a component of order (a frequency) of the eight-cylinder engine is enhanced, thereby suppressing a component of another order. The control section 203 sets a frequency to be enhanced, in accordance with the engine speed, which is a value detected by the engine speed sensor 260, and the processing table.

The peak of the intake sound picked up by the microphone 210 and the peak of the mechanical sound picked up by the microphone 230 are attributable to the number of cylinders of the engine in smaller proportion than are the peak of the engine explosion sound picked up by the microphone 220 and the peak of the exhaust sound picked up by the microphone 240. Consequently, the filter 223 does not extremely suppress the peak of a picked-up engine sound.

Figure 14A:
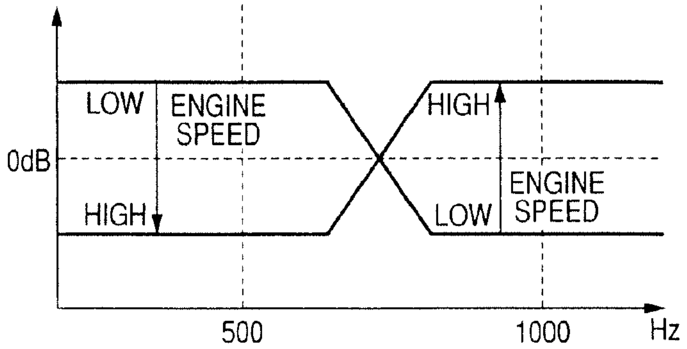
FIG. 14A is a first view for describing a filtering characteristic responsive to a sensor output in the engine sound processing system.
Figure 14B:
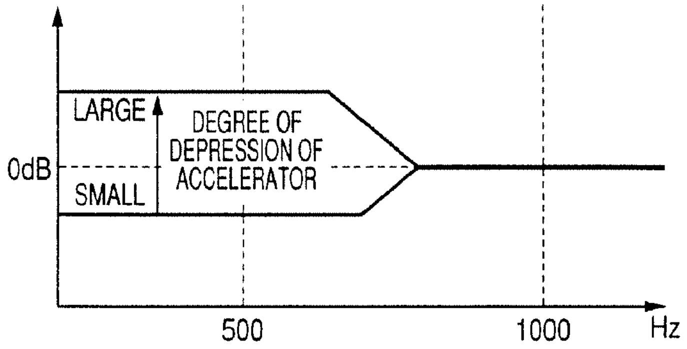
FIG. 14B is a second view for describing a filtering characteristic responsive to the sensor output in the engine sound processing system.
Figure 14C:
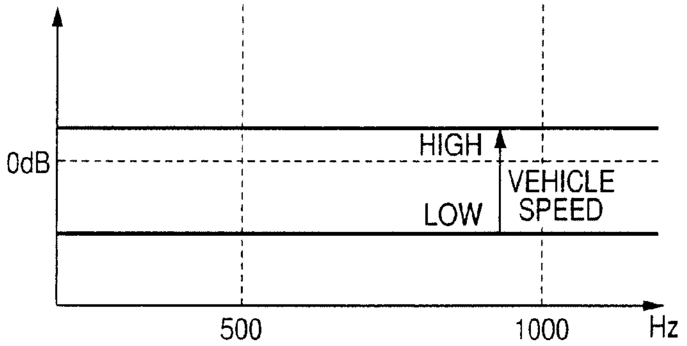
FIG. 14C is a third view for describing a filtering characteristic responsive to the sensor output in the engine sound processing system.

Example control of a characteristic of the filter 216 and example control of a characteristic of the filter 226 will now be described by reference to FIGS. 14A to 14D. Each of horizontal axes of graphs shown in FIGS. 14A to 14C represents a frequency, and each of vertical axes of the graphs represents a frequency gain of the filter. The frequency gain of the filter shown in the drawings has the following features.

FIG. 14A shows a filter control characteristic of the intake sound and a filter control characteristic of the engine explosion sound determined from an engine speed, and the characteristics are based on the following rules.

(a) When an engine speed is low, a low tone is enhanced, and a high tone is suppressed.

(b) When the engine speed is high, the low tone is suppressed, and the high tone is enhanced.

FIG. 14B shows a filter control characteristic of an intake sound determined from the degree of depression of an accelerator. The characteristics are based on the following rules.

(c) When the degree of depression of an accelerator is small, an intake sound of low tone is suppressed.

(d) When the degree of depression is great, a low tone of intake sound is enhanced.

FIG. 14C shows a control characteristic of the entire sound volume level determined from a vehicle speed, and the characteristic is based on the following rules.

(e) When a vehicle speed is low, the entire sound volume is reduced.

(f) When the vehicle speed is high, the entire sound volume is increased.

Figure 14D:
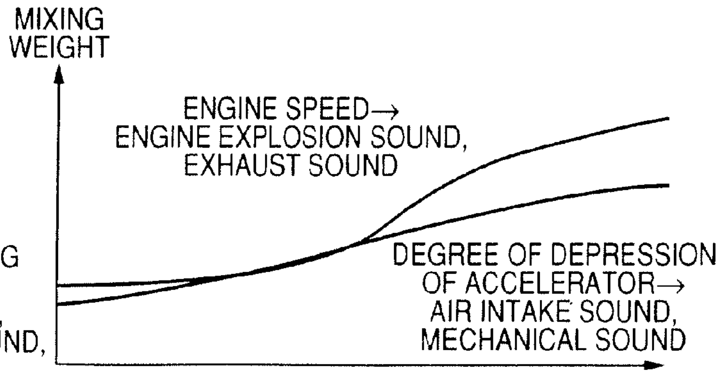
FIG. 14D is a fourth view for describing a filtering characteristic responsive to the sensor output in the engine sound processing system.

The horizontal axis of a graph shown in FIG. 14D represents the degree of depression of an accelerator and an engine speed, and the vertical axis of the same represents a mixing weight. FIG. 14D shows characteristics, which are determined from the degree of depression of an accelerator and an engine speed of control, of a mixing weight among an intake sound, a mechanical sound, an engine explosion sound, and an exhaust sound. The control characteristics are based on the following rules.

(g) Mixing weights of the intake sound and the mechanical sound are increased as the degree of depression of an accelerator increases.

(h) Mixing weights of the engine explosion sound and the exhaust sound are increased as the engine speed increases.

The mixing ratio is determined by a ratio of the mixing weights of the intake sound and the mechanical sound to the mixing weights of the engine explosion sound and the exhaust sound. The above rules are based on an objective of "When the engine speed is low, a low tone is enhanced in order to produce an atmosphere of the engine of large displacement. However, when the engine speed is high, enhancement of a high tone and an increase in mixing weights of the engine explosion sound and the exhaust sound are achieved in order to enhance high-speed rotation of the engine. When the degree of depression of an accelerator is large, load is imposed on the engine. Hence, the intake sound is increased, and the mixing weights of the intake sound and the mechanical sound are increased. When the vehicle velocity is high, noise other than the engine sound, such as wind noise, tire noise, or the like, becomes greater. Therefore, the overall sound volume is increased." The rules are equivalent to rules for the sports car mode. The rules for the sports car mode are for further enhancing an actual engine sound according to driving conditions achieved at that time.

Although the essential requirement is to determine, from the frequency distribution of the engine sound, the low-tone center frequency and the high-tone center frequency, the low-tone center frequency usually lies in the neighborhood of 500 Hz, and the high-tone center frequency usually lies in the neighborhood of 1000 Hz.

In order to accurately reflect the above rules on the filtering characteristic, it may also be possible to prepare in advance; for example, a function adopting sensor outputs as variables, and to input a sensor output to this function, to thus determine a characteristic. Alternatively, the characteristic may be determined by means of Fuzzy inference. Moreover, a table for use in determining a filtering characteristic may also be determined beforehand in each predetermined step of each sensor output, the table is searched by means of the sensor output, to thus read a corresponding filtering characteristic. In any event, a parameter set which is to be set by the user is assumed to include information for use in determining a filter transformation characteristic from the sensor output.

As mentioned above, in the engine sound processing system of this embodiment of the present invention, actual engine sounds are picked up by means of the microphones disposed outside the vehicle cabin, and specific frequency components are processed in an enhanced manner, so that an engine sound of different format can be output to the inside of the vehicle cabin. Hence, a real engine sound effective having light, clear sound quality, such as that yielded by a multi-cylinder engine, can be yielded through simple processing. A vehicle cabin space pleasant for the motoring enthusiast can be created.

[Third Embodiment]

Figure 15:
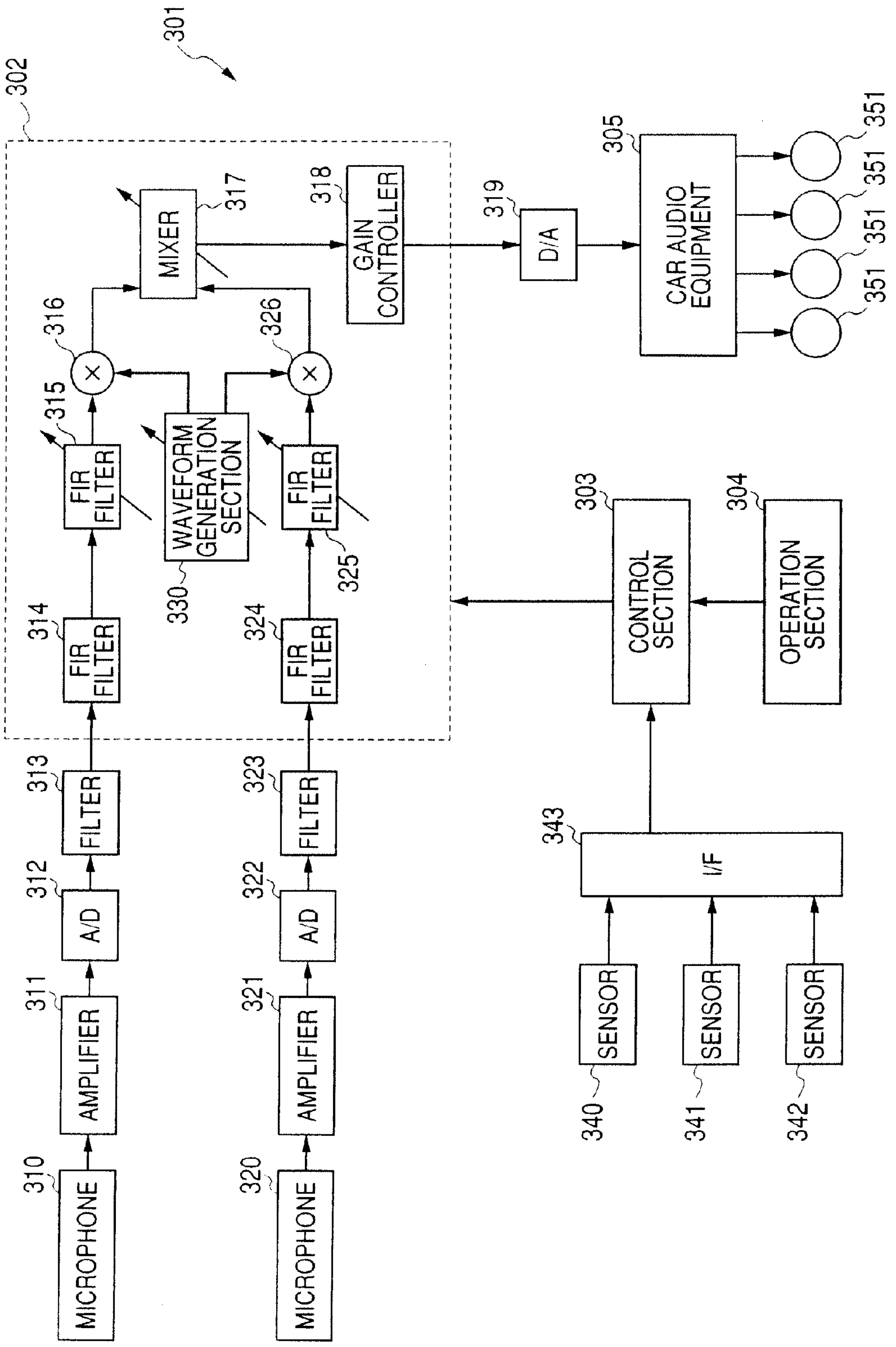
FIG. 15 is a block diagram of the engine sound processing system which is a third embodiment of the present invention.
Figure 16:
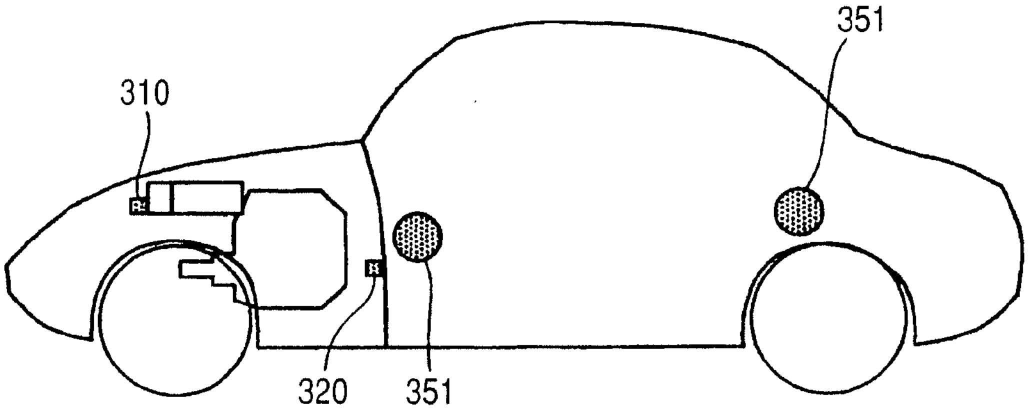
FIG. 16 is a view for describing a location where microphones and speakers of the engine sound processing system are to be mounted.

An engine sound processing system of this embodiment of the present invention is described by reference to the drawings. FIG. 15 is a block diagram of the engine sound processing system. FIG. 16 is a view for describing locations where microphones and speakers of the engine sound processing system are to be mounted.

Figure 17:
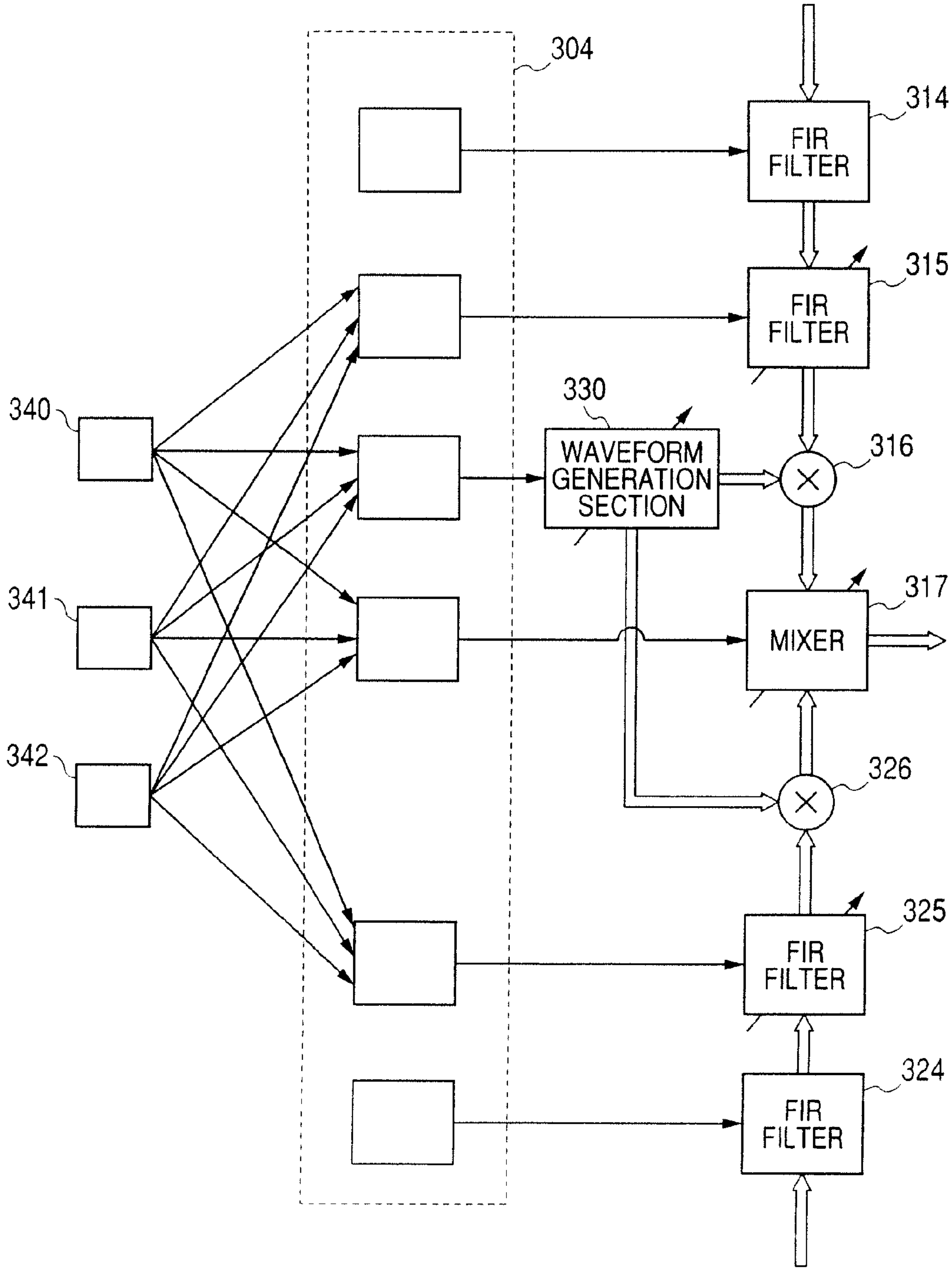
FIG. 17 is a view for describing a control system of the engine sound processing system.

As shown in FIG. 17, the engine sound processing system 1 comprises two microphones 310 and 320, and these microphones are attached to the inlet port of the engine and the vehicle-cabin-side wall surface of the engine room, respectively. The microphone 310 attached to the inlet port of the engine primarily picks up an engine intake sound. Further, the microphone 320 mounted on the vehicle-cabin-side wall surface of the engine room picks up an operating sound (hereinafter called an "engine explosion sound") such as engine explosion, engine rotation, and the like. Mount locations of the microphones and the number of microphones are not limited to those described in connection with this embodiment. For instance, a microphone may also be attached to a neighborhood of a muffler, to thus pick up an exhaust sound. Alternatively, the microphone may also be attached to a neighborhood of the engine head, to thus pick up a mechanical sound such as the sound of a chain, or the like.

The microphones attached to the respective locations can pick up different sounds according to locations where the microphones are attached. Accordingly, a plurality of microphones may additionally be provided in the respective mount locations, and sounds picked up by these microphones may also be mixed. For instance, a microphone attached to the vehicle-cabin-side wall surface of the engine room can pick up an operation sound of a different portion of the engine according to the mount position of the microphone. Consequently, a plurality of microphones may also be attached to the vehicle-cabin-side wall surface of the engine room, and sounds picked up by the microphones may also be mixed. The essential requirement is to adjust a mixing ratio in accordance with required sound quality and pickup the sound of engine operation.

The microphone is not limited to an acoustic microphone. For instance, the microphone may also be a vibration microphone, or the like, for picking up; e.g., vibrations in an audible frequency range. Engine vibrations in the audible frequency range can be picked up directly (before transforming into a sound), so long as this vibration sensor is attached to the engine. Specifically, the vibration sensor does not detect a vibration pulse of the engine but picks up a signal acting as the sound source of the engine. Attaching the vibration sensor to the inlet port of the engine enables picking up of only a pure intake sound without picking up wind noise, or the like, irrelevant to the rotation of the engine. Meanwhile, an acoustic microphone is attached to the neighborhood of the muffler, to thus pick up an exhaust sound having a frequency peak responsive to the order of engine rotation. Further, when an exhaust sound is picked-up by means of the vibration sensor, the vibration sensor is attached to the neighborhood of the position where the muffler is mounted. As above, the essential requirement is to attach the acoustic microphone and the vibration sensor respectively according to locations where they are to be mounted.

Four speakers 351; namely, a front right speaker, a front left speaker, a rear right speaker, and a rear left speaker, are disposed in the cabin. These speakers 351 are for use with car audio equipment and are not unique to the engine sound processing system. Specifically, this engine sound processing system is arranged so as to pick up an engine sound and processes the picked-up sound; subsequently input a resultant audio signal to car audio equipment 305; and output the engine sound to the inside of the cabin by way of the car audio equipment 305.

In FIG. 15, the microphone 310 is connected to an amplifier 311, and the microphone 320 is connected to an amplifier 321. The amplifiers 311 and 321 amplify audio signals (pertaining to an intake sound and an engine explosion sound) input by the respective microphones 310 and 320. The thus-amplified audio signals are converted into digital signals by means of the A/D converters 312 and 322. Unwanted frequency bands of the audio signals converted into digital signals, which include hardly any intake sound or engine explosion sound, are cut off by means of the filters 313 and 323. Further, when the levels of the signals are too high, the signals are attenuated by the filters. Therefore, the essential requirement is to create the respective filters 313 and 323 by combination of a low-pass filter, a high-pass filter, an attenuator, and other elements.

The signals whose frequency bands and signal levels have been limited by the filters 313 and 323 are input to the signal processing section 302. The signal processing section 302 subjects the intake sound picked up by the microphone 310 and the engine explosion sound picked up by the microphone 320 to signal processing through respectively-separate channels. Signal processing may also be performed through a single channel after the signals have been mixed.

In the signal processing section 302, the filter 314 and the filter 324 are filters which simulate a sound insulation characteristic of the wall surface of the vehicle cabin. Specifically, since the microphones 310 and 320 pick up a sound directly in the engine room, the picked-up audio signal includes high-level mechanical noise of high tone, and a sound signal originating from such a sound differs materially from the engine sound heard by passengers, such as a driver and others, in the vehicle cabin. Therefore, in order to achieve sound quality (frequency distribution) analogous to that of the engine sound heard in the vehicle cabin, the filters 314 and 324 simulate a sound insulation characteristic of the wall surface of the vehicle cabin, to thus process the audio signals into a sound whose low frequencies are held intactly but high frequencies are cut off. This sound insulation characteristic does not necessarily simulate the sound insulation characteristic of an automobile equipped with this device. A sound insulation characteristic of a sports car or a sound insulation characteristic of a luxury car may also be simulated.

Filtering characteristics (sound insulation characteristics) of the filters 314 and 324 may also be fixed. However, it may also be possible to make settings changeable, to thus alter the frequency characteristic of the engine sound.

Filters 315 and 325 on a subsequent stage are active filters whose characteristics change in real time according to driving conditions; and process an engine sound (i.e., an intake sound and the engine explosion sound picked up by the microphones 310 and 320) according to driving conditions. Consequently, the filters 315 and 524 are filters whose characteristics change in real time according to driving conditions. Changes in filtering characteristics of these filters will be described later.

An intake sound output from the filters 314 and 315 in two stages is combined with (or multiplied by) a signal output from the waveform generation section 330 by means of the multiplier 316. An engine explosion sound output from the filters 324 and 325 in two stages is combined with (or multiplied by) the signal output from the waveform generation section 330 by means of a multiplier 326. A signal output from a waveform generation section 330 is one whose amplitude has been modulated at a predetermined period, and a waveform parameter of this signal is determined by the control section 303. The waveform generation section 330 can output different signals to the respective multipliers 316 and 326. A signal output from the waveform generation section 330 is combined with the intake sound and the engine explosion sound, thereby imparting modulation to respective sounds. Details of modulation will be described later. Subsequently, the intake sound and the engine explosion sound are mixed into an audio signal of single channel by means of a mixer 317. A gain controller 318 controls the level of the audio signal. The audio signal is then converted into an analogue audio signal by a D/A converter 319, and the audio signal is output to the car audio equipment 305. This audio signal of one channel includes a stereo output signal (L/R).

A multiplier may also be connected subsequently to the mixer 317, thereby mixing a result of multiplication into a signal of one channel. The signal may also be combined with a signal output from the waveform generation section 330. Even when the engine sound generated after mixing the air intake sound and the engine explosion sound is combined with the signal output from the waveform generation section 330, modulation can be added to the entire engine sound.

An engine speed sensor 340 for detecting an engine speed, an accelerator depression sensor 341 for detecting the degree of depression of an accelerator, and a vehicle speed sensor 342 for detecting the speed of a vehicle are provided in the engine sound processing system as sensors for detecting driving conditions. Detection values from the respective sensors are input to the control section 303 by way of an interface 343. The interface 343 is assumed to incorporate an ND converter, as required. When the engine speed sensor 340 and the vehicle speed sensor 342 correspond to an encoder which outputs a pulse in accordance with the rotation of the engine or the rotation of an axle shaft, the control section 303 may also compute an engine speed and a vehicle speed from an integrated value of pulses or a pulse interval. Moreover, an ignition pulse may also be detected, to thus compute an engine speed. An engine speed can also be detected without a measurement time lag by means of computing an engine speed from the ignition pulse.

In response to outputs from the sensors, the control section 303 determines the filtering characteristics of the filters 315 and 325, the waveform parameter of the waveform generation section 330, and the mixing ratio of the mixer 317. The control section 303 outputs the thus-determined filtering characteristics, the waveform parameter, and the mixing ratio to the signal processing section 302, thereby controlling the filters 315 and 325, the waveform generation section 330, and the mixer 217.

The control section 303 is connected to an operation section 304. The operation section 304 may also be shared with the car audio equipment 305 or may also be arranged so as to receive an input of a signal from the operation section of the audio equipment. The user (driver) operates this operation section 304, to thus set control characteristics of the filters 315 and 325, a control characteristic of the waveform generation section 330, and a control characteristic of the mixer 317 corresponding to the driving conditions (outputs from the engine speed sensor 304, the accelerator depression sensor, and the vehicle speed sensor 342).

Specifically, a control system of this engine sound processing system is illustrated as shown in FIG. 17. By means of setting operation of the operation section 304, the control characteristics of the filters 314, 324, 315, and 325, the control characteristic of the waveform generation section 330, and the control characteristic of the mixer 317 are set. Of these control characteristics, the characteristic of the filters 315 and 325, the characteristic of the waveform generation section 330, and the characteristic of the mixer 317 are controlled in real time in accordance with outputs from the engine speed sensor 340, the accelerator depression sensor 341, and the vehicle speed sensor 342.

In relation to setting of the filtering characteristics, the waveform parameter, and the mixing ratio performed by means of the operation section 304, one or a plurality of parameters may also be set with respect to each of the constituent sections through manual operation. One or a plurality of parameter sets may also be stored in advance in the control section 303, and any of the parameter sets may also be selected and set. When the plurality of parameter sets are prepared, it is better to previously set; for example, a harsh engine sound parameter set, a smooth engine sound parameter set, and other parameter sets; and to enable switching of a mode between the harsh engine sound parameter set and the smooth engine sound parameter set. Naturally, it is also possible to deactivate the function of this engine sound processing system so as not to produce an engine sound effect.

Flash memory or a connector of a ROM pack may also be provided in advance, and a parameter set may also be supplied from the flash memory or the ROM. Moreover, the parameter set may also be supplied from a hard disk drive of a car navigation system. Alternatively, it may also be possible to download the parameter set from the Internet. Furthermore, the engine sound processing system may also be provided with a LAN connector, or a like connector, in advance, to thus enable supply of a parameter set or manual setting of parameters from a connected computer (a notebook computer) by way of this connector.

The configuration of the signal processing section 302 is not limited to that described in connection with this embodiment. As mentioned above, after the signals from the microphones 310 and 320 have been mixed at a stage before the signal processing section 302, the thus-mixed signal may also be subjected to signal processing through one channel. Moreover, when a plurality of microphones are additionally disposed in order to pick up an exhaust sound, a mechanical sound, and other sounds, signals from the microphones may also be processed individually or processed through one channel or two channels after having been mixed.

The filter 314 (or the filter 324) and the filter 315 (or the filter 325) are not constituent elements which are indispensable for the present invention. There may also be adopted a configuration consisting of the waveform generation section 330 and the multiplier 316 (the multiplier 326). The filters may also be switched in terms of connection sequence.

Figure 18:
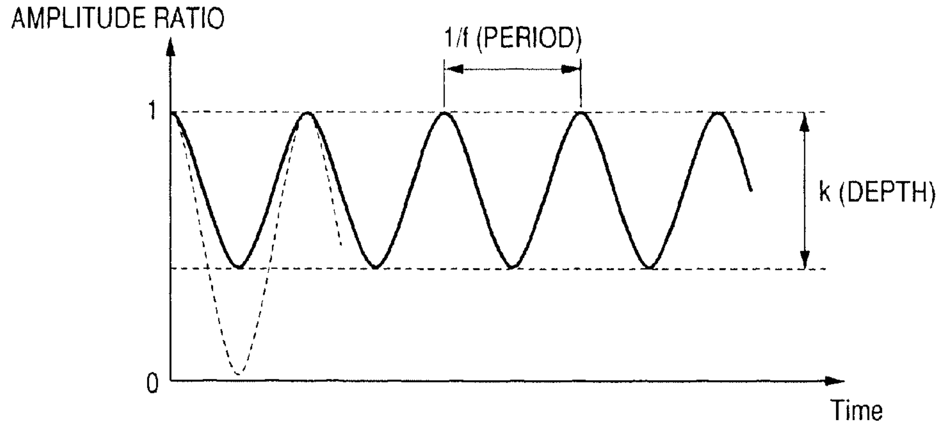
FIG. 18 is a view for describing a signal output from a waveform generation section in the engine sound processing system.

The waveform parameter of the waveform generation section 330 will now be described by reference to FIG. 18. The horizontal axis of a graph shown in FIG. 18 represents a time, and the vertical axis of the same represents an amplification ratio. The illustrated graph shows an example waveform of the signal output from the waveform generation section 330. As mentioned above, the waveform of the signal output from the waveform generation section 330 is one whose amplitude has been modulated at a predetermined period. This waveform is expressed by the following equation.

$$m(t) = 1 - k\frac{\sin(2\pi \cdot f \cdot t + \theta) + 1}{2} \quad \text{[Mathematical Expression 1]}$$

In the expression, reference symbol "t" designates a time; "k" designates the depth of modulation; "f" designates a fundamental frequency (Hz) of the waveform of a modulated signal; and θ designates an initial phase. This signal waveform m(t) corresponds to a sinusoidal wave of a frequency "f" (a period of 1/f). The frequency "f" is expressed by the following expression.

$$f = \frac{r \times N}{2 \times 60}$$ [Mathematical Expression 2]

In the expression, reference symbol "r" designates an engine speed (rpm), and N designates the number of cylinders of an engine (a natural number). The engine speed is read from a value detected by the engine speed sensor 340 and changes in real time according to driving conditions. Specifically, the period of a waveform m(t) of a modulated signal output from the waveform generation section 330 becomes essentially equal to the fundamental period of engine explosion. When the modulated signal m(t) having such a period is combined with the picked-up engine sound, the feeling of drift arises in the engine sound, and the engine sound can be processed so as to assume harsh sound quality. This utilizes a temporal masking phenomenon which is a listening characteristic of the human (a phenomenon in which, when another sound is issued immediately after a certain sound has stopped, the latter sound masks the preceding sound). Temporal masking poses difficulty in telling a difference between levels (peaks and valleys of a waveform) of an output engine sound, but fluctuation components (the feeling of variations) can be felt. A state where the fluctuations are felt corresponds to a state where harness of the sound is felt. By means of combination of such a waveform m(t) of the modulated signal, the engine sound can be processed into a sound having harsh sound quality. The period of the waveform of the modulated signal may also be set to an integral multiple of the fundamental frequency of engine explosion.

The waveform generation section 330 sets the depth "k" of modulation of the waveform parameter of the waveform m(t) of the modulated signal in accordance with the control section 303. The depth "k" of modulation is set so as to fall within a range from 0 to 1 ($0 \leq k \leq 1$). A modulated component is enhanced as the depth "k" of modulation increases, so that the engine sound can be processed so as to assume more harsh sound quality. In the modulated waveform shown in FIG. 18, the ratio of amplification of an upper peak remains at one, and the depth of a lower peak changes according to the value of "k."

The depth "k" of modulation may also be set through manual setting. As mentioned previously, one or a plurality of parameter sets may also be stored in the control section 303 in advance, and any one of the parameter sets may also be selected and set.

Figure 19:
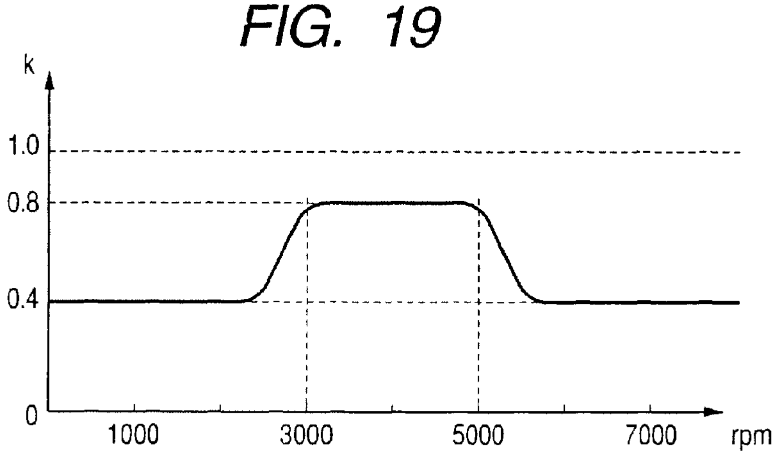
FIG. 19 is a view for describing modulation depth control performed in the engine sound processing system.

The depth "k" of modulation may also be taken as a constant or a function which changes according to driving conditions (primarily with an engine speed). An example where the depth "k" of modulation is controlled according to a value detected by the engine speed sensor 340 will be described by reference to FIG. 19. The horizontal axis of a graph shown in the drawing represents an engine speed (rpm), and the vertical axis of the same represents the magnitude of "k." The depth "k" of modulation exhibits the following characteristic.

The drawing shows a control characteristic of the depth "k" of modulation determined from the engine speed.

(a) When the engine speed is 3000 rpm or less, the depth "k" is made small (to a value of 0.4 in the drawing), to thus generate an (smooth) engine sound whose harshness is not enhanced.

(b) When the engine speed falls within a range from 3000 to 5000, the depth "k" is increased (to a value of 0.8 in the drawing), to thus generate an engine sound whose harshness is enhanced.

(c) When the engine speed is 5000 rpm or greater, the depth "k" is made small (to a value of 0.4 in the drawing), to thus generate a smooth engine sound.

The control characteristic is based on the above rules.

The rules are for enhancing the harshness of the engine by means of increasing the depth "k" when the engine speed falls within the range from 3000 to 5000 that is the principal engine speed achieved when the automobile is accelerated intensely (when the shaft horsepower of the engine becomes most powerful).

The rules for controlling the depth "k" of modulation are not limited to those mentioned above. Moreover, control of the depth "k" is not limited to control operation responsive to the value detected by the engine speed sensor 340. For instance, there may also be performed control operation in which the depth "k" is increased when the degree of depression of an accelerator is 50% or more, to thus enhance roughness.

Setting the depth "k" of modulation to a negative value is also possible. The engine sound can also be processed so as to assume harsh sound quality by means of setting the depth "k" of modulation to a negative value, to thus increase the level of a modulation component.

Figure 20:
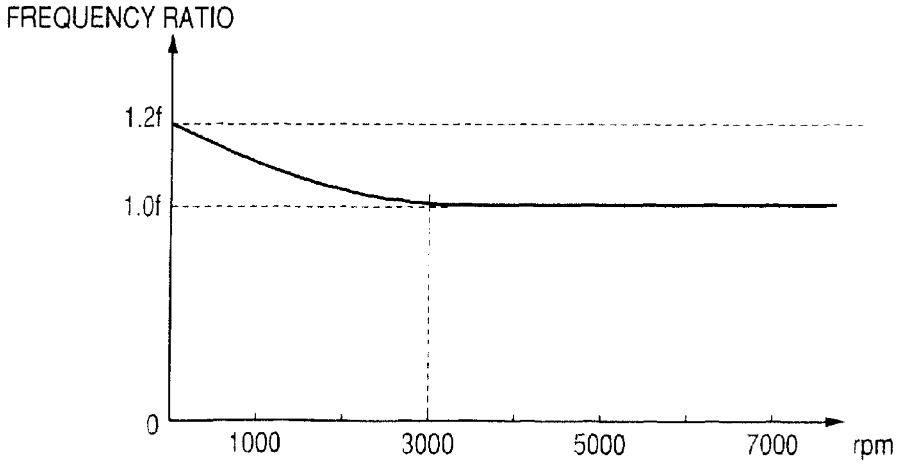
FIG. 20 is a view for describing modulation frequency control performed in the engine sound processing system.

The frequency "f" of the waveform parameter of the modulated signal m(t) is not limited to the above numerical expression and may also be taken as a function which further changes according to driving conditions. Even at the same engine speed, the feeling of fluctuation is ascertained to a much greater extent by means of an increase in the frequency "f," so that the engine sound can be processed to a harsh engine sound. An example case where the ratio of frequency "f" is controlled in response to the engine speed will be described by reference to FIG. 20. The horizontal axis of the graph shown in FIG. 20 represents an engine speed, and the vertical axis of the same represents a numerical ratio of the frequency "f." Control of the frequency "f" exhibits the following characteristics.

The drawing shows a control characteristic of the frequency "f" determined from the engine speed.

(a) When the engine speed is 3000 rpm or less, the frequency "f" is increased (by a factor of 1.2 in the drawing), thereby producing an engine sound whose harshness is further enhanced.

(b) When the engine speed is 3000 rpm or more, the frequency "f" is set to a normal value (a factor of 1.0 in the drawing), thereby producing a slightly-harsh engine sound.

The control characteristic is based on the above rules.

The rules are for increasing the frequency "f" when the engine speed is low and the level of the engine sound is low as in the middle of idling operation or deceleration, thereby further enhancing the harshness of the engine and producing a powerful engine sound even at a low engine speed. The rules for controlling the frequency "f" are also not limited to those described above. The frequency may also be controlled in accordance with a sensor which detects another driving condition, such as the accelerator depression sensor 41, or the like.

When the depth "k" of modulation and the frequency "f" which are waveform parameters are controlled in accordance with driving conditions (primarily with en engine speed), the frequency "f" may also be controlled according to driving conditions while the depth "k" of modulation is fixed. Conversely, the depth "k" of modulation may also changed according to driving conditions, and the ratio of the frequency "f" may also be fixed (a numerical value of the frequency "f" is determined from an engine speed). Alternatively, both the depth "k" of modulation and the frequency "f" may also be changed according to driving conditions. As a matter of course, both the depth "k" of modulation and the frequency "f" may also be fixed (the numerical value of the frequency "f" is determined from an engine speed).

Reference symbol θ showing the initial phase of the modulated waveform m(t) is a parameter for making the timing of a peak of modulation (an amplification ratio becomes lowest) coincide with a timing of a peak of the engine sound (the sound volume becomes maximum). The peak timing of modulation is caused to coincide with the peak timing of the engine sound, thereby enabling the driver to efficiently ascertain the feeling of fluctuation. When a plurality of modulated waveforms are output, to thus process respective engine sounds (the intake sound and the engine explosion sound), the waveform generation section 330 sets the parameter θ so as to coincide with peak timings of the respective engine sounds under control of the control section 303. The essential requirement is to control the respective timings in real time in response to the sensors that detect driving conditions. For instance, when the engine speed sensor 340 is a sensor for detecting an engine speed from the ignition pulse, the parameter θ responsive to the pulse (taking into consideration time lags among aspiration, explosion, and emission) is set in accordance with the pulse.

The modulated waveform is not limited to a sinusoidal wave. The engine sound can be processed into a harsh engine sound by means of another waveform, such as a triangular wave, a rectangular wave, a sawtooth wave, or the like, so long as the waveform is a periodic function.

In order to accurately reflect the above rules on the parameters of the modulated waveform, it may also be possible to prepare in advance; for example, a function adopting sensor outputs as variables, and to input a sensor output to this function, to thus determine a characteristic. Alternatively, the characteristic may be determined by means of Fuzzy inference. Moreover, a table for use in determining a modulation waveform parameter may also be determined beforehand in each predetermined step of each sensor output, the table is searched by means of the sensor output, to thus read a corresponding waveform parameter. In any event, a parameter set which is to be set by the user is assumed to include information for use in determining a waveform parameter from the sensor output.

The modulated waveform is combined with the engine sounds through above-mentioned control, so that a real engine sound effect expressing the harshness, smoothness, or the like, of the engine can be yielded.

Figure 21A:
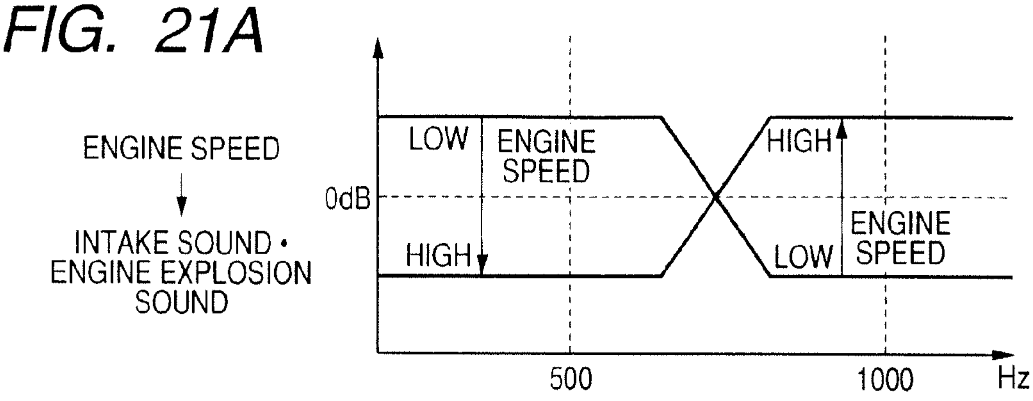
FIG. 21A is a first view for describing a filtering characteristic of the engine sound processing system.
Figure 21B:
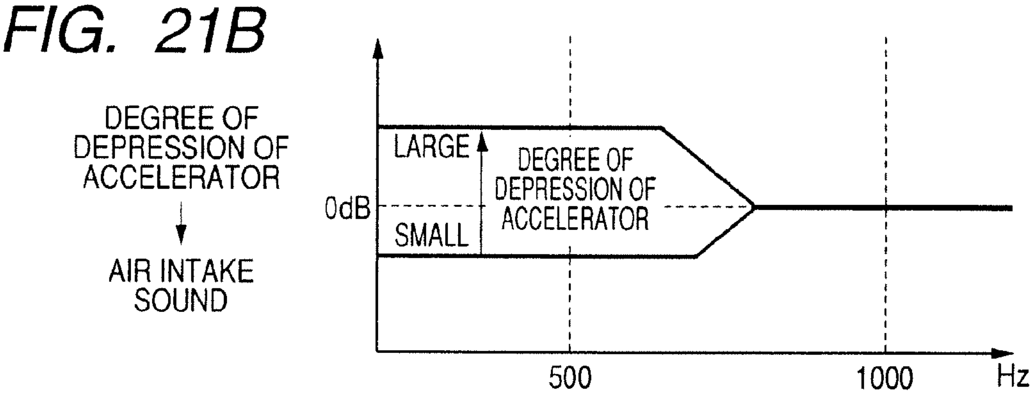
FIG. 21B is a second view for describing the filtering characteristic of the engine sound processing system.
Figure 21C:
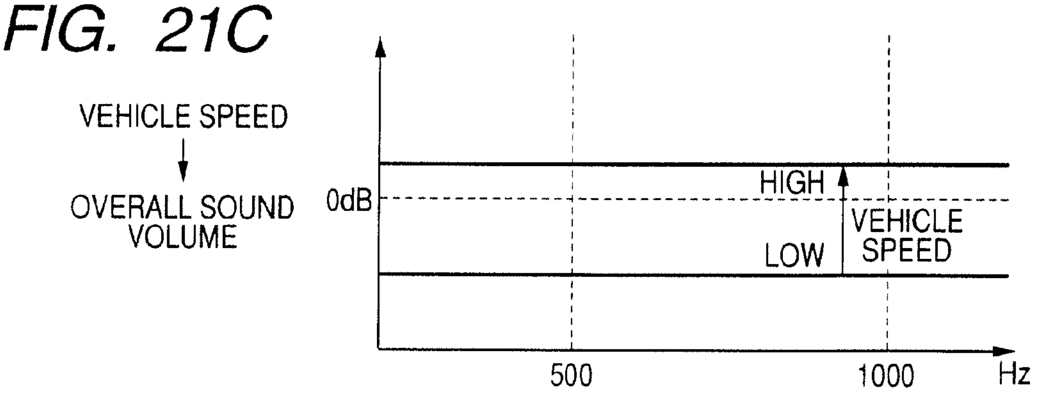
FIG. 21C is a third view for describing the filtering characteristic of the engine sound processing system.

Example control of a characteristic of the filters 315 and 325 will now be described by reference to FIGS. 21A to 21D. Each of horizontal axes of graphs shown in FIGS. 21A to 21C represents a frequency, and each of vertical axes of the graphs represents a frequency gain of the filter. The frequency gain of the filter shown in the drawings has the following features.

FIG. 21A shows a filter control characteristic of the intake sound and a filter control characteristic of the engine explosion sound determined from an engine speed, and the characteristics are based on the following rules.

(a) When an engine speed is low, a low tone is enhanced, and a high tone is suppressed.

(b) When the engine speed is high, the low tone is suppressed, and the high tone is enhanced.

FIG. 21B shows a filter control characteristic of an intake sound determined from the degree of depression of an accelerator. The characteristics are based on the following rules.

(c) When the degree of depression of an accelerator is small, an intake sound of low tone is suppressed.

(d) When the degree of depression is great, a low tone of intake sound is enhanced.

FIG. 21C shows a control characteristic of entire sound volume determined from a vehicle speed, and the characteristic is based on the following rules.

(e) When a vehicle speed is low, the entire sound volume is reduced.

(f) When the vehicle speed is high, the entire sound volume is increased.

Figure 21D:
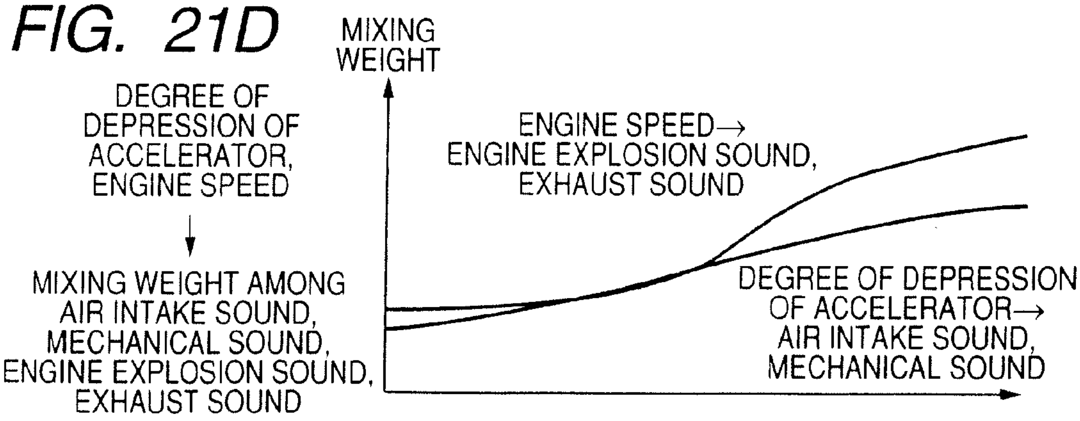
FIG. 21D is a fourth view for describing the filtering characteristic of the engine sound processing system.

The horizontal axis of a graph shown in FIG. 21D represents the degree of depression of an accelerator and an engine speed, and the vertical axis of the same represents a mixing weight. FIG. 21D shows characteristics, which are determined from the degree of depression of an accelerator and an engine speed, of control of a mixing weight between the intake sound and the engine explosion sound. The control characteristics are based on the following rules.

(g) A mixing weight of the intake sound is increased as the degree of depression of an accelerator increases.

(h) A mixing weight of the engine explosion sound is increased as the engine speed increases.

The mixing ratio is determined by a ratio of the mixing weight of the intake sound to the mixing weights of the engine explosion sound. The above rules are based on an objective of "When the engine speed is low, a low tone is enhanced in order to produce an atmosphere of the engine of large displacement. However, when the engine speed is high, enhancement of a high tone and an increase in mixing weights of the engine explosion sound are achieved in order to enhance high-speed rotation of the engine. When the degree of depression of an accelerator is large, load is imposed on the engine. Hence, the intake sound is increased, and the mixing weight of the intake sound is increased. When the vehicle velocity is high, noise other than the engine sound, such as wind noise, tire noise, or the like, becomes greater. Therefore, the overall sound volume is increased." The rules are for enhancing the actual engine sound further in terms of the driving conditions achieved at that time.

Although the essential requirement is to determine, from the frequency distribution of the engine sound, the low-tone center frequency and the high-tone center frequency, the low-tone center frequency usually lies in the neighborhood of 500 Hz, and the high-tone center frequency usually lies in the neighborhood of 1000 Hz.

The rules for controlling the filtering characteristics are not limited to those mentioned above. It may also be possible to set rules for controlling filtering characteristics through manual operation, or it may also be possible to store one or a plurality of parameter sets in the control section 303 in advance as mentioned previously and to select and set any one from the parameter sets.

As mentioned above, in the engine sound processing system of this embodiment of the present invention, actual engine sounds are picked up by means of the microphones disposed outside the vehicle cabin, and a modulated waveform conforming to driving conditions is combined with the actual engine sounds, whereby a real engine sound effect expressing roughness, smoothness, or the like, of the engine can be yielded through simple processing. A vehicle cabin space pleasant for the motoring enthusiast can be created.

Figure 22:
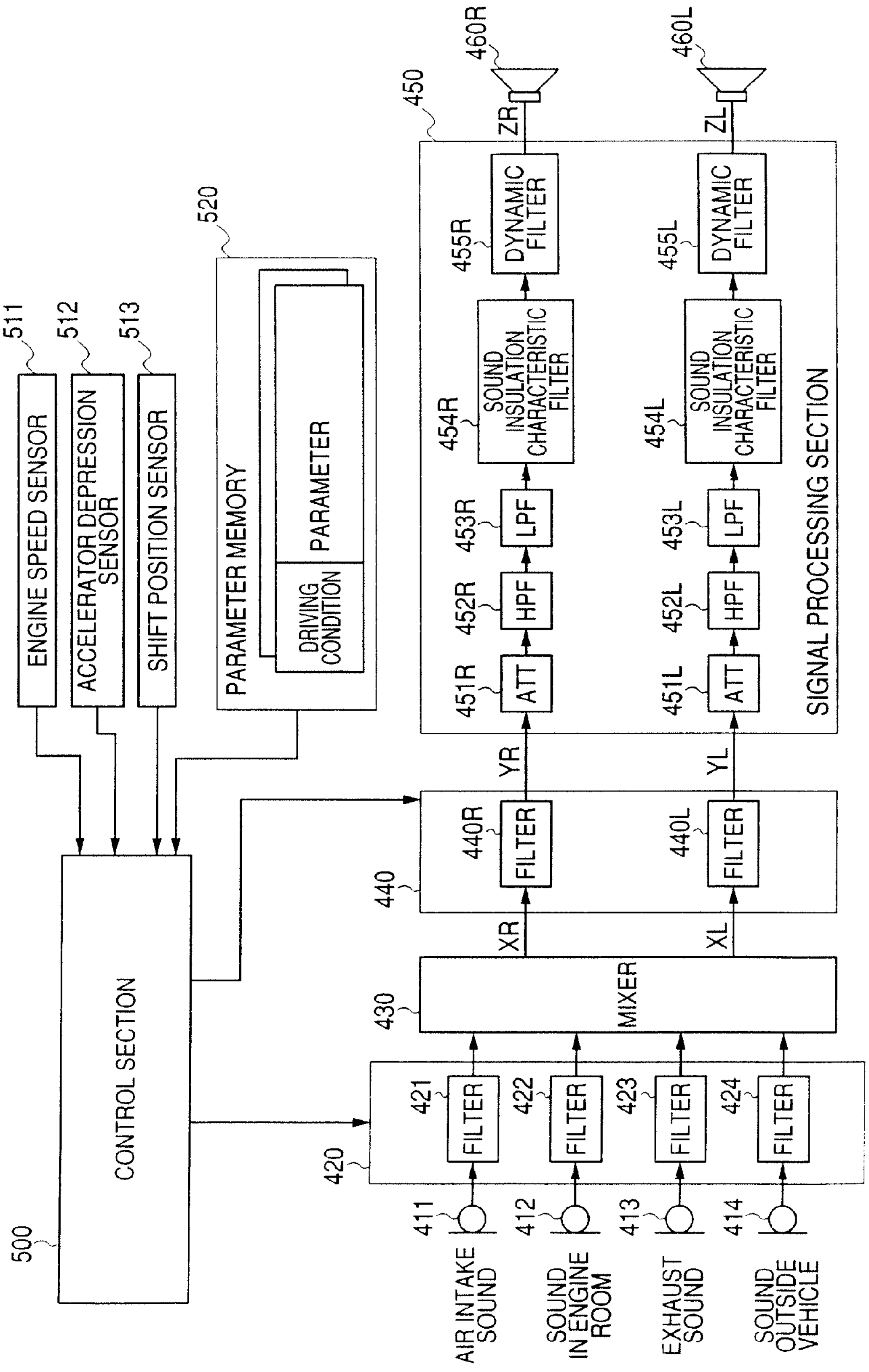
FIG. 22 is a block diagram showing the configuration of a device for controlling a sound field in a vehicle cabin which serves as a fourth embodiment of the present invention.

FIG. 22 is a block diagram showing the configuration of a system for controlling a sound in a vehicle cabin (a "cabin acoustic controller") which is a fourth embodiment of the present invention. This cabin acoustic controller is a system for processing an engine sound picked from a vehicle and outputting a processed sound from speakers 460L and 460R. In an embodiment shown in FIG. 22, an intake sound, an internal sound of the engine room, an exhaust sound, and a sound outside of the vehicle are selected as constituent elements of the engine sound. Microphones 411 to 414 are disposed at positions where these sounds can be picked up. A filter section 420 is made up of filters 421 to 424. These filters 421 to 424 are provided with a function of subjecting electric signals acquired from the microphones 411 to 414 to pre-processing; and a chord construction function of generating a audio consonant signal whose pitch is in consonance with pitches of the electric signals in accordance with chord construction information when the chord construction information is provided and adding the thus-generated audio signal to the pre-processed electric signals. A control section 500 provides instruction information pertaining to pre-processing and the chord construction information. Details of the chord construction information, the detailed configuration of the filters 421 to 424, and the control section 500 will be described later. The mixer 430 is a device which synthesizes engine sound signals XL and XR of two channels; namely, right and left channels, from respective signals output from the filters 421 to 424 and which outputs the thus-synthesized signals.

A filter section 440 is made up of two filters 440L and 440R. These filters 440L and 440R are formed from; for instance, a convolution computing element. The filters subject to convolution two filtering coefficient strings imparted to the engine sound signals XL and XR by the control section 500, and outputs resultantly-acquired engine sound signals YL and YR. The control section 500 switches between the filtering coefficient strings to be imparted to the filters 440L and 440 R in accordance with operation of; e.g., an unillustrated operator. In a preferred mode, the control section 500 adjusts a correlation coefficient of the two filtering coefficient strings imparted to the filters 440L and 440R, thereby adjusting the spread of a sound reproduced by the speakers. Specifically, when a sound image of the sound reproduced from the speakers is distributed over a wide range, two filtering coefficient strings, which respond to flat filtering characteristics and have a low correlation therebetween, are imparted from the control section 500 to the filters 440L and 440R. When the sound image of the sound reproduced from the speakers is concentrated at a narrow range, two filtering coefficient strings, which response to a flat filtering characteristic and which have a low correlation therebetween, are imparted to the filters 440L and 440R from the control section 500.

The signal processing section 450 is a circuit which subjects the engine sound signals YL and YR to predetermined signal processing, respectively, and which outputs the thus-processed signals to two right and left speakers 460R and 460L. The engine sound signal YL sequentially passes through elements assigned to the left channel; namely, an ATT (attenuator) 451L, an HPF (high-pass filter) 452L, an LPF (low-pass filter) 453L, a sound-insulation characteristic filter 454L, and a dynamic filter 455L in the signal processing section 450, and is output finally to the speaker 460L as a final engine sound signal ZL. The engine sound signal YR sequentially passes through elements assigned to the right channel; namely, an ATT (attenuator) 451R, an HPF (high-pass filter) 452R, an LPF (low-pass filter) 453R, a sound-insulation characteristic filter 454R, and a dynamic filter 455R in the signal processing section 450, and is output finally to the speaker 460R as a final engine sound signal ZR.

The ATT 451L and 451R are circuits for adjusting the level of the engine sound signals YL and YR to a level optimum for driving the speakers. The HPF 452L and 452R and the LPF 453L and 453R eliminate unwanted high-frequency components and low-frequency components, which are not optimum to be output from the speakers 460L and 460R, from the respective signals output from the ATT 451L and 451R. The sound-insulation characteristic filters 454L and 454R are filters which simulate a sound-insulation characteristic of a vehicle body; namely, a characteristic of a system through which a sound transmits from the engine to the driver's ears by way of the vehicle body. The dynamic filters 455L and 455R are filters capable of controlling a frequency-to-gain characteristic. In a preferred mode, in order to impart power responsive to an engine speed to the engine sound heard by the driver, the frequency-to-gain characteristic of the dynamic filters 455L and 455R are controlled in such a way that a gain in a frequency band of 400 Hz or thereabouts is increased when an engine speed per unit time is in the vicinity of; e.g., 3000 rpm, and such that a gain in a frequency band of 1 kHz or thereabouts is increased when the engine speed per unit time is in the vicinity of; e.g., 6000 rpm.

The control section 500 monitors results of measurement performed by various sensors, such as an engine speed sensor 511, an accelerator depression sensor 512, a shift position sensor 513, and the like, thereby specifying driving condition of the vehicle and controlling individual sections in accordance with the driving condition. Parameters used for controlling the individual sections are stored in parameter memory 520 in association with respective previously-defined driving conditions. A principal one of these parameters is chord construction information. When having specified the nature of driving conditions, the control section 500 reads from the parameter memory 520 a parameter associated with the driving condition, and imparts chord construction information included in the parameter to the filters 421 to 424.

Filters of various configurations are conceivable as the filters 421 to 424. FIG. 2 is a block diagram showing a first example configuration of the filters 421 to 424. The filters 421 to 424 belonging to the first example configuration are made up of a pre-processing section 601, "n" pitch transformation sections 602-*j* (j=1 to n), n+1 multipliers 603-*j* (j=0 to n), and an adder 604.

The pre-processing section 601 is a device for subjecting a signal output from the microphone 411 or the like to pre-processing. Pre-processing includes three possible processing operations as follows.

a: Nothing is done.

b: An input audio signal is subjected to noise suppression processing.

c: A characteristic harmonic component in an input audio signal; namely, a characteristic harmonic component determined by the type of the sound source, such as an intake sound, a sound in the engine room, an exhaust sound, and a sound outside the vehicle, is selected and output.

In the previous parameter memory 520, the parameters associated with the driving conditions include information which specify the type of pre-processing. When a parameter corresponding to the driving condition has been read from the parameter memory 520, the control section 500 acquires from this parameter information which specifies the type of pre-processing, and imparts the thus-acquired information to a pre-processing section 601. The pre-processing section 601 subjects a signal output from the microphone 411, or the like, to pre-processing instructed by means of the imparted information.

The "n" pitch transformers 602-*j* (j=1 to n) are devices which subject signals output from the respective pre-processing sections 601 to pitch transformation and output the thus-processed signals. The chord construction information imparted to the respective filters 421 to 424 from the control section 500 includes a pitch transformation instruction for one or a plurality of pitch transformation sections 602-*j* and a pitch transformation ratio P-j (j=1 to n) used for pitch transformation. The instruction and the ratio are imparted to the pitch transformation section(s) 602-*j* of interest. The pitch transformation section(s) 602-*j* having received the pitch transformation instruction and the pitch transformation ratio P-j transforms an audio signal output from the pre-processing section 601 into an audio signal whose pitch is P-j times the pitch of the original signal, and outputs the thus-transformed signal.

The multipliers 603-*j* (j=0 to n) multiply the signal output from the pre-processing section 601 or the signals output from the pitch transformation sections 602-*k* (k=1 to n) by a multiplication coefficient kj (j=0 to n), and outputs a result(s) of multiplication. The chord construction information imparted to the respective filters 421 to 424 from the control section 500 also include this multiplication coefficient kj (j=0 to n). The adder 604 adds the signal output from the pre-processing section 601 to the signals output from the multipliers 603-*j* (j=0 to n), to thus generate a chord signal, and outputs the thus-generated chord signal to the mixer 430. At that time, a pitch between sounds constructing the chord is determined from the pitch of the audio signal output from the pre-processing section 601 and one or a plurality of pitch transformation ratios P-j included in the chord construction information. A volume balance among the sounds constructing the chord is determined by the multiplication coefficient kj (j=0 to n).

Figure 23:
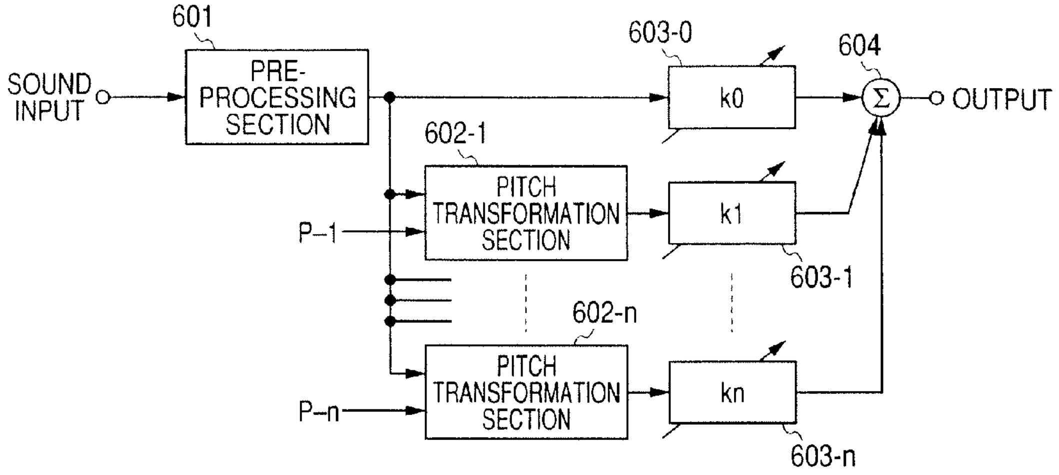
FIG. 23 is a block diagram showing a first example configuration of filters 21 to 24 of the fourth embodiment.
Figure 24:
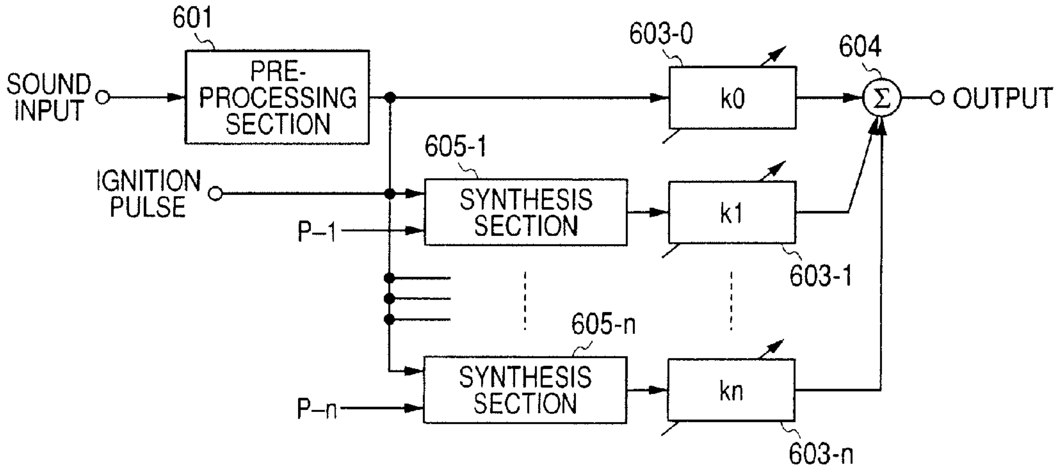
FIG. 24 is a block diagram showing a second example configuration of the filters 21 to 24 of the fourth embodiment.
Figure 25:
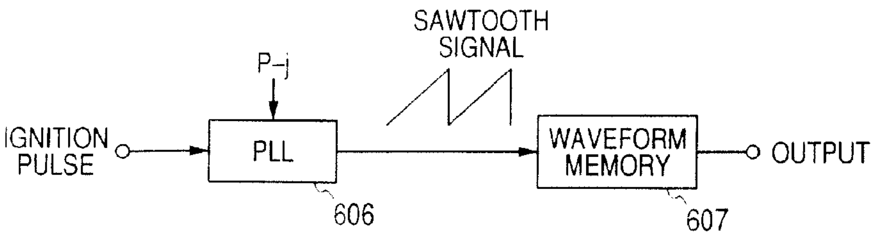
FIG. 25 is a block diagram showing an example structure of a synthesis section 205-*j* in the second example configuration of the fourth embodiment.

FIG. 23 is a block diagram showing a second example configuration of the filters 421 to 424. In this second example configuration, the pitch transformation sections 602-*j* (j=1 to n) in the first example configuration are replaced with synthesis sections 605-*j* (j=1 to n). FIG. 24 shows an example configuration of each of the synthesis sections 605-*j* (j=1 to n). As in the case of the first example configuration, the pitch transformation ratio P-j is imparted to the synthesis sections 605-*j* which are imparted with a pitch transformation instruction. Further, the respective synthesis sections 605-*j* (j=1 to n) are supplied with an ignition pulse which is generated at the ignition timing of the engine. The synthesis sections 605-*j* (j=1 to n) are phase-synchronized to the ignition pulse. Each of the synthesis sections 605-*j* (j=1 to n) comprises a PLL (Phase-Locked Loop) 606 which outputs a sweep signal of sawtooth waveform whose frequency is P-j times the frequency of the ignition pulse, and waveform memory 607 which stores sample data pertaining to an engine sound waveform of one period and which is supplied with an address signal as a sweep signal. As a result of the synthesis section 605-*j* being imparted with a pitch transformation instruction, the PLL 606 generates a sweep signal of sweep frequency, which is obtained by multiplying the frequency of the ignition pulse of the engine by the pitch transformation ratio P-j, and sample data pertaining to an engine sound waveform of one period are read per sweep of this sweep signal. The thus-read sample data are supplied to the multipliers 603-*j* in a subsequent stage. Since the frequency of the ignition pulse corresponds to the pitch of the signal output from the pre-processing section 601. Hence, the pitch of the sample data read from the waveform memory 207 becomes a pitch which is P-j times the pitch of the signal output from the pre-processing section 601.

The above is the detailed configuration of the present embodiment.

Operation of the cabin acoustic controller of the present embodiment will be described by reference to specific examples.

FIRST SPECIFIC EXAMPLE

In the present embodiment, when a sound signal output from the pre-processing section 601 of the filters 421 to 424 is taken as, e.g., a sound C (hereinafter called an "original sound"), consonances having the following relationships with this original sound are generated through pitch transformation or synthesis.

D: Sound whose pitch is nine-eighths times the pitch of the original sound

E: Sound whose pitch is five-fourths times the pitch of the original sound

F: Sound whose pitch is four-thirds times the pitch of the original sound

G: Sound whose pitch is three-seconds times the pitch of the original sound

A: Sound whose pitch is five-thirds times the pitch of the original sound

B: Sound whose pitch is fifteen-eights times the pitch of the original sound

Eb: Sound whose pitch is six-fifths times the pitch of the original sound

Bb: Sound whose pitch is nine-fifth times the pitch of the original sound

In the present embodiment, various pieces of chord construction information for constructing chords by combination of the original sound with one or many of the above sounds are stored in advance in the parameter memory 520 in association with various driving conditions. At the time of driving operation, chord construction information corresponding to a driving condition achieved at that point in time is read by the control section 500, and the thus-read information is imparted to the filters 421 to 424.

Figure 26:
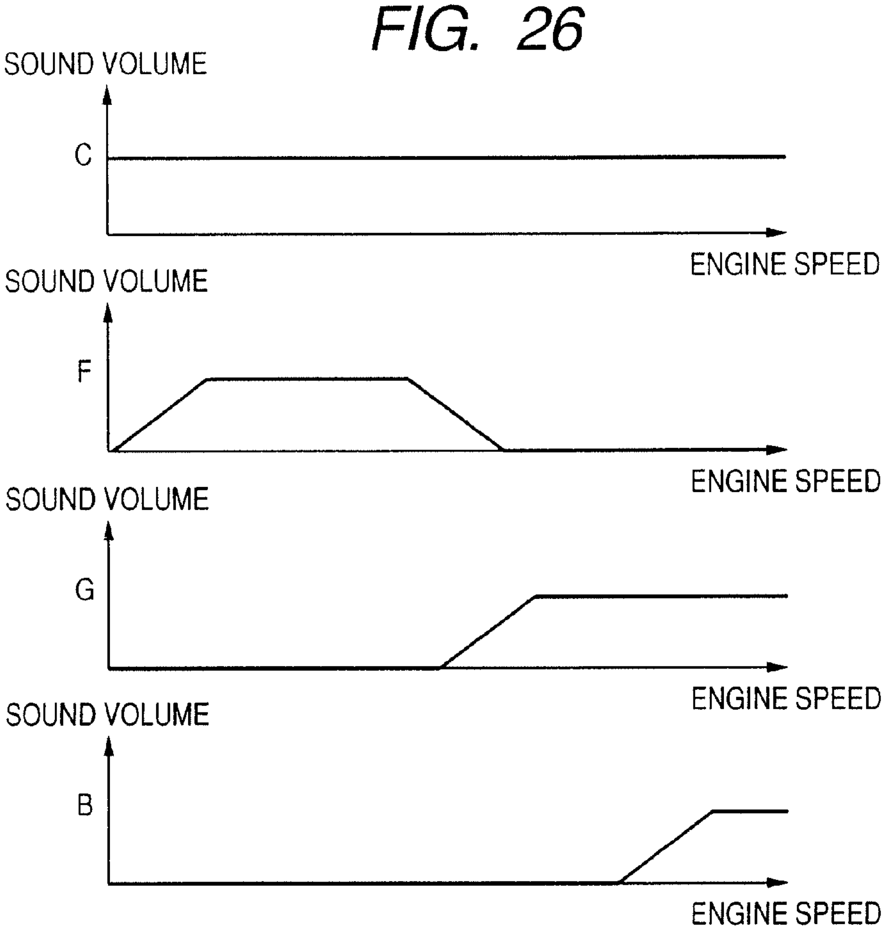
FIG. 26 is a waveform chart showing example operation of the embodiment.

FIG. 26 shows an example operation achieved by means of such control operations. In this example operation, the engine speed detected by means of the engine speed sensor 511 is taken as a driving condition. Pieces of various chord construction information; namely, one or a plurality of instructions for pitch transformation sections 602-*j* or synthesis sections 605-*j* or one or a plurality of pitch transformation ratios P-j or one or a plurality of multiplication coefficients kj (j=0 to n) to be provided to the pitch transformation sections or the synthesis sections, are stored in the parameter memory 520 in association with various types of driving conditions (engine speeds). During driving operation, chord construction information is read in accordance with the driving condition (the engine speed), and the thus-read chord information is imparted to the filters 421 to 424. As illustrated, a chord whose construction changes in response to the engine speed is generated by the filters 421 to 424, and the thus-generated chord is output by way of the speakers 460L and 460R.

In the illustrated embodiment, sound F is added to sound C serving as the engine speed increases. As a result of an additional increase in the engine speed, pitch transformation or synthesis intended for acquiring sound G is commenced. There is performed control operation for reducing a multiplication coefficient applied to sound F and increasing a multiplication coefficient applied to sound G, and a sound added to the original sound is cross-faded from sound F to sound G. When the engine speed is increased further, sound B added to the original sound is further added. Thus, a chord providing an impression of power acceleration and smooth speedup is acquired, and the driver can experience a driving condition upon hearing this chord.

SECOND SPECIFIC EXAMPLE

In the first specific example, the state ascertained from current values of signals output from the sensors is used as a driving condition. However, in this second specific example, the manner of temporal changes in signals output from sensors is used as a driving condition. Specifically, the manner of changes having arisen in signals output from one or a plurality of sensors within a given period of time is defined as a plurality of types of kinetic conditions. Pieces of chord constitution information are stored in the parameter memory 520 in advance in association with the kinetic conditions. During driving operation, the manner of changes having arisen in signals output from the respective sensors within a given period of time in the past and the respective driving conditions stored in the parameter memory 520 are subjected to pattern matching. An engine sound which is a chord is generated by use of chord construction information corresponding to a matched kinetic condition. As a result, for example, the following complicate control operations can be performed. First, when a shift to a lower gear is detected by means of the shift position sensor 513, sound F is added to sound C that is the original sound. Subsequently, sound G is additionally added with an increase in the engine speed detected by the engine speed sensor 511. The level of sound F and that of sound G are reduced as the increase in the engine speed is stopped. When steady driving is achieved, only sound C that is the original sound is generated.

THIRD SPECIFIC EXAMPLE

In the first specific example, the structure of a chord is changed in accordance with a signal output from one sensor. However, the structure of the chord may also be changed in accordance with a combination of signals output from a plurality of sensors. For instance, when operation of a shift to a higher gear is detected by means of the shift position sensor 513, a sound to be added to the original sound is changed; for instance, to sound D, sound E, sound G, and sound A, as the gear is shifted to the second gear, the third gear, the fourth gear, and the fifth gear. At that time, the volume of sound to be added is made proportional to the degree of depression of an accelerator detected by the accelerator depression sensor 512.

As described above, according to the present embodiment, a sound whose pitch differs from that of the original sound is added to the engine sound picked up in the vehicle according to driving conditions, and a resultant sound is reproduced as a chord out of the speakers. Accordingly, the driver can feel a response to driving action from the reproduced engine sound and perform comfortable driving.

Although the exemplifications of the embodiment of the present invention have been described, further conceivable exemplifications of the present invention other than those mentioned above are also conceivable as follows.

(1) The current position of a vehicle may also be handled as driving conditions. More specifically, a vehicle is equipped with a car navigation system, and pieces of chord construction information are stored in the parameter memory 520 in association with the current position of the vehicle remaining in a dividing state. The control section 500 reads from the parameter memory 520 a piece of chord construction information corresponding to information about the current position (a driving condition) acquired from the navigation system, and imparts the thus-read information to the filters 421 to 424. According to this exemplification, operation for adding sound F and sound G to the original sound when the vehicle is driving along the shore becomes feasible.

(2) In this embodiment, the device that produces a chord by means of pitch transformation or synthesis is provided for the filters 421 to 424 in the stage before the mixer 430. However, this device for producing a chord may also be disposed at a stage subsequent to the mixer 430. Alternatively, the device for producing a chord may also be disposed at both stages before and after the mixer 430. It may also be the case where either the device in the prior stage or the device in the subsequent stage is selected by means of operation of an operation element or according to a driving condition and where the thus-selected device is caused to perform processing for producing a chord.

(3) In the above embodiment, the device for producing a chord is provided for all of the filters 421 to 424. However, this device may also be provided for only some of the filters. Alternatively, the device for producing a chord may also be provided for all of the filters 421 to 424, and a device which performs operation for producing a chord may also be selected by means of operation of the operation element or according to a driving condition.

(4) The spread of sound may also be changed by means of changing correlation coefficients of the two filter coefficient strings imparted to the filters 440L and 440R, in addition to changing the structure of the chord of the engine sound according to a driving condition.

(5) In the present embodiment, the engine sound is picked up, and a sound field effect is imparted to the thus-picked-up sound, thereby reproducing the engine sound from the speakers. However, a pseudo engine sound signal may also be reproduced by means of reading, from the memory where waveform data pertaining to an engine sound has been stored in advance, waveform data at a read speed corresponding to an engine speed instead of actually picking up an engine sound. A chord responsive to a driving condition may also be produced from this pseudo engine sound signal. According to this exemplification, even a vehicle which does not have any engine and travels by means of a motor can yield an advantage analogous to that yielded in the present embodiment.

(6) In the embodiment, an engine sound is reproduced by means of the speakers of two channels. However, an engine sound may also be reproduced by means of multi-channel speakers, such as 4-channel speakers, 5.1-channel speakers, or the like.

<Fifth Embodiment>

Figure 27:
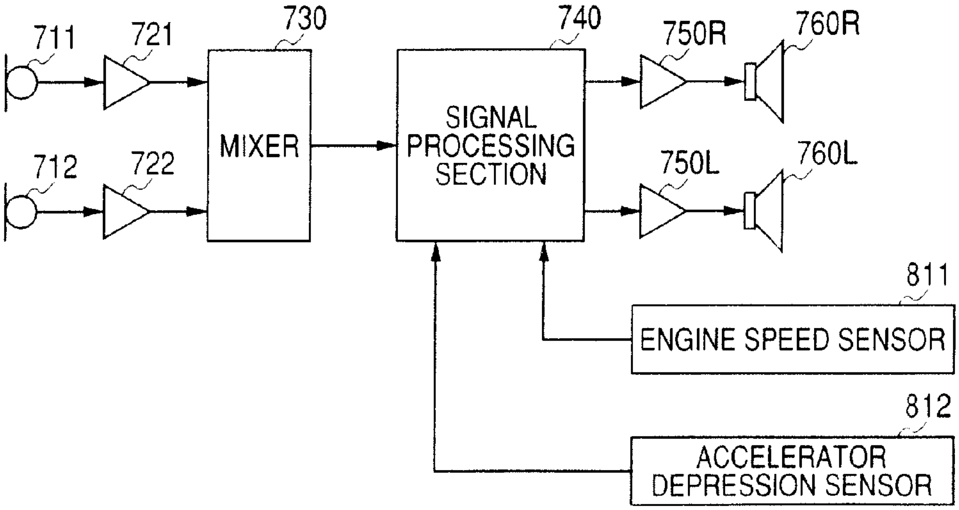
FIG. 27 is a block diagram showing the configuration of an engine sound processing system which is a fifth embodiment of the present invention.

FIG. 27 is a block diagram showing the configuration of an engine sound generator which is a fifth embodiment of the present invention. This engine sound generator is a device for processing an engine sound picked up from a vehicle and outputting the thus-processed sound to the inside of a vehicle from speakers 760L and 760R. In the embodiment shown in FIG. 27, a microphone 711 and a microphone 712 are provided at two locations where characteristic components of the engine sound can be picked up. Signals output from the microphones 711 and 712 are amplified by amplifies 721 and 722, and the thus-amplified signals are mixed and output by a mixer 730. A mixing ratio of the mixer 730 is determined such that respective characteristic frequency components of the engine sound appear in an appropriate balance in the signal output from the mixer 730. A filter for extracting the characteristic frequency components of the engine sound may also be interposed between the amplifiers 721, 722 and the mixer 730.

A signal processing section 740 is a device for subjecting the signal output from the mixer 730 to various types of signal processing, and can be embodied by; e.g., a DSP (Digital Signal Processor) or a like device. This signal processing section 740 is connected to an engine speed sensor 811 for measuring the speed of the engine and an accelerator depression sensor 812 for measuring the degree of depression of an accelerator. The signal processing section 740 makes a necessary correction to a frequency characteristic of the signal output from the mixer 730 in accordance with a signal output from the engine speed sensor 811 and a signal output from the accelerator depression sensor 812; and synthesizes, from the corrected frequency characteristic, an engine sound signal to be reproduced in the vehicle cabin. The engine sound signal, which is to be reproduced in the vehicle cabin and is produced through such processing, is separated into an engine sound signal for an L channel and another engine sound signal for an R channel, and the thus-separated engine sound signals are output from the signal processing section 740. The engine sound signals of L and R channels are amplified by the amplifiers 750L and 750R and output from the speakers 760L and 760R.

Figure 28:
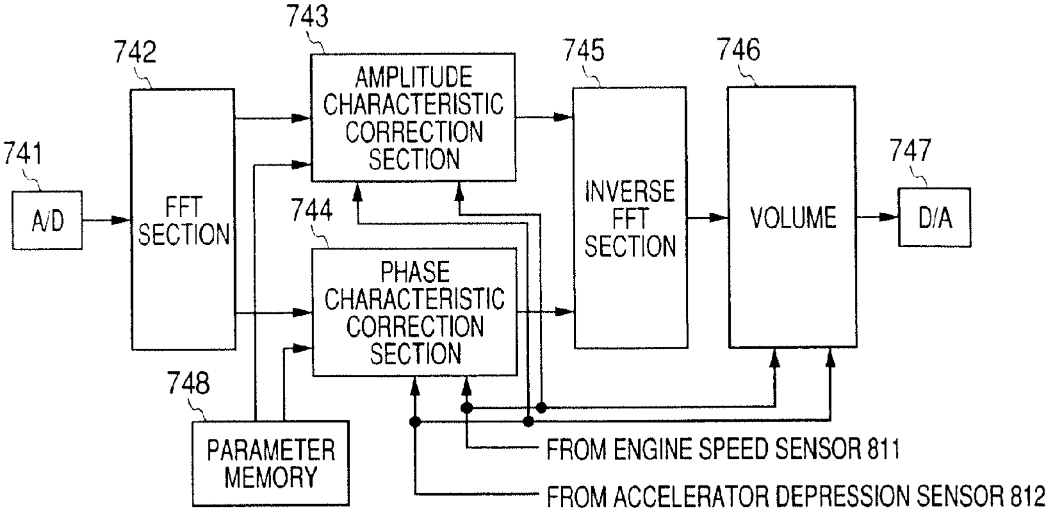
FIG. 28 is a block diagram showing an example configuration of a signal processing section 740 of the embodiment.

FIG. 28 is a block diagram showing an example configuration of the signal processing section 740. An A/D converter 741 samples that signal output from the mixer 730, which is an analogue audio signal, by means of a sampling clock signal of predetermined frequency, and converts the thus-sampled signal into a digital audio signal. The FFT section 742 subjects the digital audio signal output from the ND converter 741 to FFT (Fast Fourier Transform), to thus determine a frequency characteristic H (jω); and outputs amplitude characteristic data |H(jω)| showing the absolute value of the frequency characteristic and phase characteristic data arg{H (jω)} showing an argument of the frequency characteristic.

An amplitude characteristic correction section 743 is a device which makes a correction to the amplitude characteristic data |H(jω)| in accordance with the signal output from the engine speed sensor 811 and the signal output from the accelerator depression sensor 812. A phase characteristic correction section 744 is a device for making a correction to the phase characteristic data arg{H(jω)} in accordance with the signal output from the engine speed sensor 811 and the signal output from the accelerator depression sensor 812. The greatest characteristic of the present embodiment lies in correction of the phase characteristic data arg{H(jω)} performed by the phase characteristic correction section 744. In the present embodiment, at the time of correction of this phase characteristic data arg{H(jω)}, the frequency whose phase is to be corrected is determined from the engine speed measured by the engine speed sensor 811, and the amount of phase correction is controlled in accordance with the amount of depression of an accelerator measured by the accelerator depression sensor 812.

In the present embodiment, a plurality of types of modes of correction (hereinafter called "correction modes" for the sake of convenience) of the amplitude characteristic data |H(jω)| and the phase characteristic data arg{H(jω)} are assumed. Parameter memory 748 stores parameters for causing the amplitude characteristic correction section 743 and the phase characteristic correction section 744 to make a correction in each of the correction modes. The driver (user) can select a desired correction mode by means of operation of an unillustrated operation element. In the present embodiment, a parameter corresponding to the thus-selected correction mode is read from the parameter memory 748, and the parameter is set in the amplitude characteristic correction section 743 and the phase characteristic correction section 744, whereby a correction is made in the selected correction mode. In order to avoid overlapping explanations, details of the correction made to the phase characteristic data and the amplitude characteristic data are made obvious in descriptions of operation of the engine sound generator of the present embodiment.

An inverse FFT section 745 is a device which subjects to inverse FFT the amplitude characteristic data corrected by the amplitude characteristic correction section 743 and the phase characteristic data corrected by the phase characteristic correction section 744, thereby synthesizing an engine sound signal which is a time signal. A volume 746 is a device which amplitudes an engine sound signal output from the inverse FFT section 745 and outputs the thus-amplified signal. In a preferred mode, a gain of the volume 746 is increased or decreased in accordance with the signal output from the engine speed sensor 811 and the signal output from the accelerator depression sensor 812. The signal output from the volume 746 is converted into an analogue signal by means of a D/A converter 747, and the thus-converted signal becomes the previously-described engine sound signal to be reproduced in the vehicle cabin.

Figure 29:
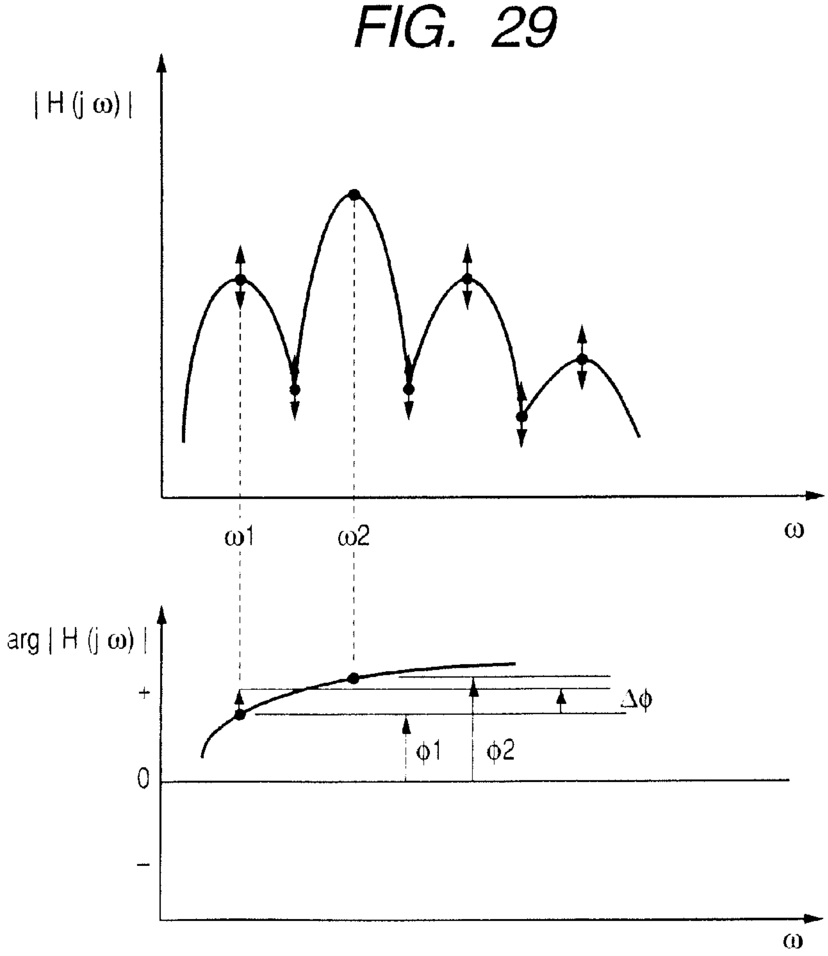
FIG. 29 is a view for describing specifics of processing for correcting amplitude characteristic data and phase characteristic data of the fifth embodiment.

Operation of the engine sound generator of the present embodiment will be described hereunder. FIG. 29 is a view illustrating the amplitude characteristic data |H(jω)| and the phase characteristic data arg{H(jω)} which are output from the FFT section 742 of the present embodiment. When an angular frequency ω of a spectrum of the engine sound is expressed along the horizontal axis, the amplitude characteristic data |H(jω)| exhibits a characteristic in which a plurality of peaks appear side by side along the axial direction of the angular frequency. In the present embodiment, a component considered to be derived from explosion of the engine is selected from components of the spectrum of the engine sound corresponding to the crests of these peaks. By means of the thus-selected component being taken as a reference, a correction is made to amplitudes and phases of the other components. At that time, the component derived from explosion of the engine is estimated from the engine speed measured by the engine speed sensor 811. For example, in the case of a four-cylinder engine, explosion occurs twice in a period corresponding to single rotation of the engine. Therefore, an angular frequency, which is the highest among the crests of the amplitude characteristic data |H(jω)| and which is located in the vicinity of an angular frequency corresponding to twice of the engine speed, is assumed to be a second-order rotation angular frequency ω2 stemming from explosion of the engine.

While the amplitude characteristic data |H(jω2)| in the second-order rotation angular frequency ω2 remains fixed, the amplitude characteristic correction section 743 makes, in accordance with a parameter corresponding to the correction mode read from the parameter memory 748, a correction for increasing the crests of the amplitude characteristic data |H(jω)|; a correction for lowering the crests; a correction for increasing valleys of the amplitude characteristic data |H (jω)|; a correction for lowering the valley; or the like. The type of a correction and the degree to which the crests or the valleys are increased or decreased vary according to the correction mode.

Correction of the phase characteristic data arg{H(jω)} will now be described. In the present embodiment, an angular frequency close to one-half of the second-order rotation angular frequency ω2 among the angular frequencies of the crests in the amplitude characteristic data |H(jω)| is assumed to be a first-order rotation angular frequency ω1 corresponding to an engine speed. This first-order rotation angular frequency ω1 becomes an angular frequency to be subjected to phase correction performed by the phase characteristic correction section 744. Provided that the amount of depression of an accelerator measured by the accelerator depression sensor 812 is taken as DACC, the phase characteristic correction section 744 computes phase correction data Δφ in accordance with; e.g., Expression (1) provided below.

$$\Delta\phi=(\phi 2-\phi 1)(D0+D1\cdot DACC) \quad (1)$$

Here, reference symbol $\phi 2$ designates a value $\arg\{H(j\omega 2)\}$ of the phase characteristic data pertaining to the second-order rotation angular frequency $\omega 2$, and $\phi 1$ designates a value $\arg\{H(j\omega 1)\}$ of the phase characteristic data pertaining to the first-order rotation angular frequency $\omega 1$. D0 and D1 are parameters set for each correction mode.

As indicated by Expression (2) provided below, the phase characteristic correction section 744 makes a correction of uniformly increasing or decreasing phase characteristic data $\arg\{H(j\omega)\}$ ($\omega<\omega 2$) in a frequency range equal to or lower than the second-order rotation angular frequency $\omega 2$ in accordance with an increase or decrease in phase characteristic data $\arg\{H(j\omega 1)\}$ such that the phase characteristic data $\arg\{H(j\omega 1)\}$ in the first-order rotation angular frequency $\omega 1$ are increased or decreased from the current value by an amount of phase correction data $\Delta\phi$.

$$\arg\{H(j\omega 1)\}=\arg\{H(j\omega 1)\}+\Delta\phi \quad (2)$$

In the present embodiment, the amplitude characteristic data $|H(j\omega)|$ and the phase characteristic data $\arg\{H(j\omega)\}$ having undergone corrections, such as those mentioned above, are sent to the inverse FFT section 745, where an engine sound signal which is a time signal is synthesized and output from the speakers 760L and 760R. As illustrated, in the case of a relationship of $\phi 2>\phi 1$, the corrected phase characteristic data $\arg\{H(j\omega 1)\}$ approach the phase characteristic data $\arg\{H(j\omega 2)\}$ as the degree of depression of an accelerator DACC increases. When the degree of depression of an accelerator DACC is small and when a great difference exists between the phase of a component of second-order rotation angular frequency $\omega 2$ in the engine sound and the phase of a component of the first-order rotation angular frequency $\omega 1$ in the same, the driver heard that engine sound feels that the engine is located far ahead. Meanwhile, when the degree of depression of an accelerator DACC is great and when the phase of a component of second-order rotation angular frequency $\omega 2$ in the engine sound and the phase of a component of first-order rotation angular frequency $\omega 1$ in the same approach each other, the driver heard that engine sound feels that the engine is disposed near.

As mentioned above, according to the present embodiment, a phase difference in the engine sound between the phase of the second-order rotation angular frequency component and the phase of the first-order rotation angular frequency component is increased or decreased in accordance with the degree of depression of an accelerator, thereby changing the sense of distance to the engine felt by the driver. Accordingly, according to the present embodiment, when compared with the case where an amplitude characteristic is adjusted by use of a graphics equalizer, the engine sound heard by the driver can be changed drastically. Further, the driver can change a parameter (D0 or D1 in the above-described embodiment) used for making a correction to the phase of the first-order rotation angular frequency component responsive to the degree of depression of an accelerator by changing a correction mode to be selected, to thus enable changing of the mode of phase correction. Accordingly, the driver can enjoy an engine sound of preferred impression by means of selecting an appropriate correction mode. Further, according to the present embodiment, the sense of distance to an engine sound can be changed by means of depressing the accelerator, and hence the engine sound matching driving action is acquired. In the present embodiment, since a frequency component for use in phase correction is selected from the engine sound in accordance with the engine speed, the engine sound actually arising in the vehicle comes into harmony with the engine sound which is synthesized by the signal processing section 740 and output from the speakers 760L and 760R. Hence, even when these engine sounds are mixed together, no unusual feeling does not arise in hearing. Moreover, in the present embodiment, a correction is made to the frequency characteristic of the engine sound actually picked up from the vehicle, thereby synthesizing an engine sound to be output from the speakers 760L and 760R. Accordingly, a natural engine sound can be obtained.

<Sixth Embodiment>

Figure 30:
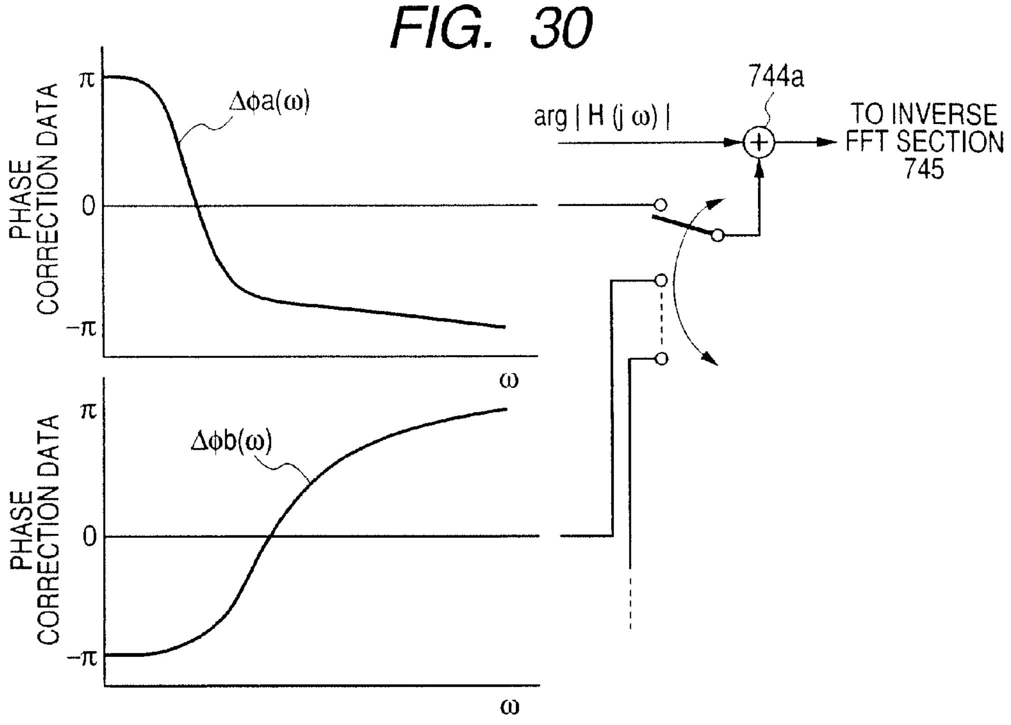
FIG. 30 is a view for describing processing for correcting the phase characteristic data performed in a sixth embodiment of the present invention.

A sixth embodiment of the present invention will now be described by reference to FIG. 30. The present embodiment corresponds to the fifth embodiment in which a modification is made to the configuration of the phase characteristic correction section 744. In the embodiment, phase correction data $\Delta\phi(\omega)$ which is a function of the angular frequency $\omega$ is stored in the parameter memory 748 (see FIG. 28) in association with respective types of correction modes. FIG. 30 illustrates phase correction data $\Delta\phi a(\omega)$ and phase correction data $\Delta\phi b(\omega)$, which are examples of the phase correction data. The phase characteristic correction section of the present embodiment selects, from the pieces of phase correction data $\Delta\phi(\omega)$, phase correction data associated with the correction mode selected by the driver. When the FFT section 742 has output the phase characteristic data $\arg\{H(j\omega)\}$, a correction is made such that the adder 744*a* adds the selected phase correction data $\Delta\phi(\omega)$ to the output phase characteristic data $\arg\{H(j\omega)\}$, and the corrected phase characteristic data are sent to the inverse FFT section 745 (see FIG. 28).

When $\Delta\phi a(\omega)$ is assumed to have been selected as phase correction data, the following operation is performed. First, the first-order rotation angular frequency and the second-order rotation angular frequency in the engine sound picked up from the vehicle are located, at low speed, in a range where the phase correction data $\Delta\phi a(\omega)$ descends with an increase in angular frequency. Therefore, the engine sound output from the speakers 760L and 760R becomes an unstable sound which provides an impression of levitation of the vehicle, as a result of the difference between the phase of the first-order rotation angular frequency component and the phase of the second-order rotation angular frequency component increasing with an increase in engine speed. When a middle or high speed is achieved, the first-order rotation angular frequency component and the second-order rotation angular frequency component of the engine sound picked up from the vehicle are located in a range where a slope of the phase correction data $\phi a(\omega)$ with respect to the angular frequency $\omega$ is small. Therefore, the engine sound output from the speakers 760L and 760R becomes a sound which provides a calm, quiet feeling.

Meanwhile, provided that $\Delta\phi b(\omega)$ has been selected as phase correction data, when a low speed is achieved, the first-order rotation angular frequency component and the second-order rotation angular frequency component of the engine sound picked up from the vehicle are located in a range where the slope of the phase correction data $\Delta\phi b(\omega)$ with respect to the angular frequency $\omega$ is small. Therefore, the engine sound output from the speakers 760L and 760R becomes a sound which provides a calm, quiet feeling. When a middle or high speed is achieved, the first-order rotation angular frequency component and the second-order rotation angular frequency component of the engine sound picked up from the vehicle are located in a range where the phase correction data $\Delta\phi b(\omega)$ increases with an increase in angular frequency. Therefore, the engine sound output from the speakers 760L and 760R becomes an unstable sound which provides an impression of levitation of the vehicle.

As mentioned above, according to the present embodiment, the driver can change the mode of a correction made to the phase of the engine sound by means of changing a correction mode to be selected, thereby enjoying an engine sound which provides a preferred impression. There is obviated a necessity for processing for selecting a frequency used for phase correction according to an engine speed or adjusting the extent of a correction according to the degree of depression of an accelerator, such as that required in the fifth embodiment. Therefore, there is yielded an advantage of the ability to simplify processing performed by the signal processing section 740.

<Seventh Embodiment>

A seventh embodiment of the present invention will now be described by reference to FIG. 31. The present embodiment relates to a method for generating phase correction data $\Delta\phi(\omega)$ to be stored in advance in the parameter memory 748 (see FIG. 28) in the sixth embodiment. In the present embodiment, various types of tastes pertaining to an engine sound; more specifically, various types of tastes pertaining to the dependence of the sense of distance of the engine on the engine speed, which is perceived by the driver from the engine sound, are presumed, and various types of target phase characteristic data $\phi t(\omega)$ which is a function of the angular frequency $\omega$ are prepared. On the occasion of implementation of the present embodiment, an engine sound is picked up from a vehicle equipped with an engine sound generator, and this actually-measured engine sound is subjected to FFT, to thus determine actually-measured phase characteristic data $\phi m(\omega)$. The actually-measured phase characteristic data $\phi m(\omega)$ are subtracted from various types of pieces of target phase characteristic data $\phi t(\omega)$, thereby determining phase correction data $\Delta\phi(\omega)$ associated with respective types of tastes. The phase correction data are stored in the parameter memory 748 in association with respective different modes. Specifics of processing for making a correction to the phase characteristic of the engine sound using the phase correction data $\Delta\phi(\omega)$ are the same as those described in connection with the sixth embodiment.

Figure 31:
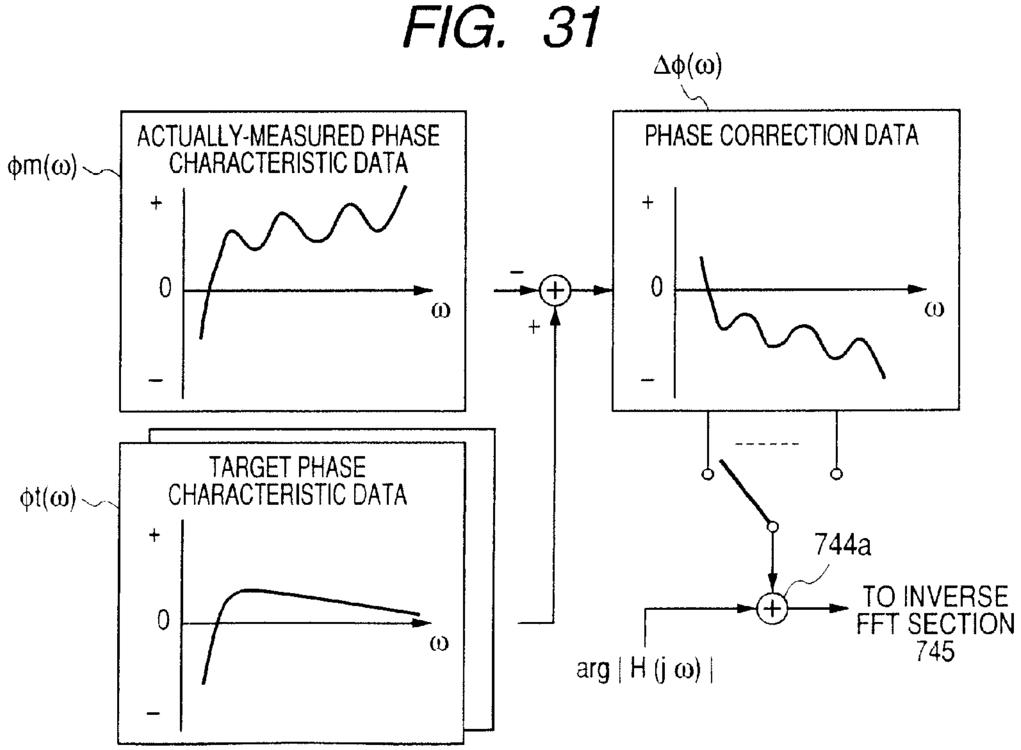
FIG. 31 is a view for describing a method for generating phase correction data used in a seventh embodiment of the present invention.

In the embodiment shown in FIG. 31, the phase of the actually-measured phase characteristic data $\phi m(\omega)$ rapidly changes from a delay phase to an advancing phase during the course of a change from a low speed to a high speed. Subsequently, the phase increases in a pulsating manner with an increase in speed (angular frequency). When the engine sound is output in unmodified form from the speakers while the phase characteristic of the engine sound is maintained, a so-called coloration phenomenon occurs in the sound reproduced by the speakers at a middle or high speed range, which deteriorates sound quality. In contrast, when a correction is made to the phase characteristic of the engine sound picked up from the vehicle by use of the phase correction data $\Delta\phi(\omega)$ obtained as mentioned above, corrected phase characteristic data coincide with the target phase characteristic data $\phi t(\omega)$ such as those illustrated. In this case, the phase of the sound reproduced by the speakers rotates with an increase in speed achieved in the low speed range. However, in the middle or high-speed range, rotation of the phase stops, and an engine sound which provides a calm, quiet impression is produced. When an engine sound of another impression is reproduced from the speakers, the essential requirement is to select a correction mode corresponding to the phase correction data prepared on the assumption of such an engine sound.

Although an embodiment of the present invention has been described thus far, embodiments of the present invention other than those mentioned above are also conceivable. Below are examples.

(1) In connection with the sixth embodiment and the seventh embodiment, the inclination of the slope of the phase correction data $\Delta\phi(\omega)$, which is achieved in a range where the dependence of the phase correction data $\Delta\phi(\omega)$ on an angular frequency is strong, may also be changed according to the amount of depression of the accelerator. In this case, there may also be adopted a configuration for enabling the driver to select whether to increase or decrease the inclination of the slope of phase correction data $\Delta\phi(\omega)$ when the amount of depression of the accelerator has increased.

(2) In the respective embodiments, the engine sound is picked up from the vehicle, and the thus-picked up sound is processed, to thus reproduce a sound from the speakers. However, an engine sound signal may also be generated by means of reading, from memory where waveform data pertaining to an engine speed are stored in advance, waveform data at a read speed responsive to the engine speed; reproducing a pseudo engine sound signal; and processing this pseudo engine sound signal in the signal processing section 740, instead of actually picking up an engine sound. According to this mode, a vehicle, which is not equipped with the engine and travels by means of a motor, can also yield an advantage analogous to the advantages yielded in the respective embodiments.

Figure 32:
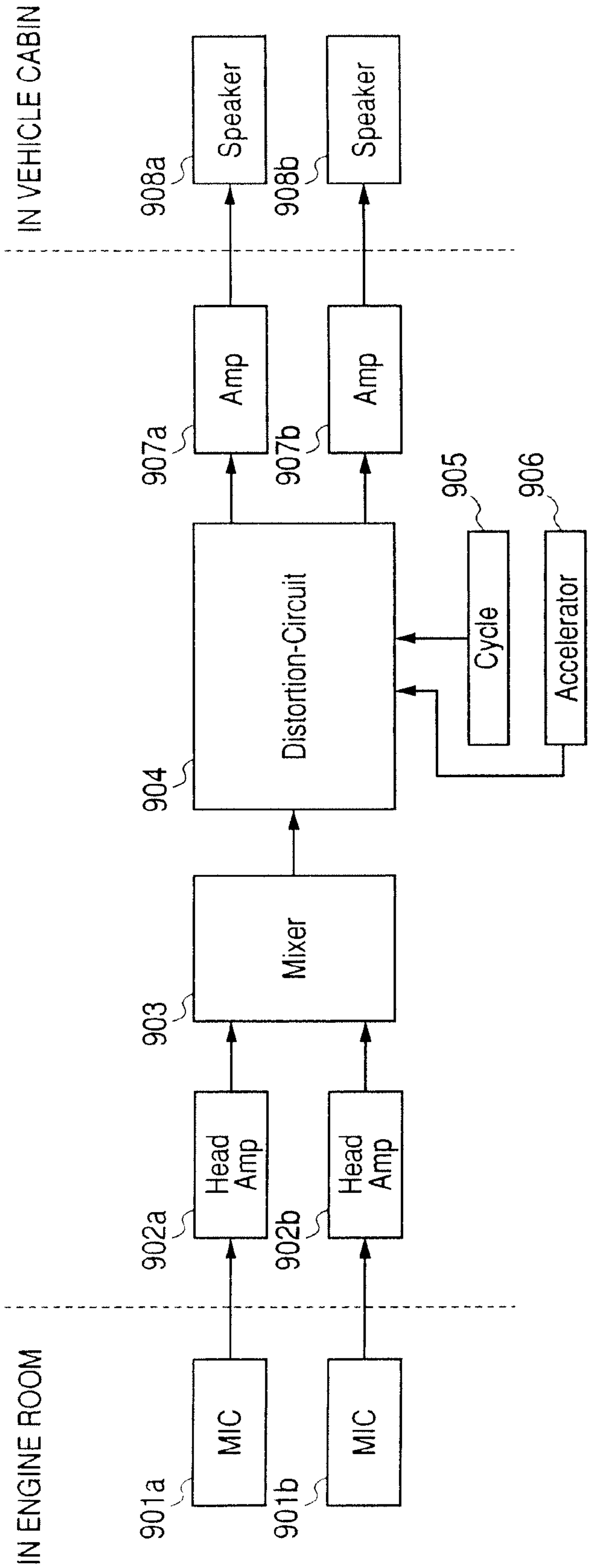
FIG. 32 is a block diagram showing the configuration of an eight embodiment of the present invention.

FIG. 32 is a block diagram showing the configuration of an engine sound processing system according to an eighth embodiment of the present invention.

In the drawing, reference numerals 901*a* and 901*b* designate microphones or sensors (the device are hereinafter assumed to be microphones) which are disposed in the engine room of the vehicle and which picks up an engine sound. In the present embodiment, the microphones 901*a* and 901*b* are disposed at location 902 in the engine room (e.g., a neighborhood of an air inlet and a neighborhood of the engine), and an engine sound is picked up at two locations. However, the present invention is not limited to such a configuration. The engine sound may also be picked up at one point or three or more points.

The engine sound picked up by the microphones 901*a* and 901*b* are amplified by corresponding head amplifiers 902*a* and 902*b*. The thus-amplified signals are input to a mixer 903. After having undergone noise removal, the amplified signals are added together in the mixer 903.

The signals of the engine sound added by the mixer 903 are input to a distortion section 904 serving as a signal processing section, where the signals are imparted with a distortion effect. At this time, the imparted distortion effect is controlled according to data (Cycle) 905 pertaining to the engine speed supplied through a vehicle-cabin network and data (Accelerator) 906 pertaining to the degree of depression of an accelerator supplied likewise through the vehicle-cabin network.

Details of the distortion effect will be described in detail later.

The engine sound imparted with distortion in the distortion section 904 is amplified by power amplifiers 907*a* and 907*b*, respectively, and the thus-amplified sound is reproduced by speakers 908*a* and 908*b* set in the vehicle cabin. In this embodiment, two speakers designated by reference numerals 908*a* and 908*b* are set in the vehicle cabin, but the number of speakers is arbitrary.

Figure 33A:
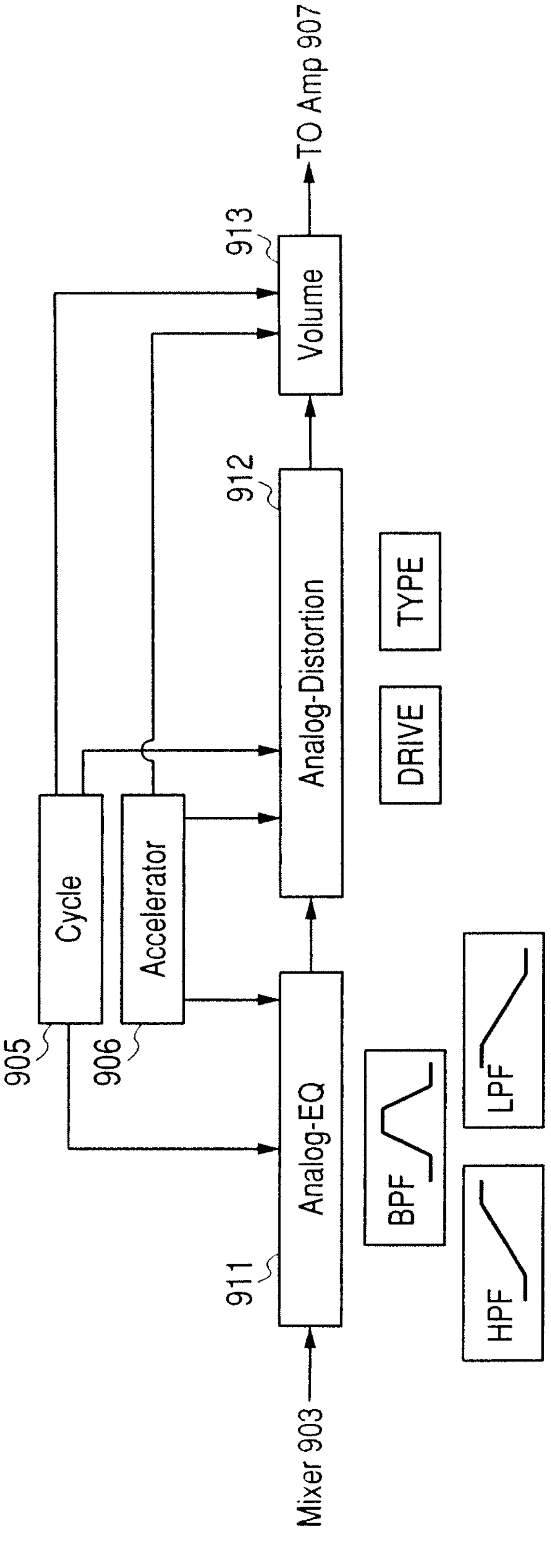
FIG. 33A is a view showing an example configuration of an analogue distortion section 4.
Figure 33B:
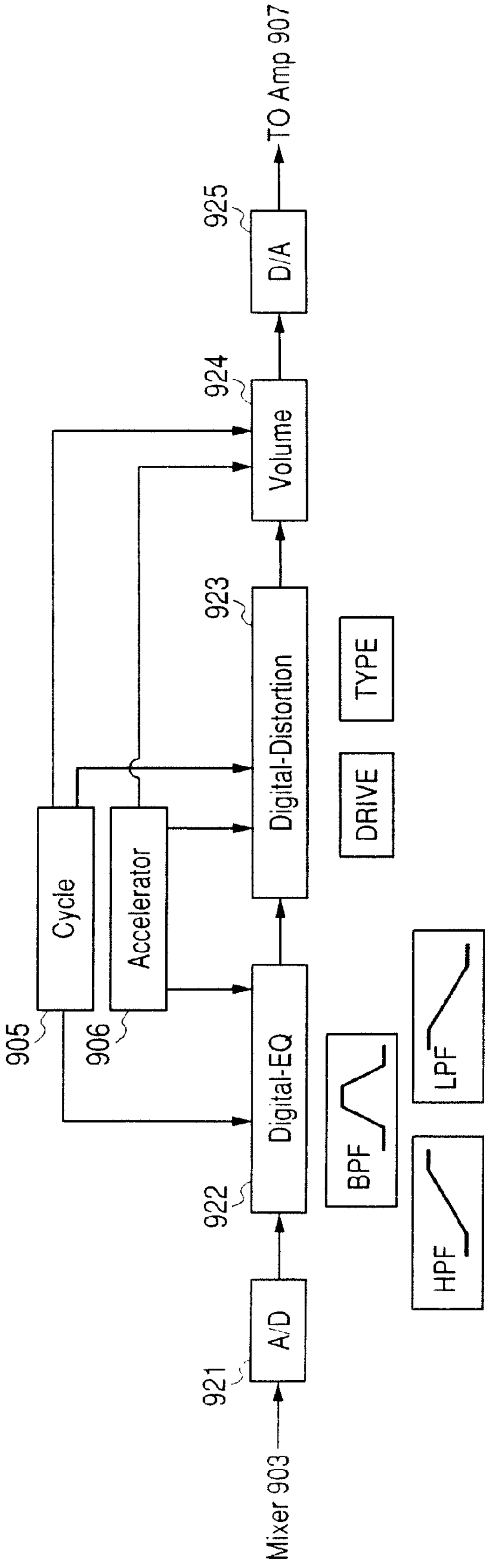
FIG. 33B is a view showing an example configuration of the digital distortion section 4.

The distortion section 904 can be embodied as either an analogue distortion section using an analogue circuit or a digital distortion section using a DSP (Digital Signal Processor) or a like element. FIGS. 33A and 33B are views showing an example configuration of the distortion section 904. FIG. 33A shows an example configuration of the analogue distortion section, and FIG. 33B shows an example configuration of the digital distortion section.

As shown in FIG. 33A, the analogue distortion section 904 has an equalizer 911 formed from an analogue circuit into which an engine sound signal from the mixer section 903 is input; a distortion circuit 912 formed from an analogue circuit which is provided with an output from the equalizer 911; and an amplifier 913 which is provided with an output from the distortion circuit 912 and whose gain can be controlled. The data (Cycle) 905 pertaining to an engine speed and the data (Accelerator) 906 pertaining to the degree of depression of an accelerator are supplied to these circuits as control parameters.

Moreover, as shown in FIG. 33B, the digital distortion section 904 has an A/D converter 921 for converting the engine sound signal from the mixer section 903 into digital data; equalizer means 922 for use with digital data which is provided with an output from the A/D converter 921; distortion means 923 for use with digital data which is provided with an output from the digital equalizer means 922; amplification means 924 for use with digital data which is provided with an output from the digital distortion means 923; and a D/A converter 925 for converting data output from the amplification means 924 into an analogue signal. The equalizer means 922, the distortion means 923, and the amplification means 924 are supplied with the data (Cycle) 905 pertaining to an engine speed and the data (Accelerator) 906 pertaining to the degree of depression of an accelerator, and characteristics of the means are controlled in accordance with these pieces of data. The equalizer means 922, the distortion means 923, and the amplification means 924 are embodied by means of: for example, a DSP.

The equalizer 911 and the equalizer means 912 subject the engine sound signal output from the mixer 903 to filter processing such as BPF (Band-Pass Filter), HPF (High-Pass Filter), or LPF (Low-Pass Filter), thereby selecting a frequency domain which is an object imparted with distortion. At this time, the characteristic of the filter is dynamically changed in accordance with the data (Cycle) 905 pertaining to an engine speed and the data (Accelerator) 906 pertaining to the degree of depression of an accelerator. The equalizer 911 and the equalizer means 922 may also be of any type either a parametric equalizer or a graphic equalizer.

Figure 34:
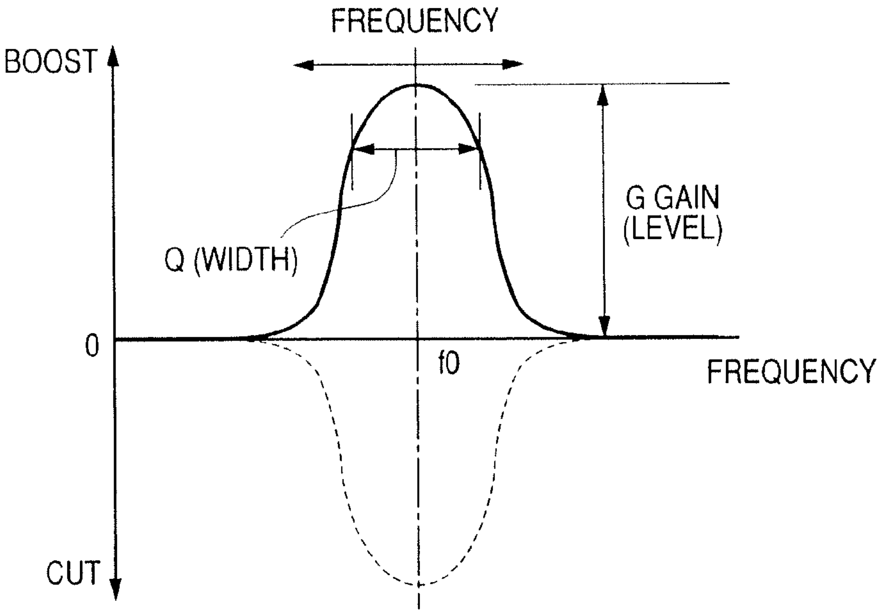
FIG. 34 is a view for describing specifics to be controlled by an equalizer.

FIG. 34 is a view showing the case of a parametric equalizer. A center frequency (f0) of a pass band and a bandwidth (width Q) and a gain (G) of that frequency domain are dynamically changed in accordance with the engine speed 905 and the degree of depression of an accelerator 906. For instance, the greater the engine speed, the higher the frequency of the engine sound. The frequency characteristic of the equalizer is dynamically changed correspondingly, thereby enabling tracking of a change in the frequency of the engine sound. As a result, the engine sound can be imparted with a natural effect without involvement of an unusual feeling between a processed sound and the engine sound in terms of audibility.

Figure 35A:
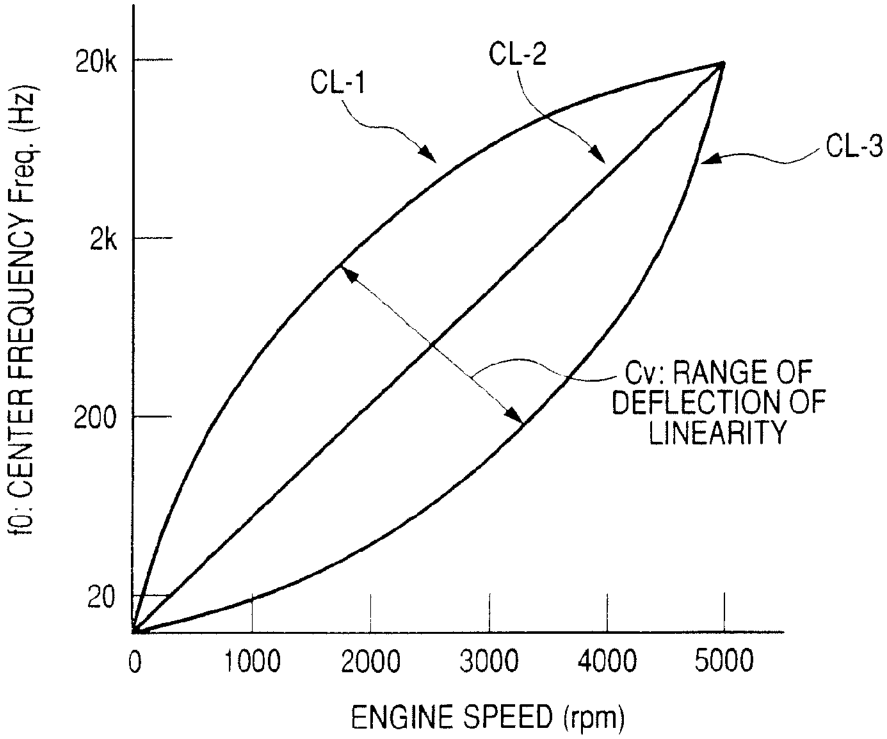
FIG. 35A is a view for describing control of the equalizer in response to an engine speed and the degree of depression of an accelerator, showing a correspondence between the engine speed and a center frequency.
Figure 35B:
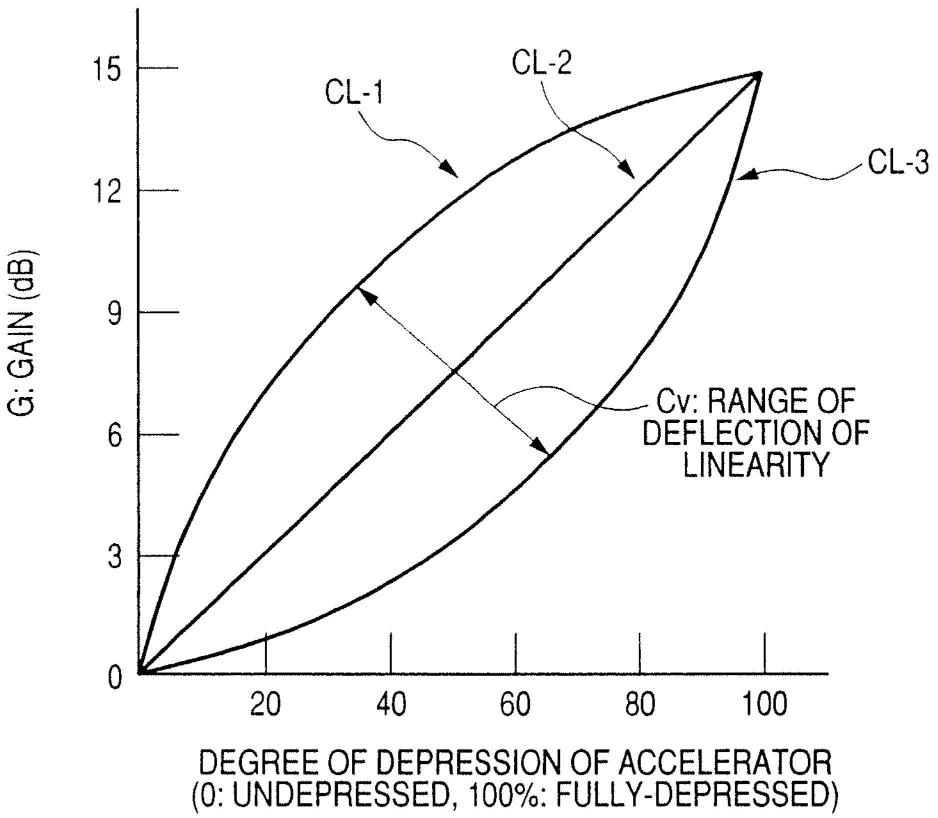
FIG. 35B is a view for describing control of the equalizer in response to an engine speed and the degree of depression of an accelerator, showing a correspondence between the degree of depression of an accelerator and a gain.

FIGS. 35A and 35B are views for describing a mode in which the center frequency (f0), the gain (G), and the bandwidth (Q) are dynamically changed according to the data (Cycle) 905 pertaining to an engine speed and the data (Accelerator) 906 pertaining to the degree of depression of an accelerator. FIG. 35A is a view showing a correspondence between the engine speed and the center frequency, and FIG. 35B is a view showing a correspondence between the degree of depression of an accelerator and a gain.

Basically, as shown in FIG. 35A, the center frequency (f0) is also controlled so as to increase with an increase in engine speed. The fundamental frequency of the engine sound may also be taken as the center frequency f0, or a harmonic overtone may also be selected as the center frequency f0. Alternatively, it may also be possible to enable the user to take the fundamental frequency as the center frequency or to select a second overtone or a third overtone as the center frequency.

When the engine speed increases within a short period of time, control is performed in such a way that the center frequency f0 also increases abruptly as indicated by a curve designated by CL-1 in the drawing. When the engine speed increases at a middle speed, the center frequency is caused to increase linearly as is a curve designated by CL-2. When the engine speed increases slowly, the center frequency may also be controlled so as to gradually increase as is a curve designated by CL-3. Thus, in accordance with the speed of a change in engine speed, any one is selected from the curves CL-1 to CL-3 showing different changes within the range of deflection of linearity Cv, and the center frequency is dynamically controlled, so that a processed sound well responsive to the user's driving action can be produced.

Further, as shown in FIG. 35B, control is also made in such a way that the gain (G) increases as the degree of depression of an accelerator increases. As is the case with the above descriptions, when the accelerator is depressed abruptly, the gain is also increased as indicated by CL-1 in the drawing. When the accelerator is depressed with middle force, the gain is increased linearly (as indicated by CL-2). When the accelerator is depressed slowly, the gain may also be increased gradually (as indicated by CL-3).

Furthermore, the center frequency may also be changed according to the degree of depression of an accelerator as in the case of control operation shown in FIG. 35A, or the gain G may also be changed according to the rotational frequency of the engine as in the case of control operation shown in FIG. 35B. Moreover, the bandwidth Q may also be changed according to the engine speed or the degree of depression of an accelerator as in the case of control operation shown in FIG. 35A or 35B. In short, the bandwidth is controlled so as to become wider with an increase in engine speed or the degree of depression of an accelerator.

The distortion circuit 912 and the distortion means 923 impart a distortion (Distortion) effect to the engine sound signal output from the equalizer 911 or the equalizer means 922. At this time, a parameter (DRIVE) showing the degree of distortion and a parameter (TYPE) showing the manner of distortion are dynamically changed in accordance with the data (Cycle) 905 pertaining to an engine speed and the data (Accelerator) 906 pertaining to the degree of depression of an accelerator.

Figure 36A:
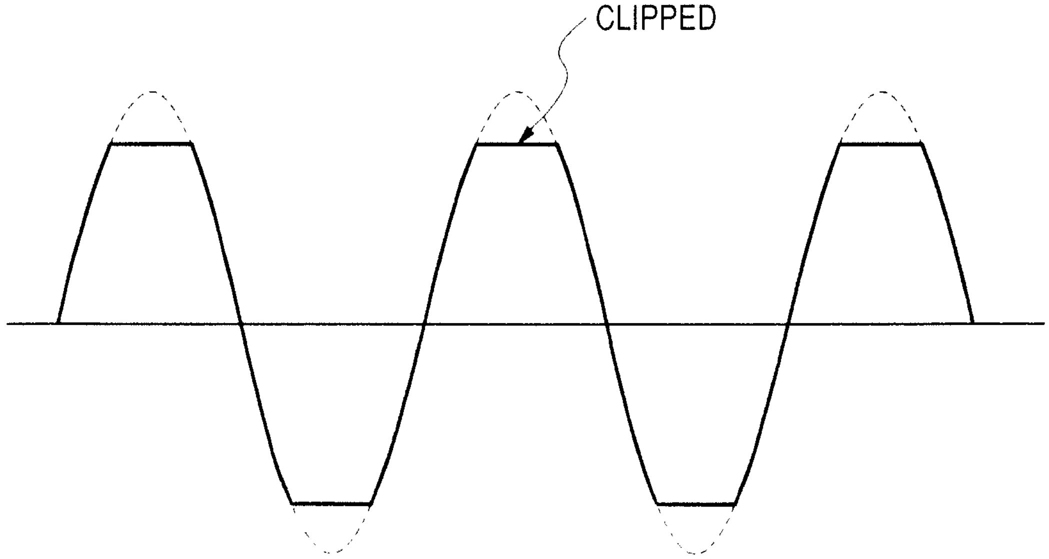
FIG. 36A is a view for describing distortion processing.
Figure 36B:
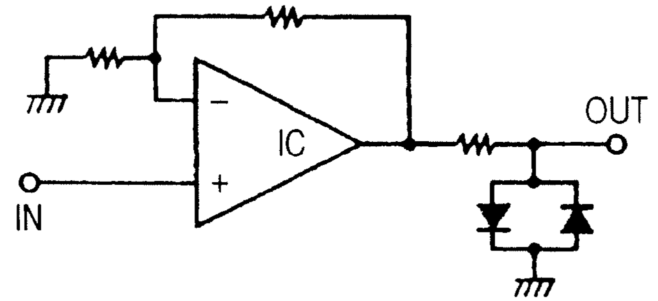
FIG. 36B is a view showing an example configuration of a distortion circuit embodied as an analogue circuit.
Figure 36C:
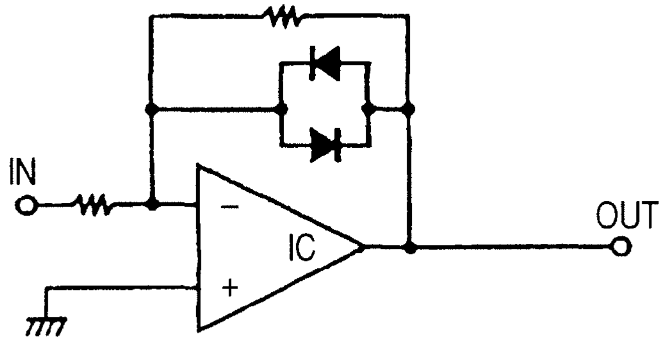
FIG. 36C is a view showing another example configuration of the distortion circuit embodied as an analogue circuit.
Figure 36D:
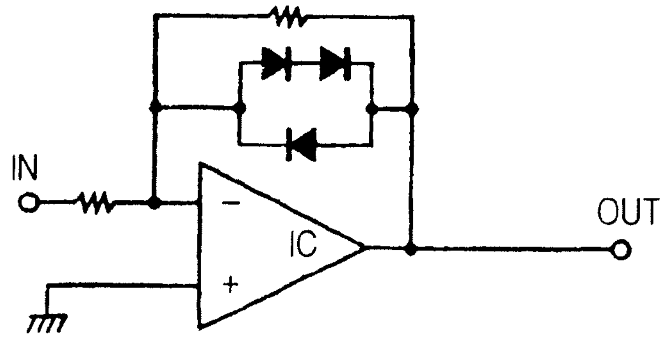
FIG. 36D is a view showing still another example configuration of the distortion circuit embodied as an analogue circuit.

FIGS. 36A and 36B are views for describing distortion processing performed by the distortion circuit 912 or the distortion means 923. As shown in FIG. 36A, the distortion circuit 912 or the distortion means 923 basically distorts an input engine sound signal by means of clipping the amplitude of the input signal.

When the input signal exceeds a specified input level, tops of a waveform of the output signal (i.e., portions of the waveform exceeding an allowable input level) are cut off. This phenomenon is called clipping or a clip. Since this waveform includes a myriad of harmonic waves, a sound becomes subdued, and a tone becomes unclear.

FIGS. 36A and 36B are views showing an example configuration of the distortion circuit 12 embodied by an analogue circuit. As illustrated, the distortion circuit can be realized by means of an analogue clipping circuit. In the case of the configuration shown in FIG. 36A, asymmetric clipping is performed.

For instance, distortion may also be imparted by means of a method other than clipping, such as utilization of an asymmetric characteristic.

Figure 37:
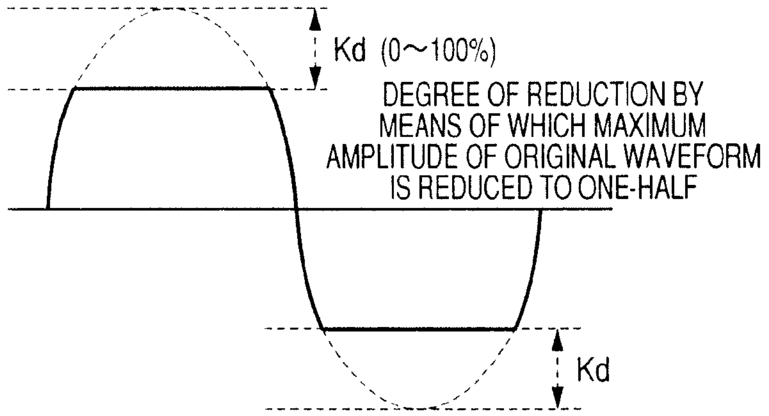
FIG. 37 is a view for describing a DRIVE parameter (kd) showing the degree of distortion.

FIG. 37 is a view for describing a DRIVE parameter showing the degree of distortion.

A parameter Kd showing the degree of distortion shown in FIG. 37 is taken as a DRIVE parameter. As shown in FIG. 37, the parameter Kd showing the degree of distortion is a parameter showing the degree of reduction by means of which the maximum amplitude of the original waveform is reduced to one-half. The parameter assumes a value ranging from 0% to 100%. When Kd=0% is achieved, clipping is not performed. When Kd=100% is achieved, the amplitude of the original waveform is clipped to one-half.

The value of Kd is dynamically changed in accordance with the data (Cycle) 905 pertaining to an engine speed and the data (Accelerator) 906 pertaining to the degree of depression of an accelerator.

Figure 38A:
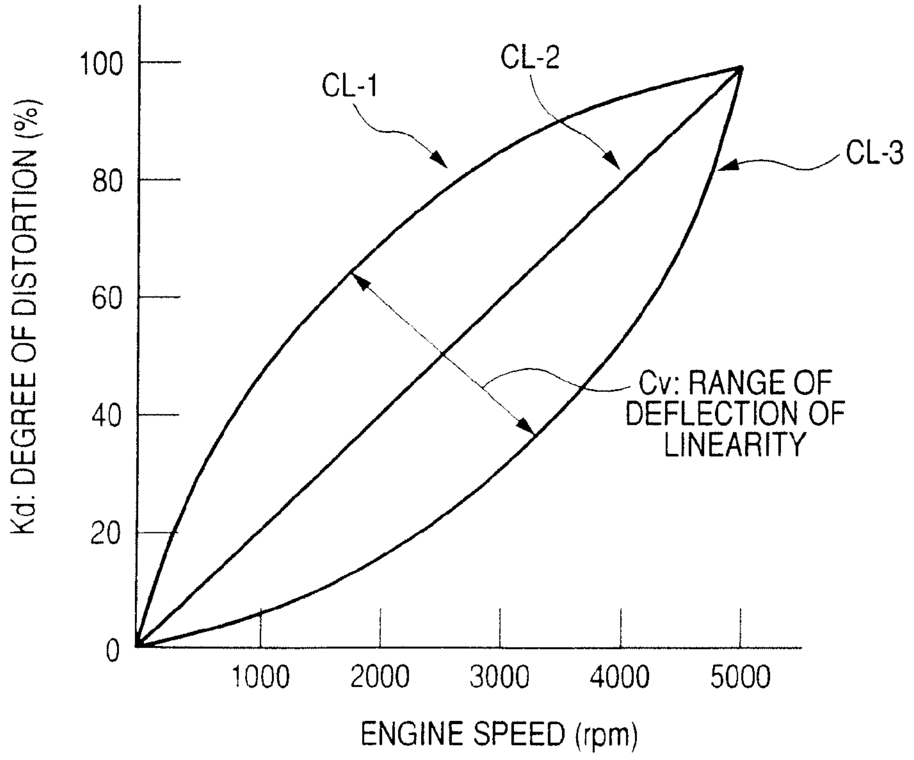
FIG. 38A is a first view for describing a change in the parameter Kd responsive to the engine speed and the degree of depression of an accelerator.
Figure 38B:
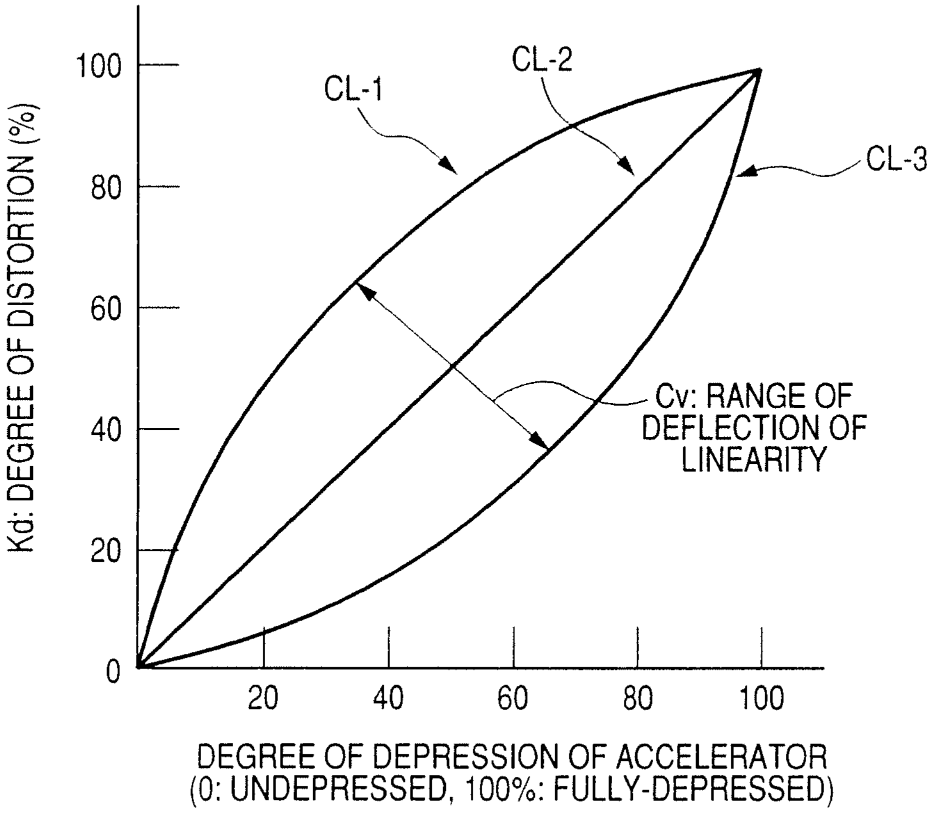
FIG. 38B is a second view for describing a change in the parameter Kd responsive to the engine speed and the degree of depression of an accelerator.
Figure 38C:
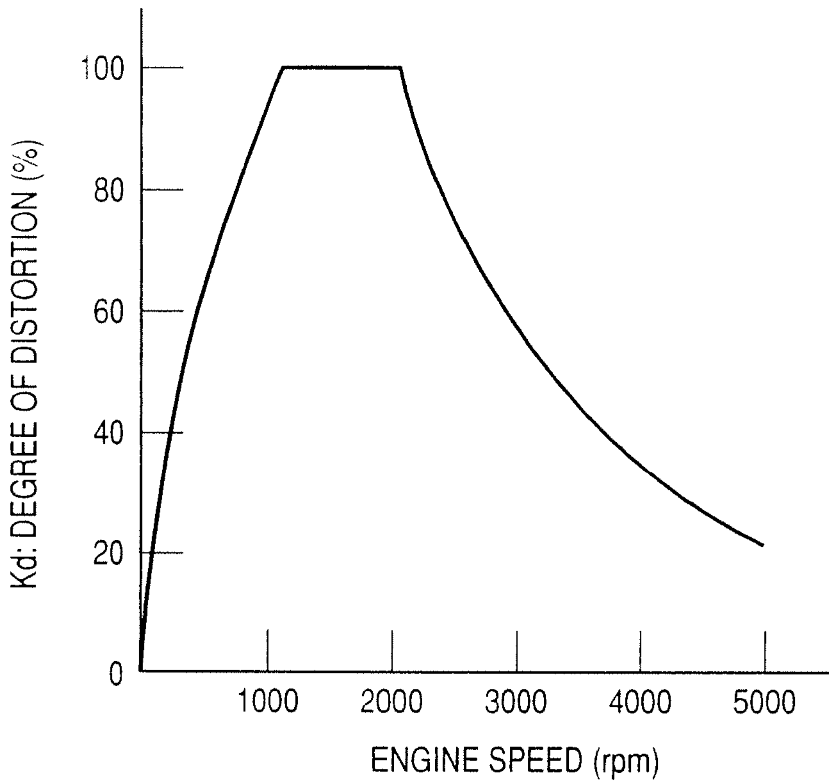
FIG. 38C is a third view for describing a change in the parameter Kd responsive to the engine speed and the degree of depression of an accelerator.

FIGS. 38A to 38C are views for describing a method for changing the parameter Kd in accordance with the engine speed and the degree of depression of an accelerator.

FIG. 38A is a view showing the manner in which the parameter Kd (the degree of distortion) is changed in response to an engine speed. As illustrated, the parameter Kd is also controlled so as to increase with an increase in engine speed. At this time, the degree of distortion Kd may also be changed in conformance with a curve of different linearity according to the acceleration of engine speed; namely, whether the engine speed is increased within a short period of time or slowly. Specifically, when the engine speed is increased abruptly, the degree of distortion Kd is also increased abruptly as is the curve designated by CL-1. When the engine speed is increased slowly, the degree of distortion Kd is increased gradually as is the curve designated by CL-3. When the engine speed is increased with a middle force, the essential requirement is to linearly change the degree of distortion as is the curve designated by CL-2.

FIG. 38B is a view showing the manner in which the degree of distortion Kd is changed in response to the degree of depression of an accelerator. As illustrated, the degree of distortion Kd is also controlled so as to increase with an increase in degree of depression of an accelerator. At this time, as in the previously-described case, when the accelerator is depressed abruptly, the degree of distortion is increased abruptly as is the curve designated by CL-1. When the accelerator is depressed slowly, the degree of distortion is increased gradually as is the curve designated by CL-3. When the accelerator is depressed with middle force, the essential requirement is to linearly change the degree of distortion as is the curve designated by CL-2.

FIG. 38C is a view showing another example mode in which the degree of distortion Kd is changed according to an engine speed.

In the illustrated example, Kd is controlled in conformance with a curve exhibiting points of inflection which are noticeable at a low engine speed. In this case, the degree of distortion Kd increases greatly at a low engine seed and becomes smaller at a high engine speed. Accordingly, the degree of distortion is small at the time of high-speed driving as in; e.g., a high way, and a tranquil engine sound is produced.

Even in relation to the degree of depression of an accelerator, the parameter Kd may also be changed in conformance with the curve analogous to that shown in FIG. 38C.

Figure 39:
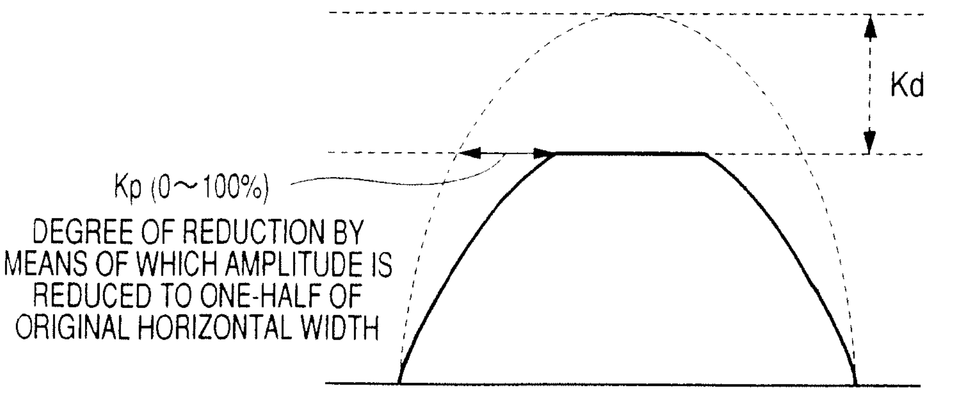
FIG. 39 is a view for describing a TYPE parameter (kp) showing a distortion pattern of distortion.

FIG. 39 is a view for describing the TYPE parameter showing the manner of distortion.

The parameter Kp showing a distortion pattern shown in FIG. 39 is taken as a TYPE parameter. As shown in FIG. 39, the parameter Kp showing this distortion pattern is a parameter showing the extent to which a distorted signal becomes rectangular; namely, the extent to which a horizontal width of the distorted waveform achieved at a clipping level is reduced to one-half the horizontal width of the original waveform. The parameter Kp assumes a value ranging from 0% to 100%. At Kp=0%, the horizontal width of the distorted signal is identical with the horizontal width of the original waveform. At Kp=100%, the horizontal width of the distorted signal is one-half the horizontal width of the original waveform.

Even the distortion parameter Kp (TYPE parameter) also exhibits the same manner of change as does the parameter Kd. Specifically, as shown in FIGS. 38A and 38B, the parameter Kp is controlled so as to increase as the engine speed (Cycle) or the degree of depression of an accelerator (Accelerator) increases. The parameter may also be changed in conformance with any of the above-described variation curves (CL-1 to CL-3) of different degrees of linearity according to when the engine speed or the degree of depression of an accelerator has changed abruptly, when the engine speed or the degree of depression of an accelerator has changed with a middle speed, or when the engine speed or the degree of depression of an accelerator has changed slowly.

Further, the parameter may also be changed in conformance with a curve exhibiting points of inflection which are noticeable when the engine speed is low or when the degree of depression of an accelerator is small, such as that shown in FIG. 38C.

A gain of the amplifier 913 or the amplification means 924 whose gain is controllable is controlled in accordance with the data (Cycle) 905 pertaining to an engine speed and the data (Accelerator) 906 pertaining to the degree of depression of an accelerator. Thereby, the volume V (Volume) of the processed engine sound to be reproduced is controlled.

Figure 40A:
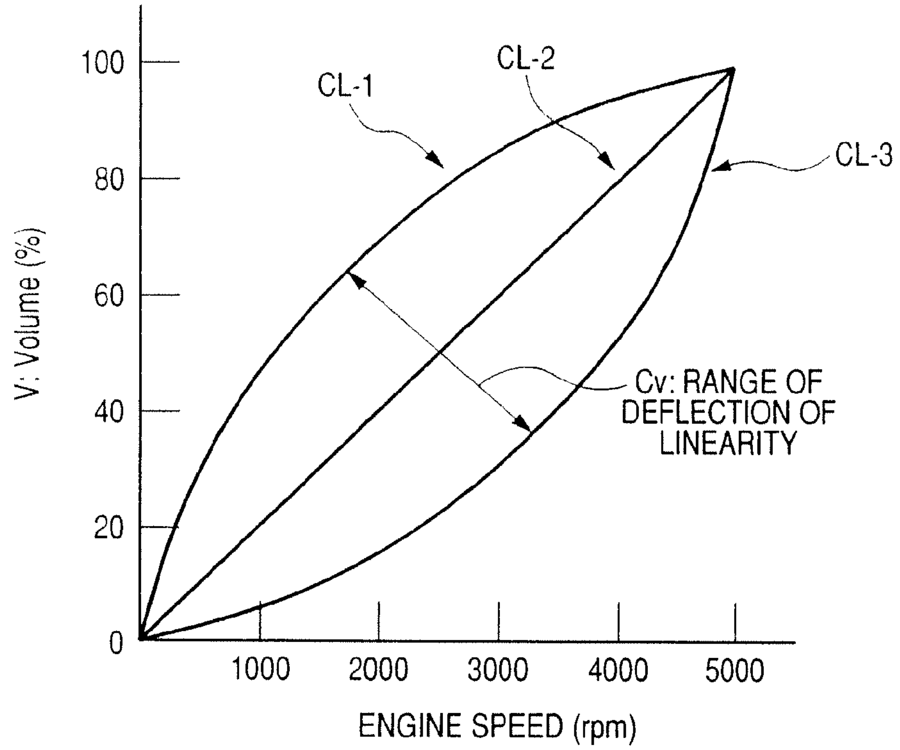
FIG. 40A is a view showing a correspondence between an engine speed and a sound volume V (Volume)
Figure 40B:
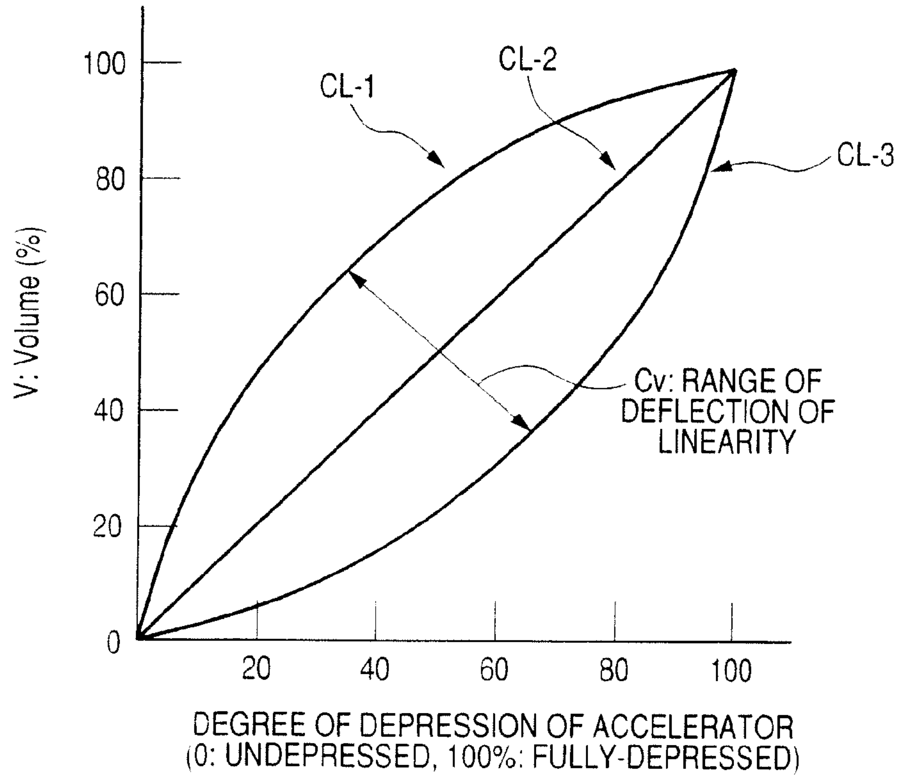
FIG. 40B is a view showing a correspondence between the degree of depression of an accelerator and the sound volume V (Volume)
Figure 40C:
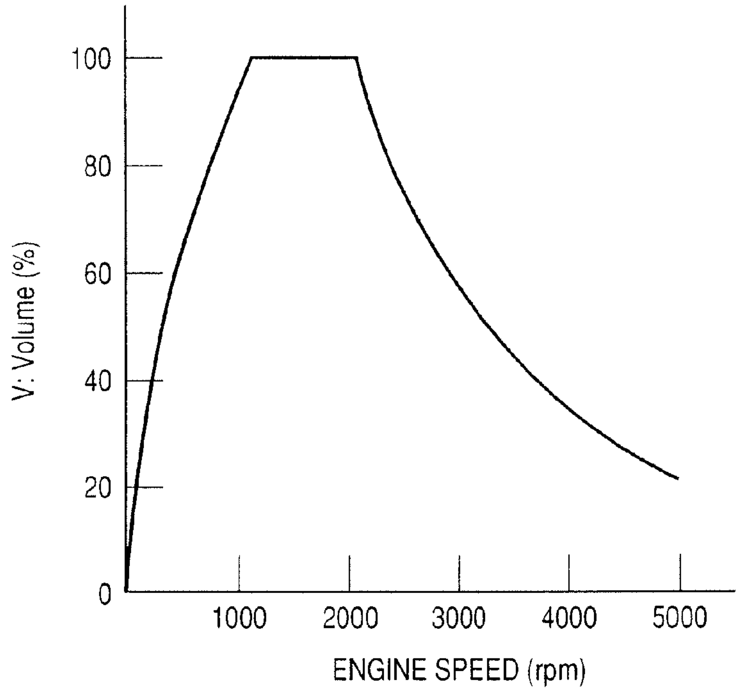
FIG. 40C is a view showing a correspondence between the engine speed and the sound volume V (Volume)

FIGS. 40A to 40C are views showing a relationship between the engine speed or the degree of depression of an accelerator and the sound volume (Volume) of the amplifier 913 or the amplification means 924. FIG. 40A shows a relationship between an engine speed and the sound volume V, and FIG. 40B shows a relationship between the degree of depression of an accelerator and the sound volume V.

As shown in FIG. 40A, the engine speed is increased, the volume of the processed engine sound is also controlled so as to increase. The mode of an increase in sound volume is controlled so as to change according to the rate of an increase in engine speed. When the engine speed has increased abruptly, the sound volume is also increased abruptly (CL-1). When the engine speed is increased slowly, the sound volume may also be controlled so as to increase gradually (CL-3).

As shown in FIG. 40B, the relationship between the degree of depression of an accelerator and the sound volume V may also be controlled in the same manner as is the relationship between the engine speed and the sound volume.

Moreover, as shown in FIG. 40C, the relationship may also be a characteristic curve exhibiting points of inflection which are noticeable when the engine speed is low. In relation to the degree of depression of an accelerator, the relationship may also be a curve such as that shown in FIG. 40C.

Variation characteristics of the respective parameters in response to the engine speed and the degree of depression of an accelerator, such as those shown in FIGS. 35A, 35B, 38A, 38B, 38C, 40A, 40B, and 40C, are desirably set in accordance with a characteristic of an engine equipped with the engine sound processing system of the present invention.

In FIGS. 35A, 35B, 38A, 38B, 38C, 40A, 40B, and 40C, there has been described a case where the variation characteristics of the respective parameters responsive to the engine speed and the degree of depression of an accelerator are controlled in accordance with three curves. However, the number of curves is not limited to three. Control can be performed by use of an arbitrary number of curves.

Further, the user may also be made able to arbitrarily make settings as to which one of control operations conforming to the curves CL-1 to CL-3 is performed in accordance with the rate of a change in engine speed and the rate of change in the degree of depression of an accelerator.

The user may also be made able to edit the curves CL-1 to CL-3 and arbitrarily set the number of curves employed.

In the embodiment shown in FIG. 32, the engine sound picked up by the microphones 901*a* and 901*b* set in the engine room is input to the distortion section 904. A sound-insulating board is usually interposed between the engine room of the automobile and the vehicle cabin, and the user hears the engine sound having passed through the sound-insulating board. Accordingly, it may also be the case where a filter simulating a sound insulation characteristic (transmission characteristic) of the sound-insulating board is provided and the engine sound picked up by the microphones 901*a* and 901*b* are processed by means of inputting to the distortion section 904 the sound having passed through the filter.

Figure 41:
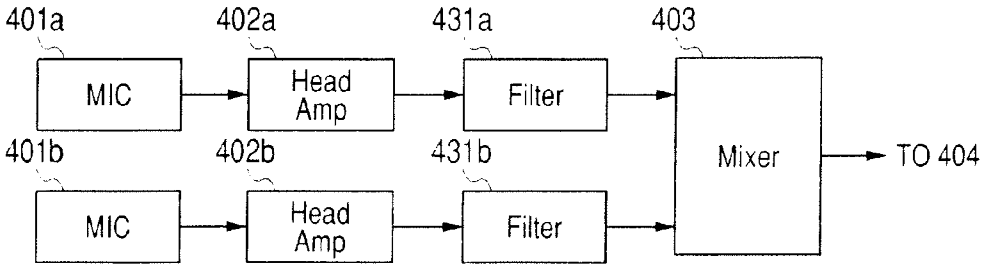
FIG. 41 is a view showing the principal configuration of the embodiment in which a filter for simulating a transmission characteristic of an acoustic insulation plate is provided.

FIG. 41 is a view showing the configuration of the principal section of the embodiment where a filter simulating a transmission characteristic of the sound-insulating board is provided.

As illustrated, in the present embodiment, the engine sound picked up by the microphones 901*a* and 901*b* disposed in the engine room is amplified by the head amplifiers 902*a* and 902*b* and caused to pass through filters 931*a* and 931*b* simulating the transmission characteristic of the sound-shielding board and to input to the mixer 903.

Thus, mechanical noise or other noise included in the engine sound picked up by the microphones 901*a* and 901*b* can be eliminated. The engine sound which the user is usually accustomed to hear is taken as a raw material and subjected to the previously-described processing. As a result, the engine sound which is more natural to the human can be produced.

The above descriptions have mentioned the exemplification where all the equalizer 911 or the equalizer means 922, the distortion circuit 912 or the distortion means 923, and the amplifier 913 or the amplification means 924 are provided in the distortion section 4. The equalizer 911 or the equalizer means 922 and the amplifier 913 or the amplification means 924 are not always indispensable, and the minimum requirement is provision of the distortion circuit 912 or the distortion means 923.

The invention claimed is:

1. An engine sound processing system comprising:

a microphone which is disposed outside a vehicle cabin of an automobile and which picks up an engine sound of the automobile;

a sensor for detecting a driving condition of the automobile;

a signal processing section which processes the engine sound picked up by the microphone in accordance with the detected result by the sensor and outputs the engine sound;

a speaker for outputting the engine sound subjected to signal processing performed by the signal processing section;

a control section which determines a signal processing characteristic according to a detected result by the sensor and which controls the signal processing section; and a frequency analysis section which analyzes a frequency of the engine sound picked up by the microphone to determine a spectrum, wherein the signal processing section processes the spectrum determined by the frequency analysis section and sends an output to the speaker and wherein the control section enhances a peak of the spectrum determined by the frequency analysis section.

2. An engine sound processing system comprising:

a microphone which is disposed outside a vehicle cabin of an automobile and which picks up an engine sound of the automobile;

a sensor for detecting a driving condition of the automobile;

a signal processing section which processes the engine sound picked up by the microphone in accordance with the detected result by the sensor and outputs the engine sound;

a speaker for outputting the engine sound subjected to signal processing performed by the signal processing section;

a control section which determines a signal processing characteristic according to a detected result by the sensor and which controls the signal processing section; and a frequency analysis section which analyzes a frequency of the engine sound picked up by the microphone to determine a spectrum, wherein the signal processing section processes the spectrum determined by the frequency analysis section and sends an output to the speaker and wherein the control section increases a level of a valley between peaks of the spectrum determined by the frequency analysis section.

3. An engine sound processing system comprising:

a microphone which is disposed outside a vehicle cabin of an automobile and which picks up an engine sound of the automobile;

a sensor for detecting a driving condition of the automobile;

a signal processing section which processes the engine sound picked up by the microphone in accordance with the detected result by the sensor and outputs the engine sound;

a speaker for outputting the engine sound subjected to signal processing performed by the signal processing section;

a control section which determines a signal processing characteristic according to a detected result by the sensor and which controls the signal processing section; and a frequency analysis section which analyzes a frequency of the engine sound picked up by the microphone to determine a spectrum and detects a peak of the spectrum, wherein the signal processing section pitch-shifts the peak of the spectrum determined by the frequency analysis section, to enhance and output a specific frequency component; and wherein the control section sets a frequency to be pitch-shifted by the signal processing section.

* * * * *